(12) United States Patent
Wang et al.

(10) Patent No.: US 12,063,787 B2
(45) Date of Patent: Aug. 13, 2024

(54) THREE-DIMENSIONAL MEMORY DEVICE AND MANUFACTURING METHOD THEREOF

(71) Applicant: Taiwan Semiconductor Manufacturing Company, Ltd., Hsinchu (TW)

(72) Inventors: Sheng-Chen Wang, Hsinchu (TW); Meng-Han Lin, Hsinchu (TW); Sai-Hooi Yeong, Hsinchu County (TW); Yu-Ming Lin, Hsinchu (TW); Han-Jong Chia, Hsinchu (TW)

(73) Assignee: Taiwan Semiconductor Manufacturing Company, Ltd, Hsinchu (TW)

( * ) Notice: Subject to any disclaimer, the term of this patent is extended or adjusted under 35 U.S.C. 154(b) by 19 days.

(21) Appl. No.: 18/155,688

(22) Filed: Jan. 17, 2023

(65) Prior Publication Data

US 2023/0157028 A1 May 18, 2023

Related U.S. Application Data

(62) Division of application No. 17/155,085, filed on Jan. 22, 2021, now Pat. No. 11,581,337.

(Continued)

(51) Int. Cl.
*H10B 51/20* (2023.01)
*H01L 29/417* (2006.01)
(Continued)

(52) U.S. Cl.
CPC ....... *H10B 51/20* (2023.02); *H01L 29/41741* (2013.01); *H01L 29/41775* (2013.01);
(Continued)

(58) Field of Classification Search
CPC ........ H10B 51/00; H10B 51/10; H10B 51/20; H10B 51/30; H01L 29/41741; H01L 29/41775
See application file for complete search history.

(56) References Cited

U.S. PATENT DOCUMENTS

| 9,698,156 B2 * | 7/2017 | Lue ......................... H10B 43/10 |
| 2007/0170499 A1 * | 7/2007 | Araki .................. H01L 29/4236 |
| | | 257/E21.429 |

(Continued)

FOREIGN PATENT DOCUMENTS

WO   WO-2019152226 A1 * 8/2019 ......... G11C 16/0483

*Primary Examiner* — Matthew E Warren
(74) *Attorney, Agent, or Firm* — JCIPRNET

(57) ABSTRACT

A memory device includes a first stacking structure, a second stacking structure, a plurality of first isolation structures, gate dielectric layers, channel layers and channel layers. The first stacking structure includes a plurality of first gate layers, and a second stacking structure includes a plurality of second gate layers, where the first stacking structure and the second stacking structure are located on a substrate and separated from each other through a trench. The first isolation structures are located in the trench, where a plurality of cell regions are respectively confined between two adjacent first isolation structures of the first isolation structures in the trench, where the first isolation structures each includes a first main layer and a first liner surrounding the first main layer, where the first liner separates the first main layer from the first stacking structure and the second stacking structure. The gate dielectric layers are respectively located in one of the cell regions, and cover opposing sidewalls of the first stacking structure and the second stacking structure as well as opposing sidewalls of the first isolation structures. The channel layers respectively cover an inner surface of one of the gate dielectric layers. The conductive pillars stand on the substrate within the cell (Continued)

regions, and are laterally surrounded by the channel layers, where at least two of the conductive pillars are located in each of the cell regions, and the at least two conductive pillars in each of the cell regions are laterally separated from one another.

20 Claims, 42 Drawing Sheets

Related U.S. Application Data

(60) Provisional application No. 63/045,198, filed on Jun. 29, 2020.

(51) Int. Cl.
*H10B 51/00* (2023.01)
*H10B 51/10* (2023.01)
*H10B 51/30* (2023.01)

(52) U.S. Cl.
CPC ............. *H10B 51/00* (2023.02); *H10B 51/10* (2023.02); *H10B 51/30* (2023.02)

(56) References Cited

U.S. PATENT DOCUMENTS

| | | | | |
|---|---|---|---|---|
| 2019/0148393 A1* | 5/2019 | Lue | ................... | G11C 16/0416 |
| | | | | 365/185.05 |
| 2020/0098773 A1* | 3/2020 | Kaneko | ................ | H10B 41/35 |
| 2021/0375935 A1* | 12/2021 | Ling | ...................... | H10B 51/10 |
| 2021/0375938 A1* | 12/2021 | Lin | ........................ | H10B 51/30 |

* cited by examiner

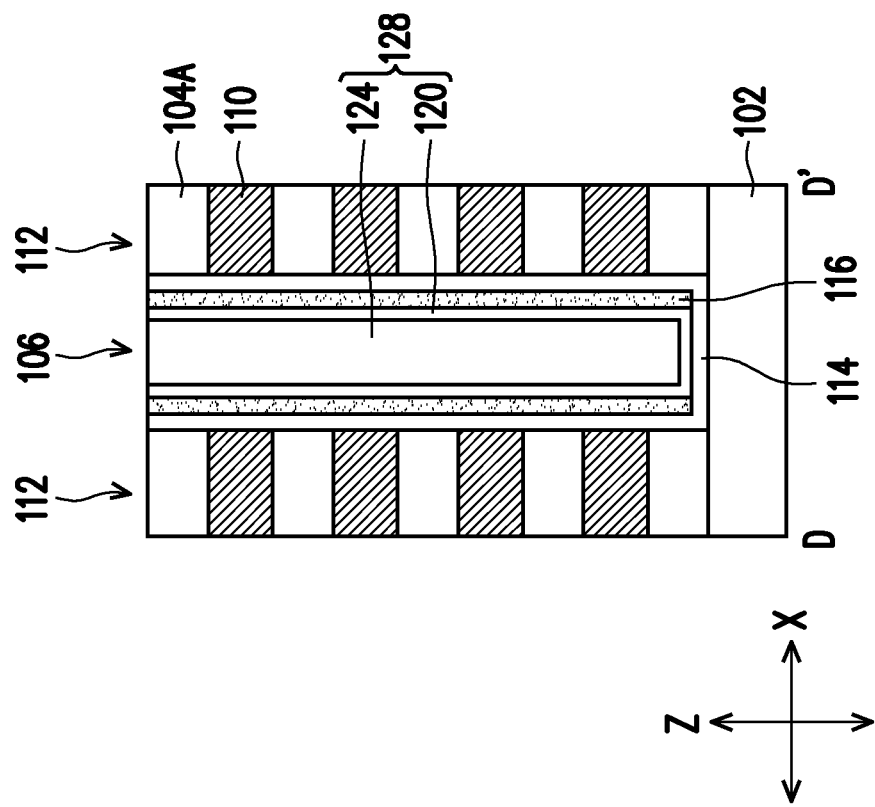
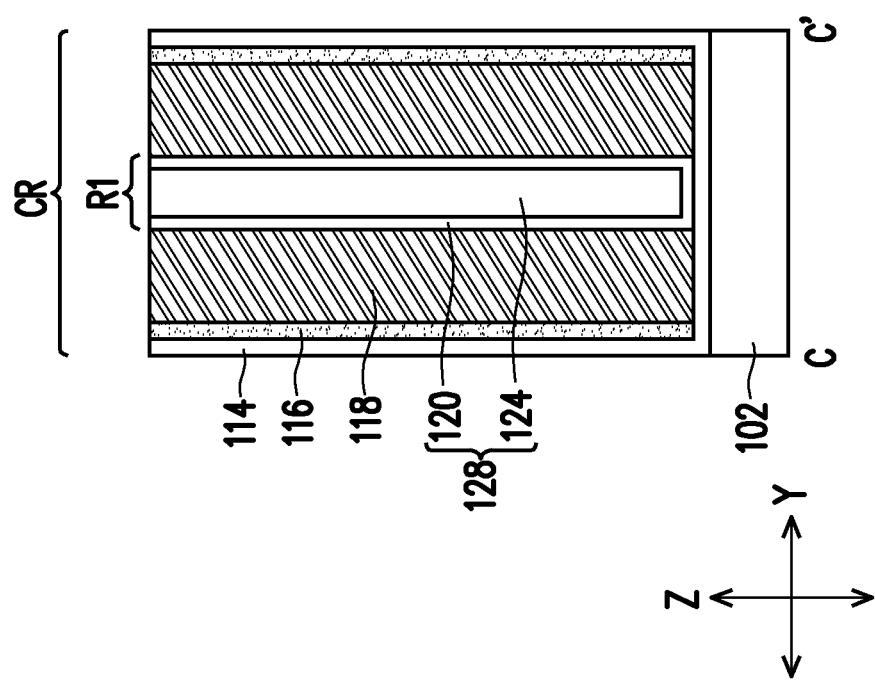
FIG. 11B
FIG. 11A

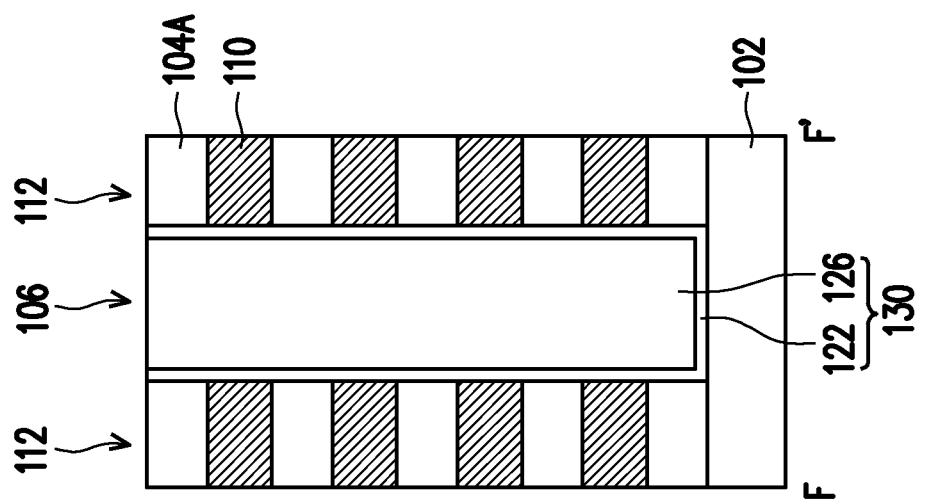
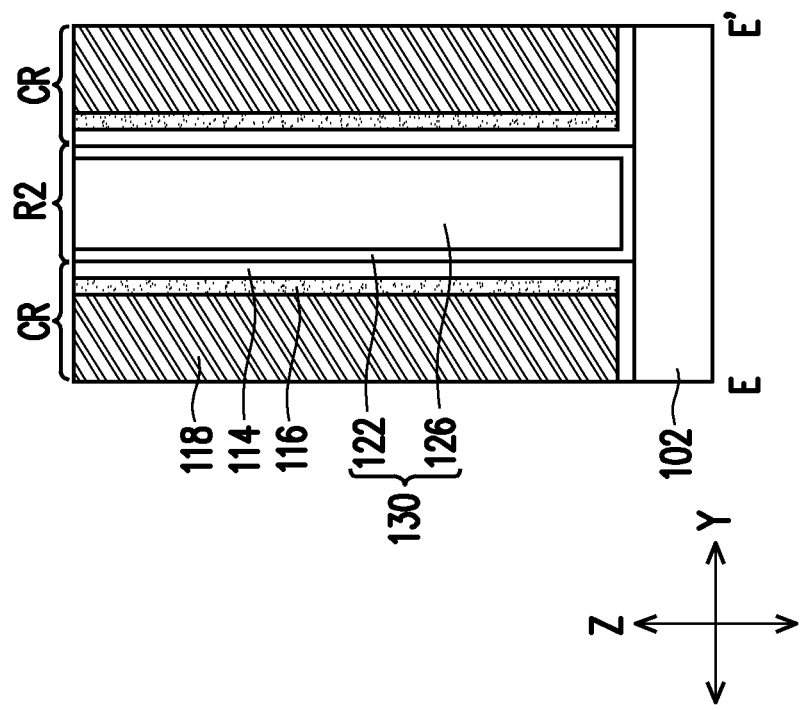
FIG. 11D
FIG. 11C

THREE-DIMENSIONAL MEMORY DEVICE AND MANUFACTURING METHOD THEREOF

CROSS-REFERENCE TO RELATED APPLICATION

This application is a divisional application of and claims the priority benefits of U.S. application Ser. No. 17/155,085, filed on Jan. 22, 2021. The prior application Ser. No. 17/155,085 claims the priority benefit of U.S. provisional application Ser. No. 63/045,198, filed on Jun. 29, 2020. The entirety of the above-mentioned patent application is hereby incorporated by reference herein and made a part of this specification.

BACKGROUND

Semiconductor memories are used in integrated circuits for electronic applications, including radios, televisions, cell phones, and personal computing devices, as examples. Semiconductor memories include two major categories. One is volatile memories; the other is non-volatile memories. Volatile memories include random access memory (RAM), which can be further divided into two sub-categories, static random-access memory (SRAM) and dynamic random-access memory (DRAM). Both SRAM and DRAM are volatile because they will lose the information they store when they are not powered.

On the other hand, non-volatile memories can keep data stored on them. One type of non-volatile semiconductor memory is ferroelectric random-access memory (FeRAM, or FRAM). Advantages of FeRAM include its fast write/read speed and small size.

BRIEF DESCRIPTION OF THE DRAWINGS

Aspects of the disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3A through FIG. 10A are schematic three-dimensional views illustrating structures at various stages during the manufacturing method of the three-dimensional memory device as shown in FIG. 2A and FIG. 2B.

FIG. 3B through FIG. 10B are schematic cross-sectional views along lines A-A' shown in FIG. 3A through FIG. 10A, respectively.

FIG. 3C through FIG. 10C are schematic enlarged plan views illustrating a portion of the three-dimensional memory device at process steps described with reference to FIG. 3A through FIG. 10A, respectively.

FIG. 11A through FIG. 11D are schematic enlarged cross-sectional views illustrating a portion of the three-dimensional memory device of FIG. 10A.

DETAILED DESCRIPTION

Figure 1:
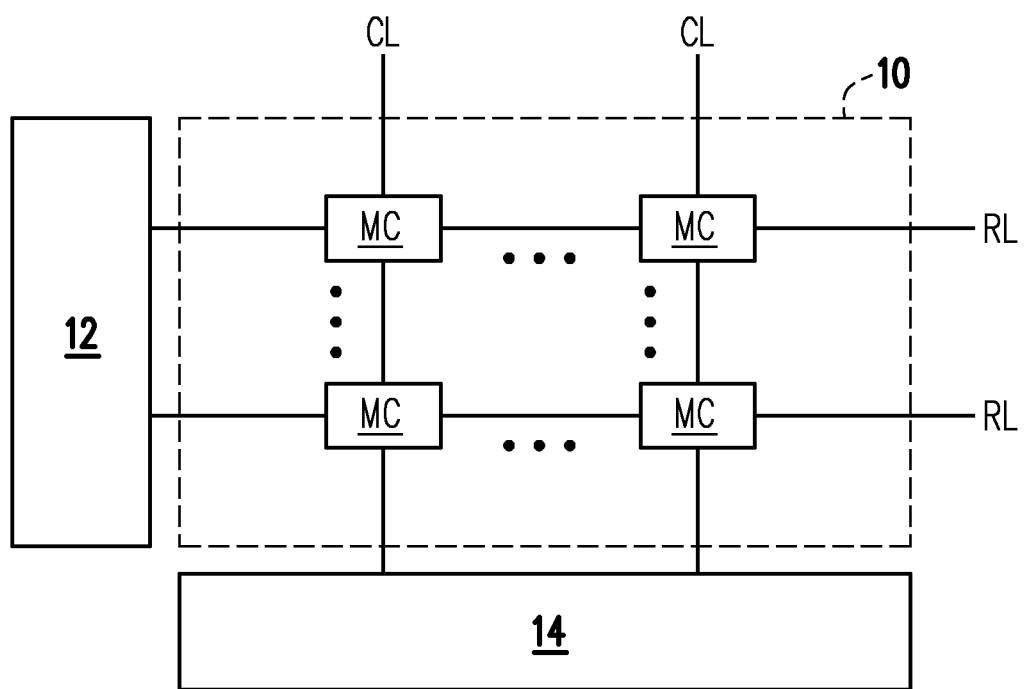
FIG. 1 is a block diagram of a three-dimensional memory in accordance with some embodiments of the disclosure.

The following disclosure provides many different embodiments, or examples, for implementing different features of the provided subject matter. Specific examples of components, values, operations, materials, arrangements, or the like, are described below to simplify the disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first", "second", "third", "fourth" and the like, may be used herein for ease of description to describe similar or different element(s) or feature(s) as illustrated in the figures, and may be used interchangeably depending on the order of the presence or the contexts of the description.

Three-dimensional memory is a new evolution that improves storage capacity of the non-volatile memory. By stacking memory cells vertically, it is possible to dramatically increase the storage capacity without significantly increasing footprint area of the non-volatile memory.

FIG. 1 is a block diagram of a three-dimensional memory in accordance with some embodiments of the disclosure. Referring to FIG. 1, in some embodiments, the three-dimensional memory includes a three-dimensional memory device 10, a row decoder 12, and a column decoder 14. The three-dimensional memory device 10, the row decoder 12, and the column decoder 14 may each be part of a same semiconductor die, or may be parts of different semiconductor dies. For example, the three-dimensional memory device 10 can be part of a first semiconductor die, while the row decoder 12 and the column decoder 14 can be parts of a second semiconductor die.

In some embodiments, the three-dimensional memory device 10 includes memory cells MC, row lines RL (such as word lines), and column lines CL (such as bit lines and/or source line). The memory cells MC are arranged in rows and columns (e.g., in a form of array, which may be referred to as a memory array). The row lines R and the column lines CL are electrically connected to the memory cells MC. The row lines RL are conductive lines that extend along the rows of the memory cells MC. The column lines CL are conductive lines that extend along the columns of the memory cells MC.

The row decoder 12 may be, e.g., a static complementary metal-oxide-semiconductor (CMOS) decoder, a pseudo N-type metal-oxide-semiconductor (pseudo-NMOS) decoder, or the like. During operation, the row decoder 12 selects desired memory cells MC in a row of the three-dimensional memory device 10 by activating a corresponding row lines RL for the row. The column decoder 14 may be, e.g., a static CMOS decoder, a pseudo-NMOS decoder, or the like, and may include writer drivers, sense amplifiers, combinations thereof, or the like. During operation, the column decoder 14 selects corresponding column lines CL for the desired memory cells MC from columns of the three-dimensional memory device 10 in the selected row, and reads data from or writes data to the selected memory cells MC with the corresponding column lines CL.

Figure 2A:
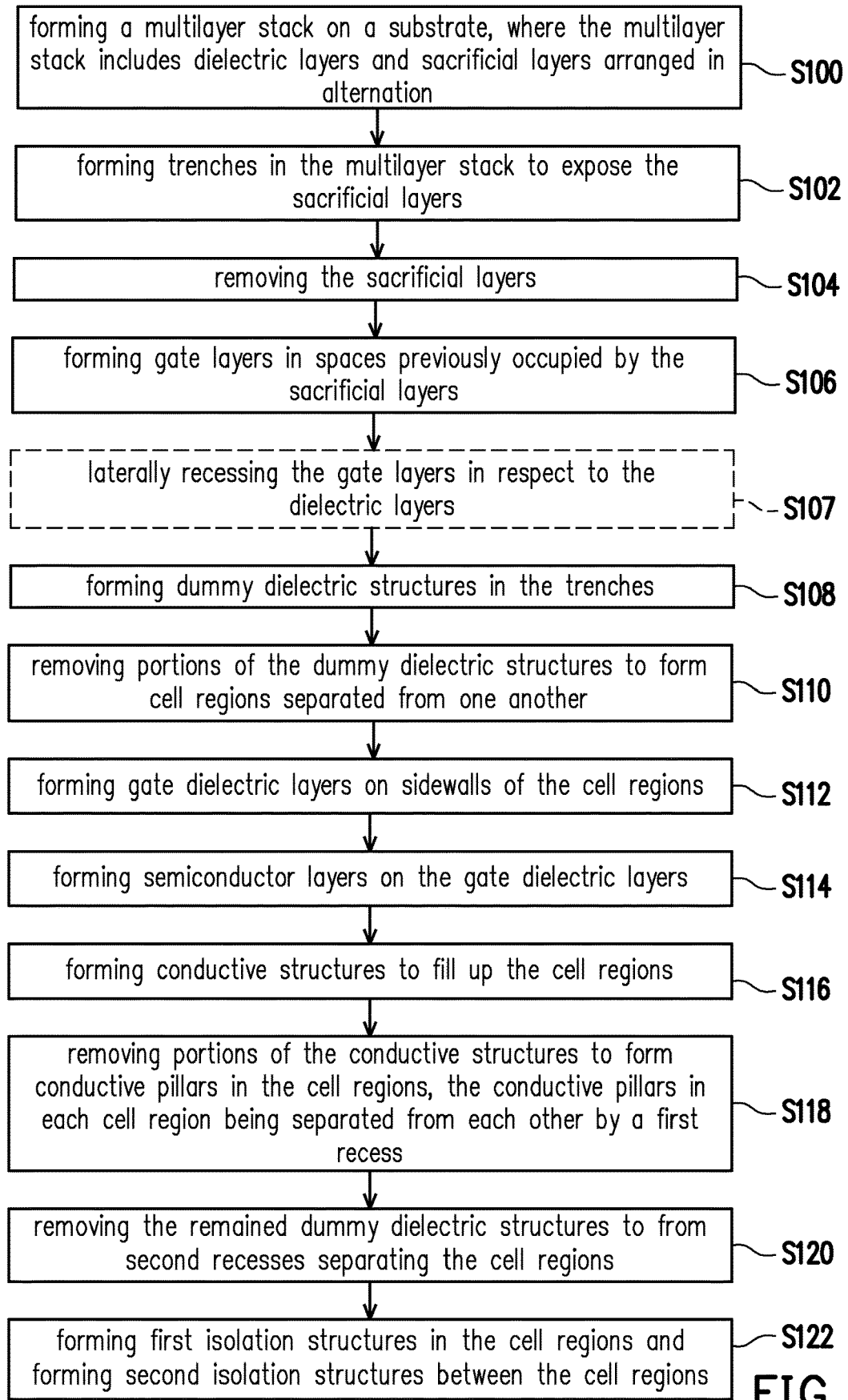
FIG. 2A and FIG. 2B are flow diagrams illustrating a manufacturing method for forming a three-dimensional memory device in accordance with some embodiments of the disclosure.
Figure 2B:
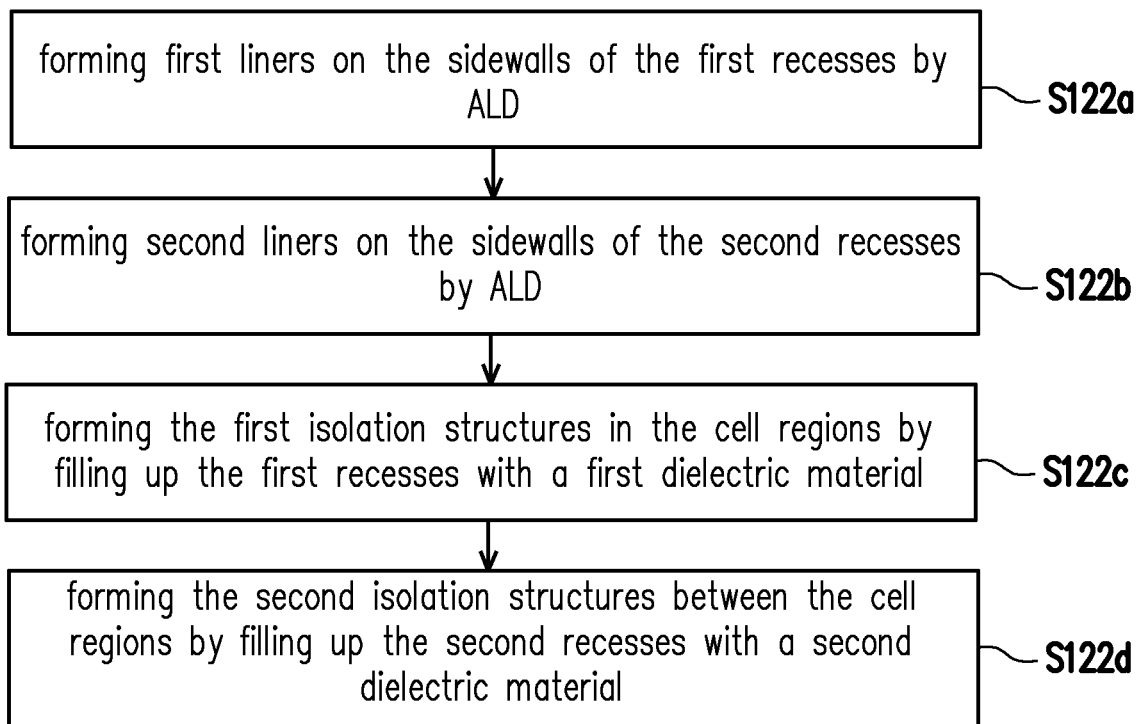

FIG. 2A and FIG. 2B are flow diagram illustrating a manufacturing method for forming a three-dimensional memory device 10 in accordance with some embodiments of the disclosure. FIG. 3A through FIG. 10A are schematic three-dimensional views illustrating structures at various stages during the manufacturing method of the three-dimensional memory device 10 as shown in FIG. 2A and FIG. 2B. FIG. 3B through FIG. 10B are schematic cross-sectional views along lines A-A' shown in FIG. 3A through FIG. 10A, respectively. FIG. 3C through FIG. 10C are schematic enlarged plan views illustrating a portion of the three-dimensional memory device 10 indicated by dotted boxes B at process steps described with reference to FIG. 3A through FIG. 10A, respectively. FIG. 11A through FIG. 11D are schematic enlarged cross-sectional views illustrating a portion of the three-dimensional memory device 10 of FIG. 10A, which are respectively taken along lines C-C', D-D', E-E' and F-F' shown in FIG. 10A. A portion of the three-dimensional memory device 10 is illustrated, for example.

Figure 3A:
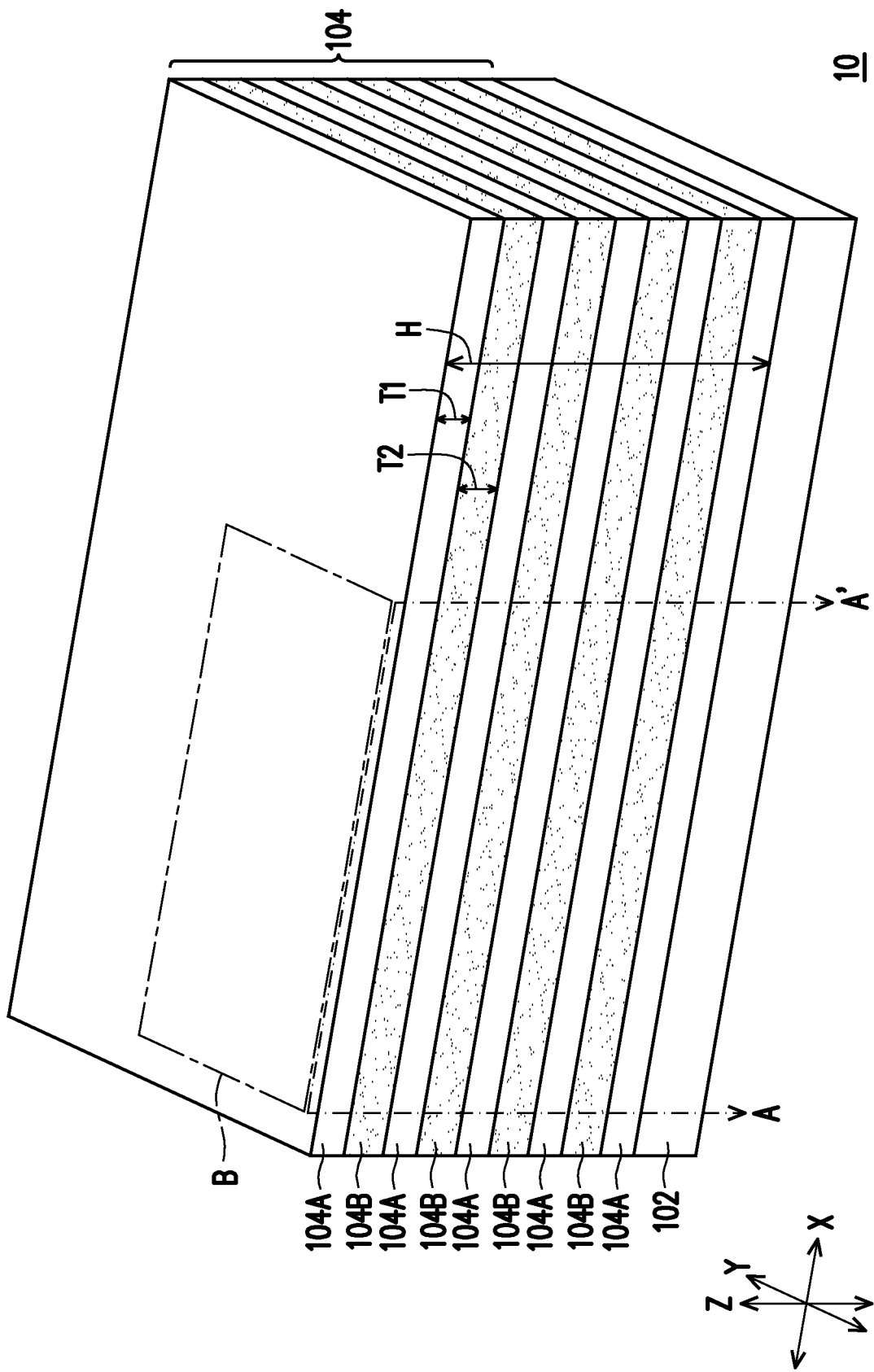
Figure 3B:
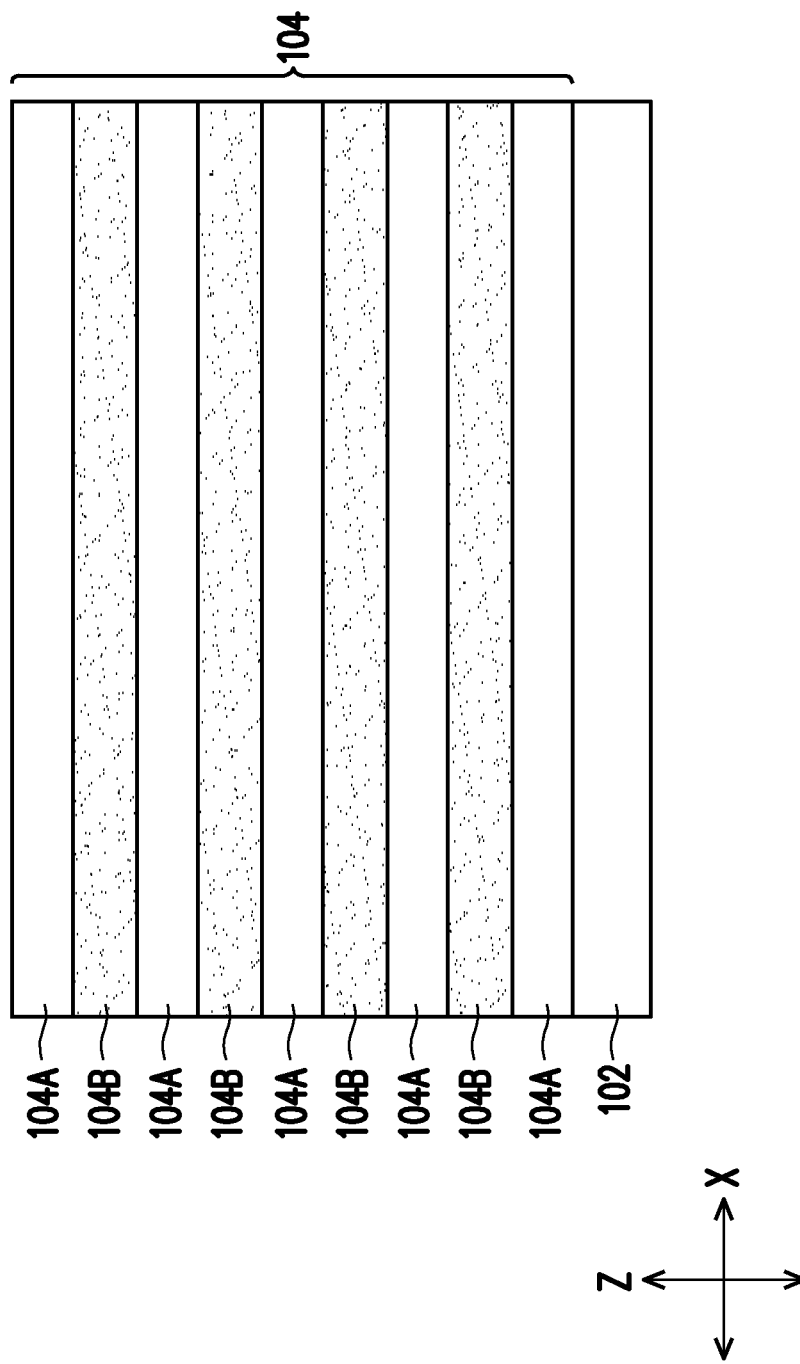
Figure 3C:
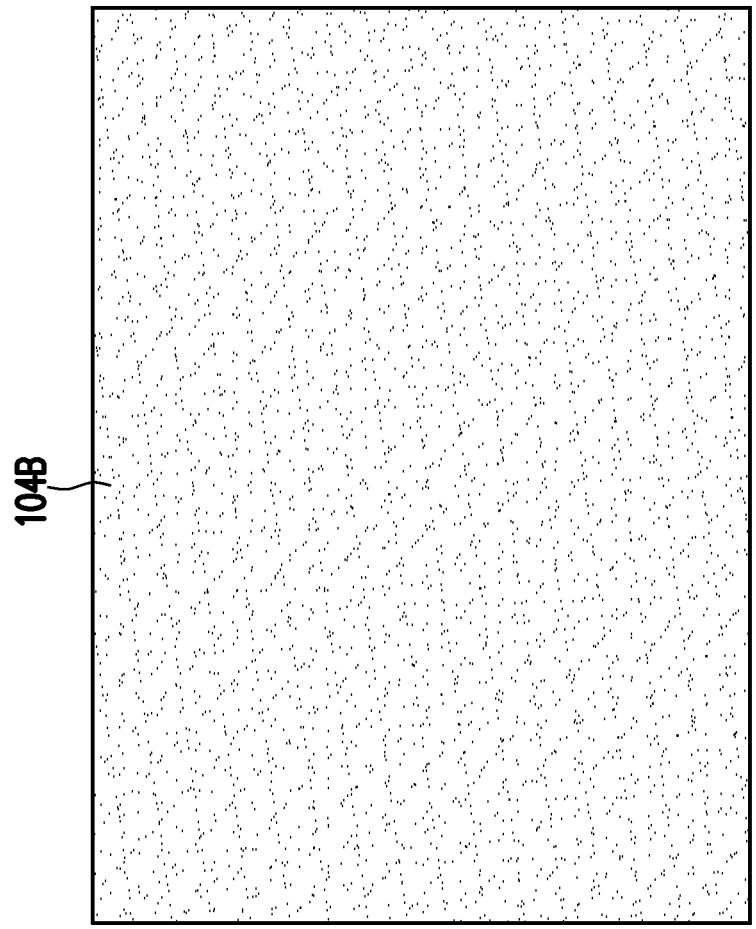

Referring to FIG. 3A through FIG. 3C, in some embodiments, an underlying structure 102 is provided, and a multilayer stack 104 is formed over the underlying structure 102, in accordance with step S100 of FIG. 2A. The underlying structure 102, for example, is an etching stop layer over a semiconductor substrate (not shown) to prevent any undesired damages or etches to layers underneath the underlying structure inside the CMOS integrated circuit. The underlying structure 102 may be referred to as a substrate of the three-dimensional memory device 10. The underlying structure 102 may be a semiconductor substrate, such as a bulk semiconductor substrate, a semiconductor-on-insulator (SOI) substrate, or the like, which may be doped (e.g., with a p-type or an n-type dopant) or undoped. The underlying structure 102 may be a wafer, such as a silicon wafer. Generally, an SOI substrate is a layer of a semiconductor material formed on an insulator layer. The insulator layer may be a buried oxide (BOX) layer, a silicon oxide layer, or the like. For example, the insulator layer is provided on a substrate, typically a silicon or glass substrate. Other substrates, such as a multilayered or gradient substrate may also be used. In some embodiments, the semiconductor material of the underlying structure 102 includes silicon; germanium; a compound semiconductor including silicon carbide, gallium arsenide, gallium phosphide, indium phosphide, indium arsenide, and/or indium antimonide; an alloy semiconductor including silicon germanium, gallium arsenide phosphide, aluminum indium arsenide, aluminum gallium arsenide, gallium indium arsenide, gallium indium phosphide, and/or gallium indium arsenide phosphide; or combinations thereof. The underlying structure 102 may include a dielectric material. For example, the underlying structure 102 is a dielectric substrate, or include a dielectric layer on a semiconductor substrate. Acceptable dielectric materials for dielectric substrates may include oxides such as silicon oxide; nitrides such as silicon nitride; carbides such as silicon carbide; the like; or combinations thereof such as silicon oxynitride, silicon oxycarbide, silicon carbonitride, or the like. In some embodiments, as shown in FIG. 3A, the underlying structure 102 is formed of silicon carbide.

In some embodiments, the multilayer stack 104 includes alternating first dielectric layers 104A and second dielectric layers 104B. For example, the first dielectric layers 104A are formed of a first dielectric material, and the second dielectric layers 104B are formed of a second dielectric material. The first dielectric material and the second dielectric material may each be selected from the candidate dielectric materials of the underlying structure 102. The first dielectric material is different from the second dielectric material, in some embodiments. As illustrated in FIG. 3A through FIG. 10C, the multilayer stack 104 includes five layers of the first dielectric layers 104A and four layers of the second dielectric layers 104B for illustrative purposes; however, the disclosure is not limited thereto. It should be appreciated that the multilayer stack 104 may include any number of the first dielectric layers 104A and the second dielectric layers 104B.

The multilayer stack 104 will be patterned in subsequent processing depicted in FIGS. 4A-4C through FIGS. 10A-10C to form trenches and transistors formed in the trenches. As such, the dielectric materials of the first dielectric layers 104A and the second dielectric layers 104B both have a high etching selectivity from the etching of the underlying structure 102. In other words, for example, the underlying structure 102 is an etching stop layer formed over a CMOS integrated circuit. The patterned first dielectric layers 104A are insulating layers, which will be used to isolate the subsequently formed transistors. The patterned second dielectric layers 104B are sacrificial layers (or dummy layers), which will be removed in subsequent processing and replaced with word lines for the transistors. As such, the second dielectric material of the second dielectric layers 104B also has a high etching selectivity from the etching of the first dielectric material of the first dielectric layers 104A. In other words, the first dielectric layers 104A could remain substantially intact during removal of the second dielectric layers 104B. In embodiments where the underlying structure 102 is formed of silicon carbide, the first dielectric layers 104A can be formed of an oxide such as silicon oxide, and the second dielectric layers 104B can be formed of a nitride such as silicon nitride. Other combinations of dielectric materials having acceptable etching selectivity from one another may also be used.

Each layer of the multilayer stack 104 may be formed by an acceptable deposition process such as chemical vapor deposition (CVD) such as plasma-enhanced chemical vapor deposition (PECVD) or flowable chemical vapor deposition (FCVD), atomic layer deposition (ALD), or the like. A thickness of each of the layers may be in the range of about 15 nm to about 90 nm. In some embodiments, the first dielectric layers 104A are formed to a different thickness than the second dielectric layers 104B. For example, the first dielectric layers 104A can be formed to a first thickness T1 and the second dielectric layers 104B can be formed to a second thickness T2, with the second thickness T2 being from about 0% to about 100% greater than or less than the first thickness T1. The multilayer stack 104 can have an overall height H in the range of about 1000 nm to about 50000 nm. In the disclosure, FIG. 3C through FIG. 10C each schematically illustrate the enlarged plan view of a portion the three-dimensional memory device 10 depicted in the boxes B that is at a level where one second dielectric layer 104B located in, for example.

Figure 4A:
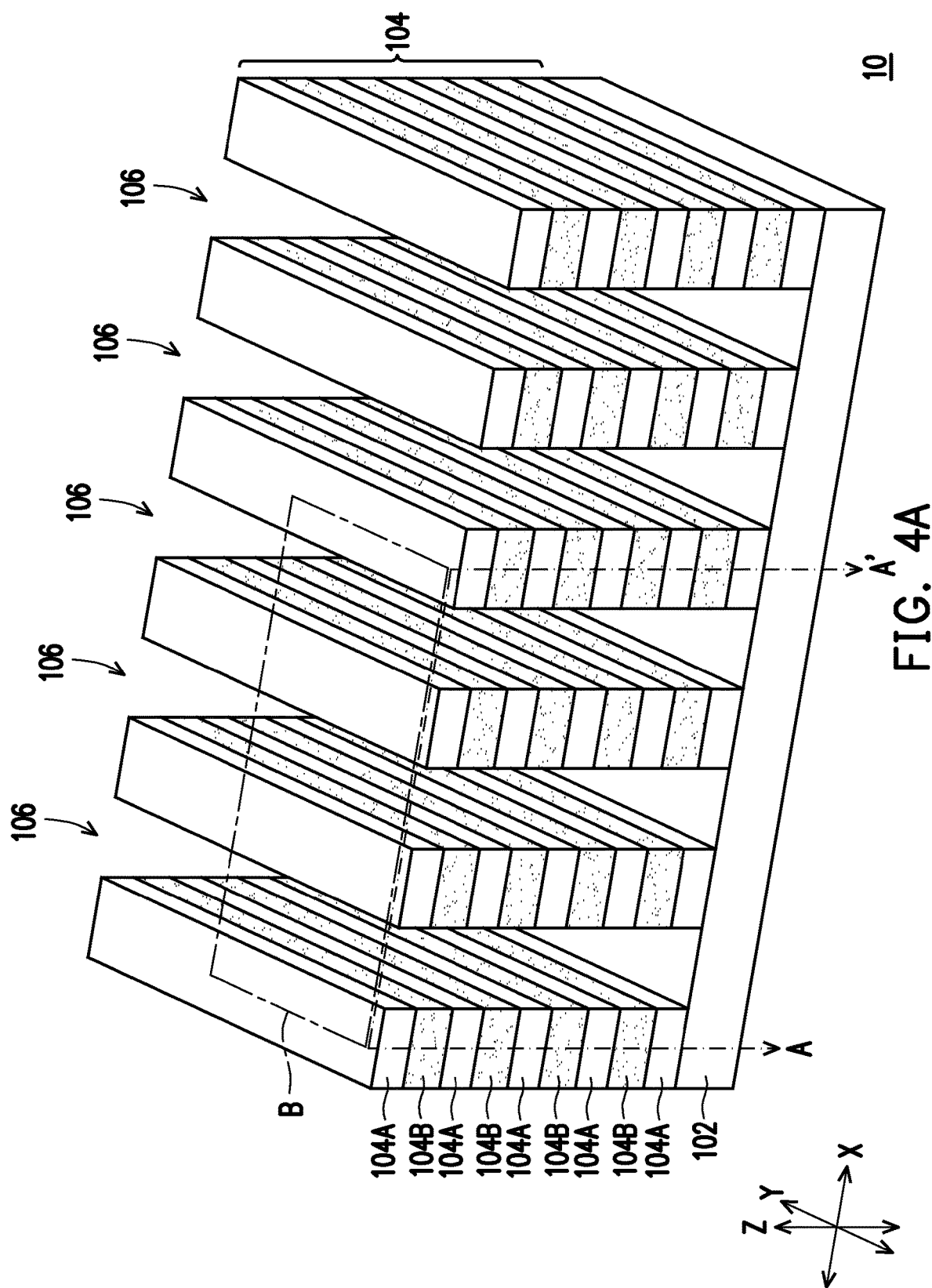
Figure 4B:
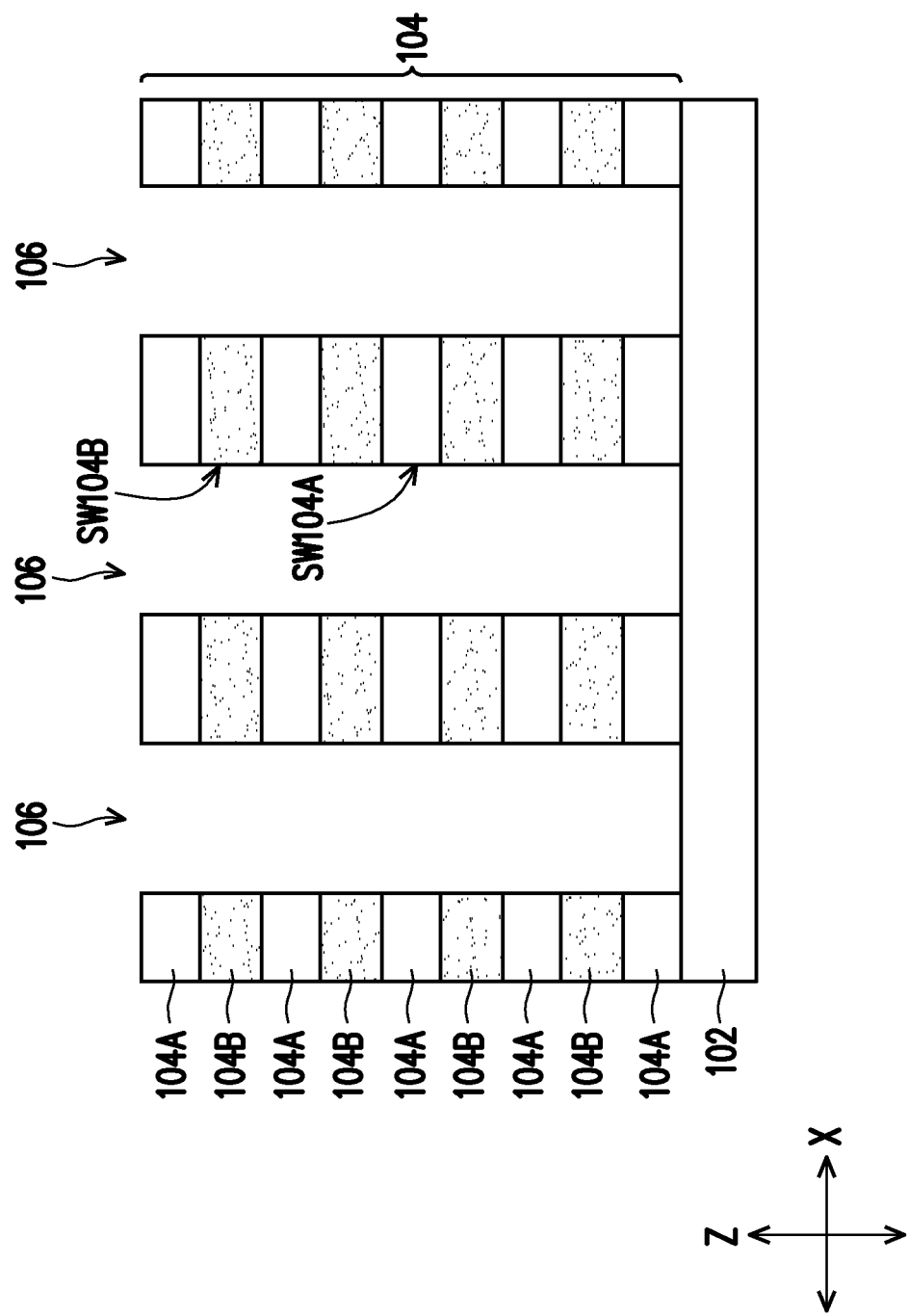
Figure 4C:
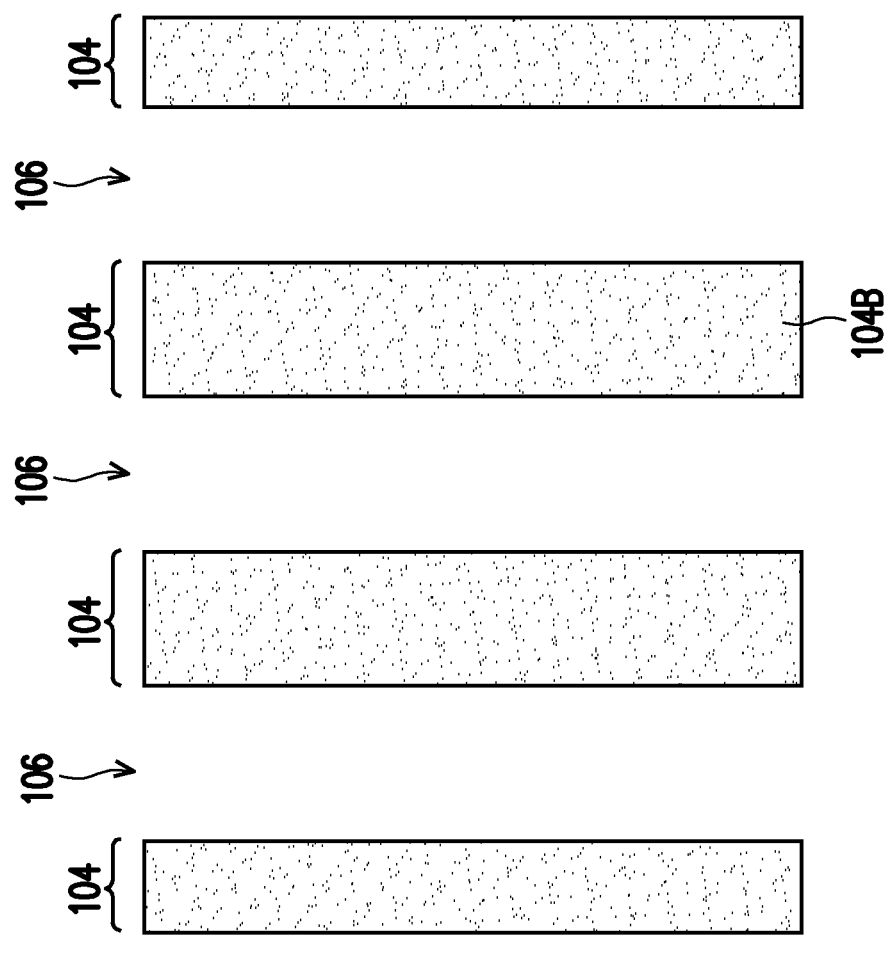

Referring to FIG. 4A through FIG. 4C, in some embodiments, trenches 106 are formed in the multilayer stack 104, in accordance with step S102 of FIG. 2A. For example, as shown in FIG. 4A and FIG. 4B, the trenches 106 extend through the multilayer stack 104 and expose the underlying structure 102. In alternative embodiments, the trenches 106 extend through some but not all layers of the multilayer stack 104. The trenches 106 may be formed using acceptable photolithography and etching techniques, such as with an etching process that is selective to the multilayer stack 104 (e.g., etches the dielectric materials of the first dielectric layers 104A and the second dielectric layers 104B at a faster rate than the material of the underlying structure 102). The etching may be any acceptable etch process, such as a reactive ion etch (RIE), a neutral beam etch (NBE), the like, or a combination thereof. The etching may be anisotropic. In embodiments where the underlying structure 102 is formed of silicon carbide, the first dielectric layers 104A are formed of silicon oxide, and the second dielectric layers 104B are formed of silicon nitride, the trenches 106 can be formed by a dry etch using a fluorine-based gas (e.g., $C_4F_6$) mixed with hydrogen ($H_2$) or oxygen ($O_2$) gas. As shown in FIG. 4A through FIG. 4C, a portion of the multilayer stack 104 is disposed between each pair of the trenches 106, for example. In some embodiments, sidewalls SW104A of the first dielectric layers 104A and sidewalls SW104B of the second dielectric layers 104B are exposed by the trenches 106. The sidewalls SW104A of the first dielectric layers 104A may be substantially coplanar to and levelled with the sidewalls SW104B of the second dielectric layers 104B.

Figure 5A:
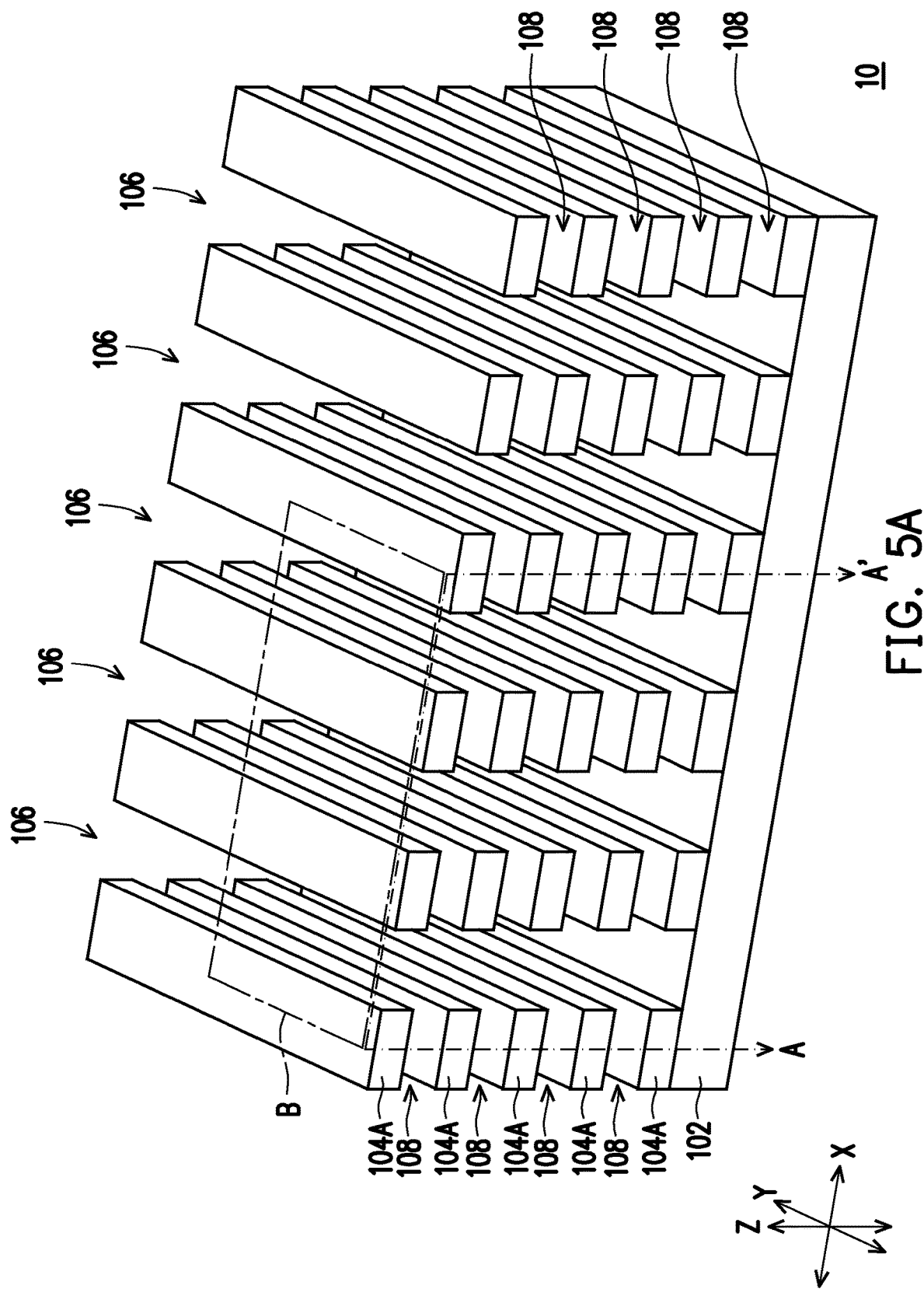
Figure 5B:
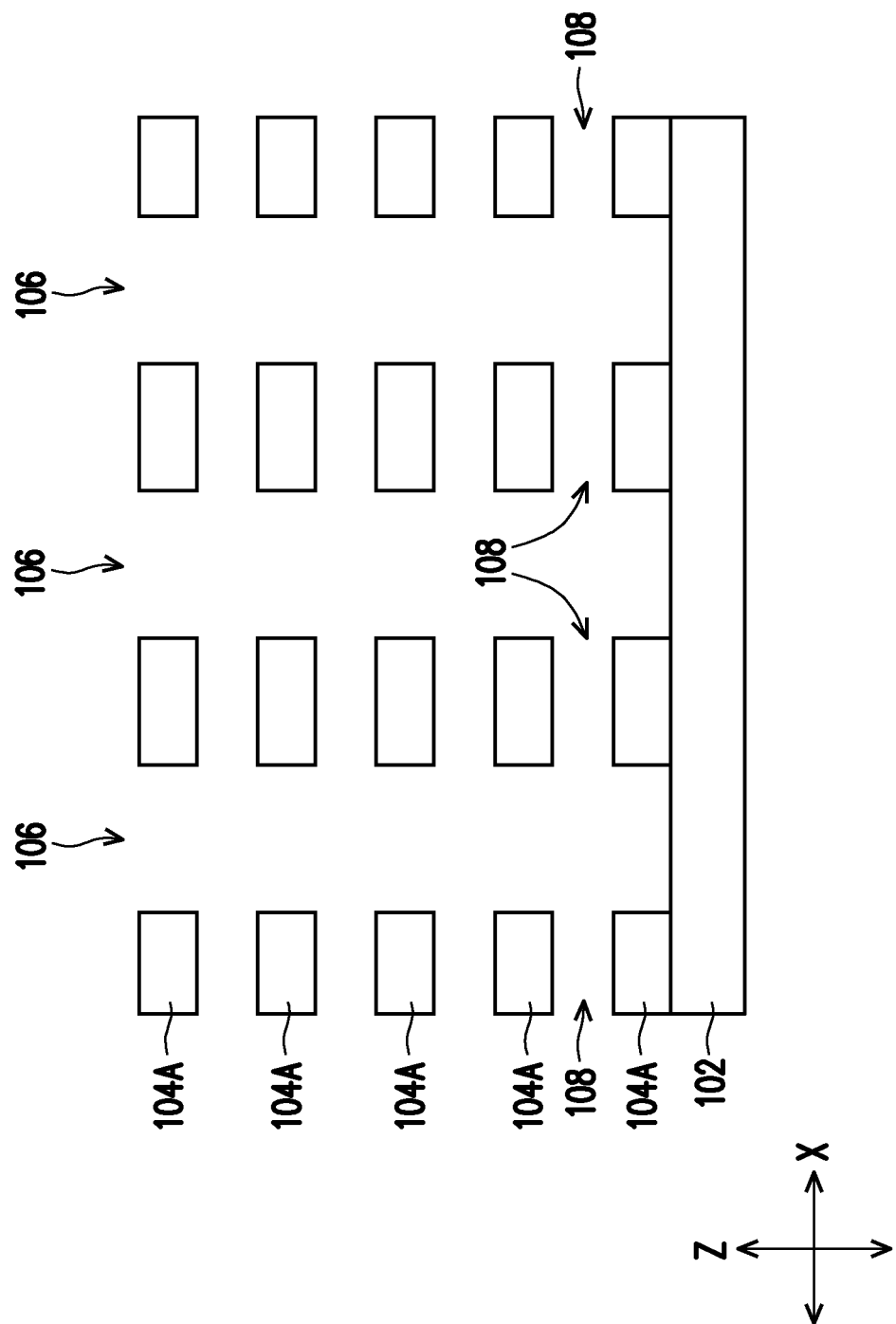
Figure 5C:
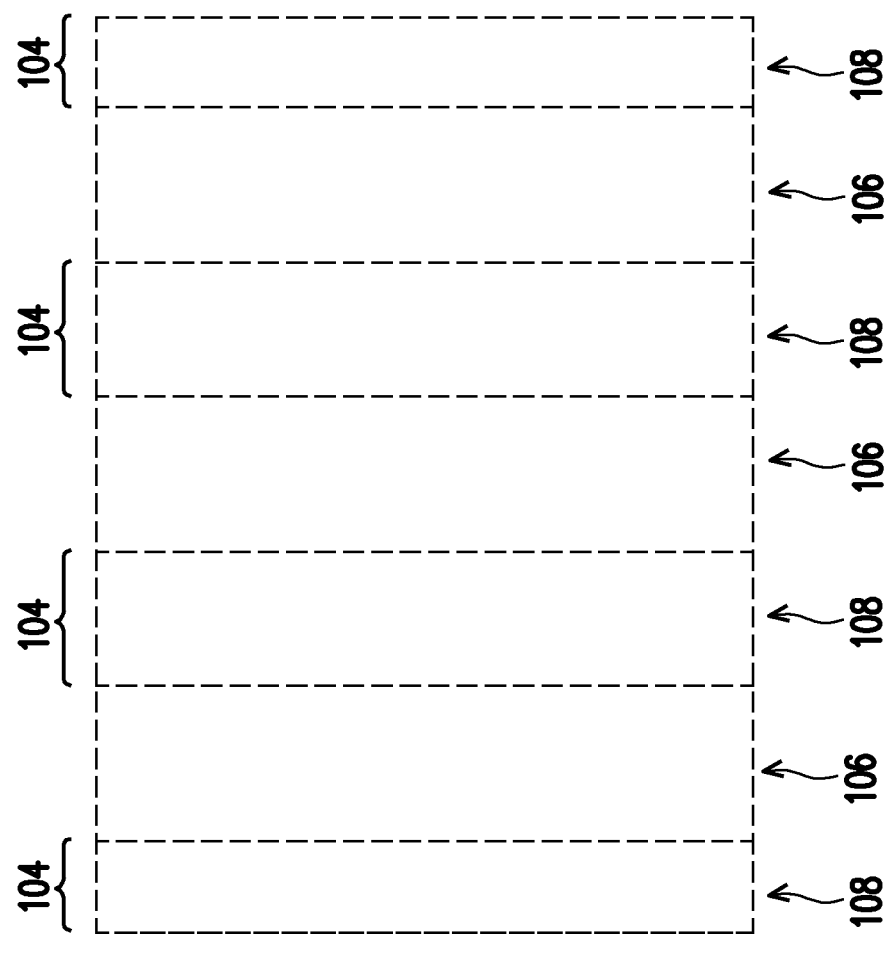

Referring to FIG. 5A through FIG. 5C, in some embodiments, the second dielectric layers 104B are selectively removed, in accordance with step S104 of FIG. 2A. By removing the second dielectric layers 104B, recesses 108 are formed to expose surfaces of the first dielectric layers 104A previously in contact with the second dielectric layers 104B, for example. In some embodiments, the trenches 106 and the recesses 108 are spatially communicated to each other.

The recesses 108 may be formed by an acceptable etching process, such as one that is selective to the material of the second dielectric layers 104B (e.g., selectively etches the material of the second dielectric layers 104B at a faster rate than the materials of the first dielectric layers 104A and the underlying structure 102). The etching may be isotropic. In embodiments where the underlying structure 102 is formed of silicon carbide, the first dielectric layers 104A are formed of silicon oxide, and the second dielectric layers 104B are formed of silicon nitride, the trenches 106 can be expanded by a wet etch using phosphoric acid ($H_3PO_4$). In alternative embodiments, a dry etch selective to the material of the second dielectric layers 104B may be used. Due to the first dielectric layers 104A could remain substantially intact during removal of the second dielectric layers 104B, the recesses 108 each can have a thickness substantially equal to the thickness T2 of the second dielectric layers 104B. Further, a periphery region surrounding an array region with a memory array (included in the three-dimensional memory device 10) has some portions of the second dielectric layers 104B that are not removed (e.g., during the replacement process described in FIG. 5A through FIG. 5C and FIG. 6A through FIG. 6C). Therefore, some portions of the second dielectric layers 104B in the periphery region also provides further support to prevent the first dielectric layers 104A in the array region from collapse.

Figure 6A:
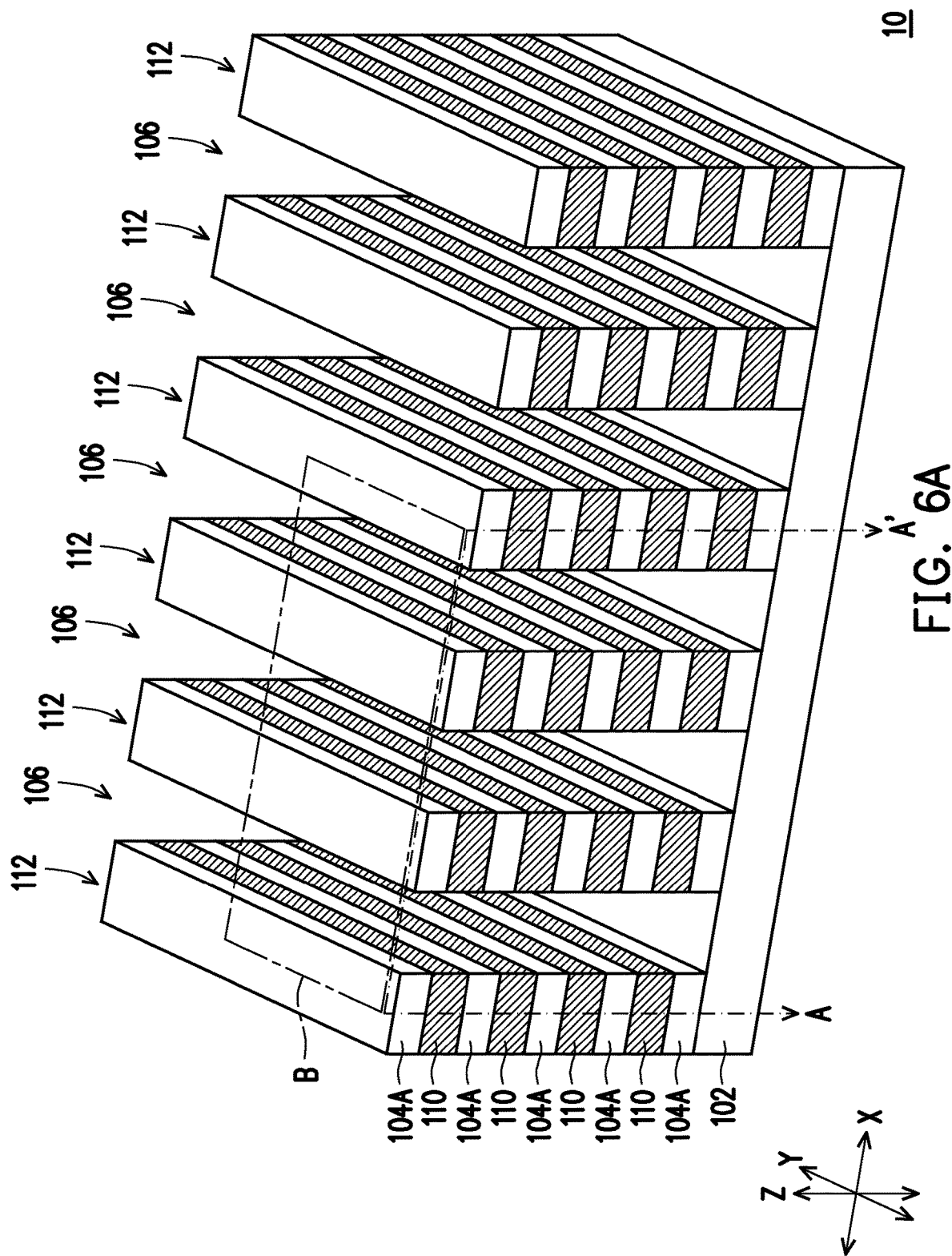
Figure 6B:
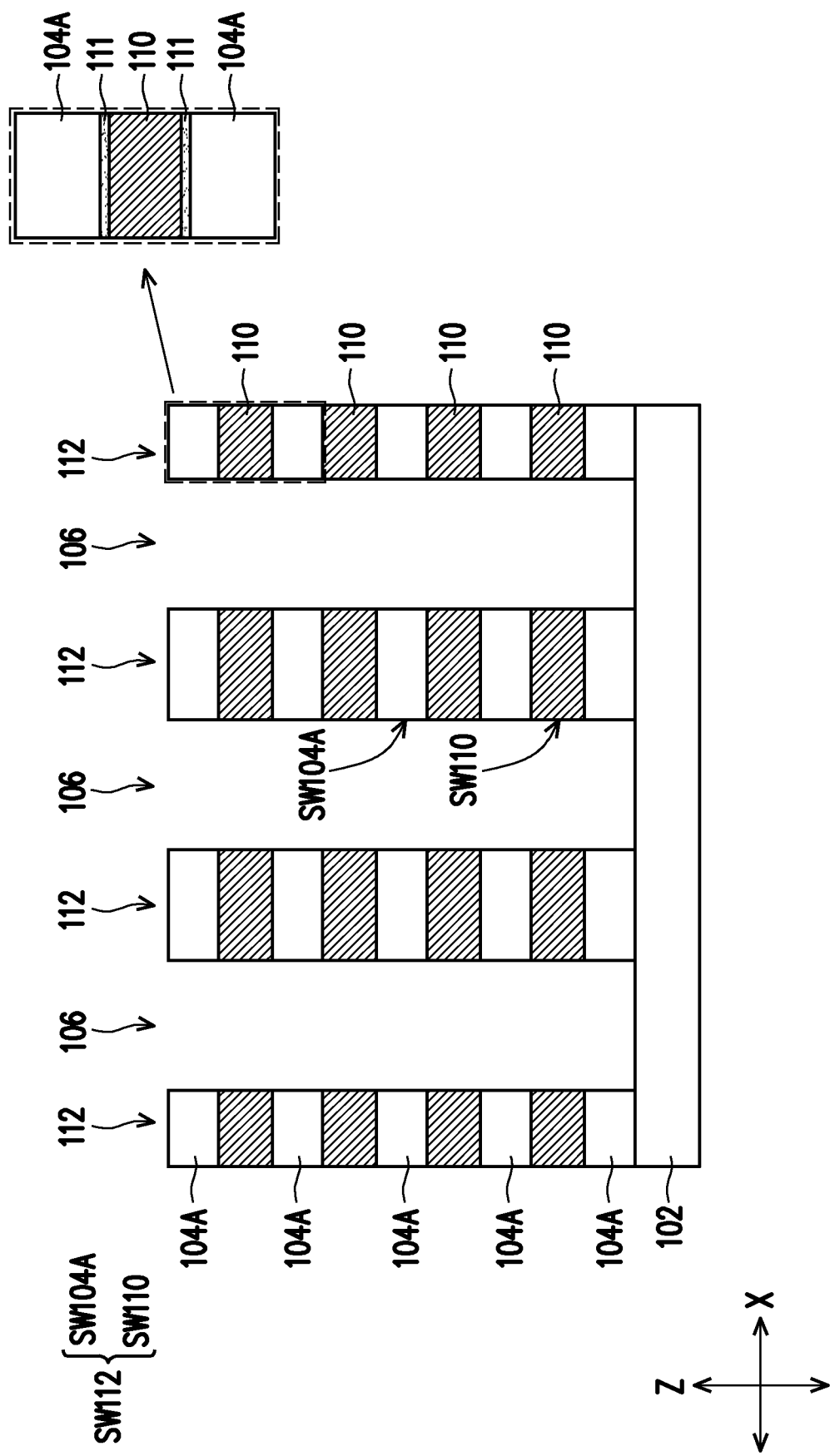
Figure 6C:
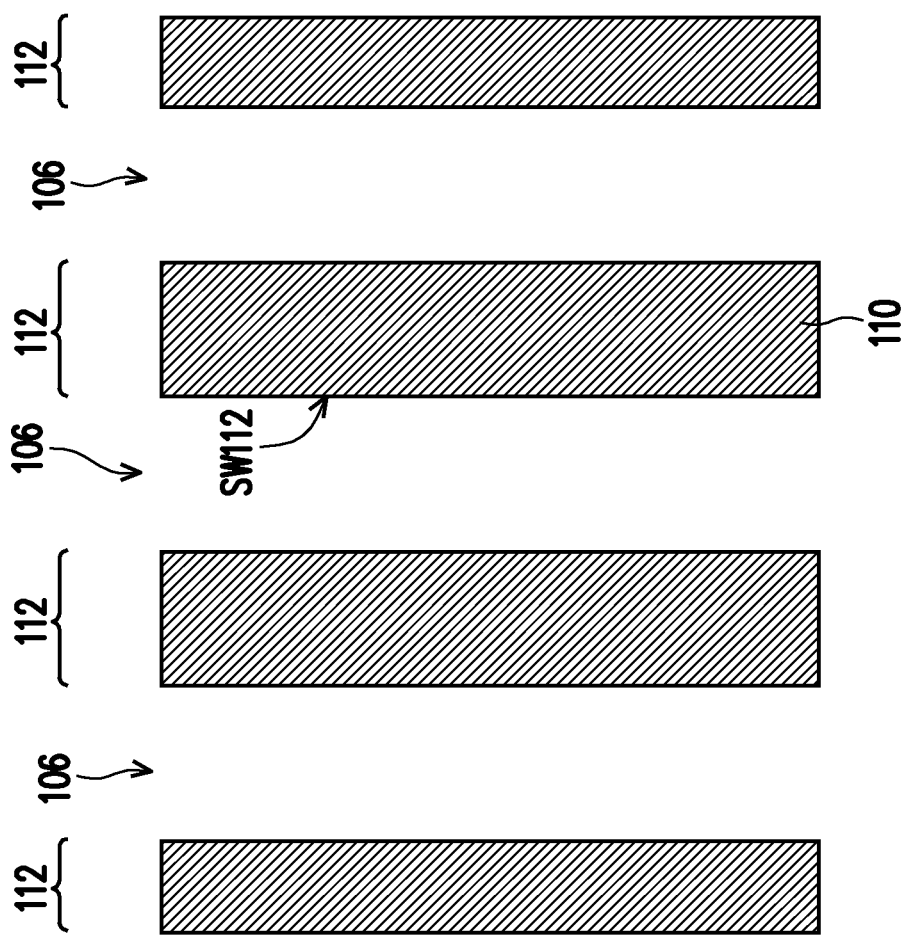

Referring to FIG. 6A through FIG. 6C, in some embodiments, conductive layers 110 are formed in the recesses 108, in accordance with step S106 of FIG. 2A. In some embodiments, the previously existed second dielectric layers 104B are replaced by the conductive layers 110. For example, the first dielectric layers 104A and the conductive layers 110 are stacked on the underlying structure 102 in alternation, and together form a plurality of stacking structures 112. The stacking structures 112 are laterally spaced apart from one another by the trenches 106, and directly stand on the underlying structure 102. In some embodiments, sidewalls SW110 of the conductive layers 110 are substantially coplanar to and levelled with the sidewalls SW104A of the first dielectric layers 104A, as shown in FIG. 6B. The sidewalls SW110 of the conductive layers 110 and the sidewalls SW104A of the first dielectric layers 104A may together referred to as sidewalls SW112 of the stacking structures 112. For example, the sidewalls SW112 of the stacking structures 112 are substantially vertical sidewalls being substantially planar and flat, as shown in FIG. 6A and FIG. 6B. In other words, the sidewalls SW112 of the stacking structures 112 are continuously vertical sidewalls. For example, in a cross-section of FIG. 6B, the sidewalls SW112 include a substantially straight line. The conductive layers 110 may be formed of a conductive material, such as a metal, such as tungsten, ruthenium, molybdenum, cobalt, aluminum, nickel, copper, silver, gold, alloys thereof, or the like. The conductive layers 110 may each be formed by an acceptable deposition process such as CVD, ALD, or the like.

A method for forming the conductive layers 110 may include, but not limited to, filling up the trenches 106 and the recesses 108 between the first dielectric layers 104A (shown in FIG. 5A) with the conductive material by a deposition process, such as a CVD process or an ALD process. Thereafter, portions of the conductive material not covered by the first dielectric layers 104A are removed by an etching process (e.g. a "etch-back" process). The remained portions of the conductive material form the conductive layers 110. In other words, the first dielectric layers 104A may be functioned as shadow masks during such etching process, and such patterning of the conductive material can be considered as a self-aligning process. An acceptable etch process, such as a dry etch (e.g., RIE, NBE, the like), a wet etch, the like, or a combination thereof, may be performed to remove excess conductive material from the sidewalls of the first dielectric layers 104A and the top surface of the underlying structure 102. The etching may be anisotropic or isotropic. Each of the conductive layers 110 can have a similar overall thickness T2 as the second dielectric layers 104B (discussed above with respect to FIG. 3A). Up to here, the replacement of second dielectric layers 104B with the conductive material is completed. In the disclosure, the conductive layers 110 may be referred to as gate layers. The conductive layers 110 may act as the gates of the transistors.

Furthermore, although not shown, end portions of some of the stacking structures 112 may be shaped into staircase structures, of which an end portion of each film (one first dielectric layer 104A or one second dielectric layer 104B) of the multilayer stack 104 may be protruded with respect to an overlying film. One or more sides of the multilayer stack 104 is/are shaped into staircase structure(s) before forming the trenches 106. In these embodiments, the staircase structure (s) is/are formed by a staircase-first process. The first dielectric layers 104A and/or the second dielectric layers 104B may respectively be exposed at steps of the staircase structure(s). A method for shaping the multilayer stack 104 to form the staircase structure(s) may include a trim-and-etch process. Furthermore, a dielectric layer (not shown) may be subsequently formed on the multilayer stack 104 having the staircase structure. A top surface of this dielectric layer may be leveled with a top surface of the multilayer stack 104. With such, as the second dielectric layers 104B are removed and replaced with the conductive layers 110, the conductive layers 110 and the respective first dielectric layer 104A included in each of the stacking structures 112 is in a form of the staircase structure.

Additionally, one or more glue layers 111 (or referred to as barrier layers) may be formed between the first electric layers 104A and the conductive layers 110. In some embodiments, as shown in FIG. 6B, the glue layers 111 each extend along the sides (e.g., top surface and the bottom surface in contact with the first dielectric layers 104A) of a conductive layer 110. The glue layers 111 are formed of a conductive material different from the material of the conductive layers 110, such as a metal nitride. For example, the material of the glue layers 111 includes titanium nitride, tantalum nitride, molybdenum nitride, zirconium nitride, hafnium nitride, or the like. The material of the glue layers 111 is one has good adhesion to the material of the first dielectric layers 104A, and the material of the conductive layers 110 is one that has good adhesion to the material of the glue layers 111. For one example, the first dielectric layers 104A are formed of an oxide such as silicon oxide, the glue layers 111 can be formed of titanium nitride and the conductive layers 110 can be formed of tungsten. Besides, each glue layer 111 can have a thickness less than the thickness T1 of the first dielectric layers 104A and the thickness of the conductive layers 110, where a sum of the overall thickness of the glue layers 111 and the thickness of a corresponding conductive layers 110 located in one recess 108 is equal to the thickness (e.g. T2) of such recess 108. Due to the glue layers 111, the adhesion between the first dielectric layers 104A and the conductive layers 110 in each of the stacking structures 112 is enhanced. The glue layers 111 will be omitted in the following drawings for simplicity and illustrative purposes.

Figure 7A:
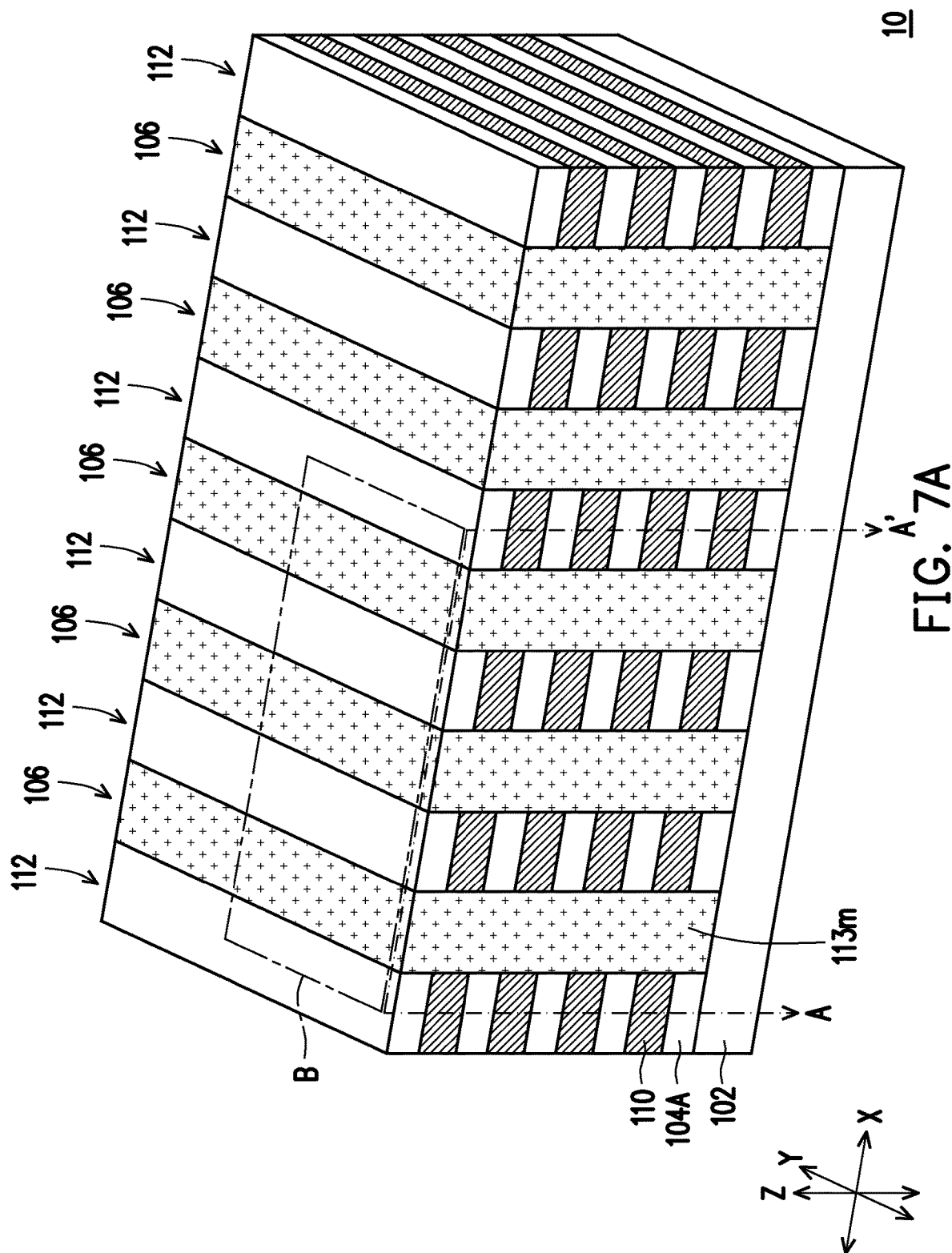
Figure 7B:
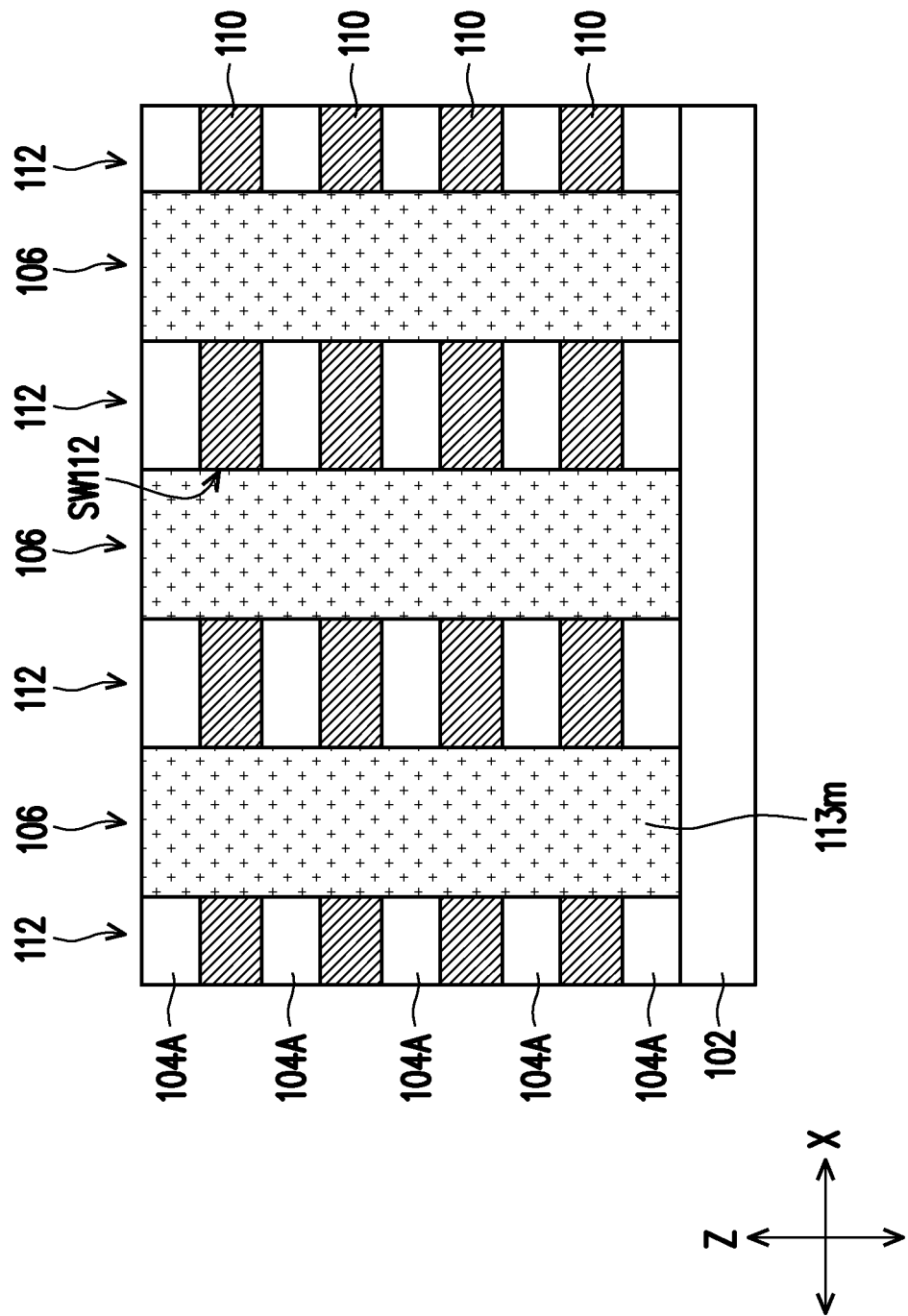
Figure 7C:
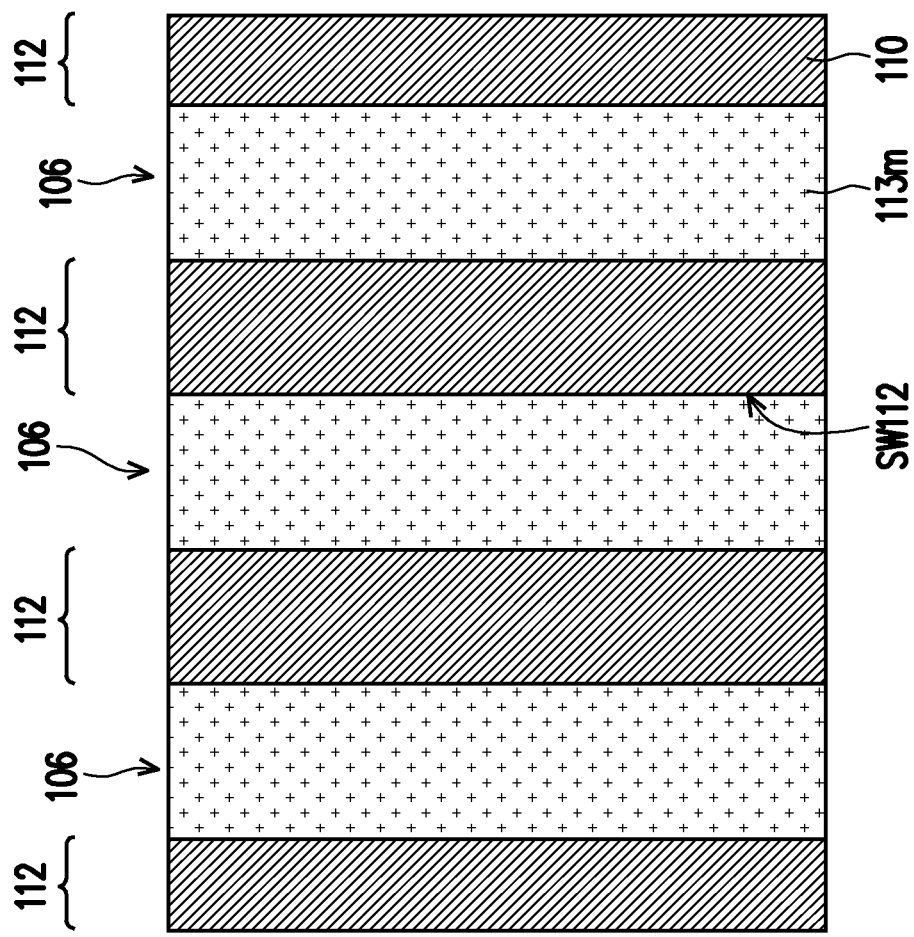

Referring to FIG. 7A through FIG. 7C, in some embodiments, dummy dielectric structures 113m are formed in the trenches 106, in accordance with step S108 of FIG. 2A. For example, the dummy dielectric structures 113m are formed to fill up the trenches 106, where sidewalls SW112 of the stacking structures 112 are in contact with the dummy dielectric structures 113m. The dummy dielectric structures 113m are formed of a dielectric material. Acceptable dielectric materials may include oxides such as silicon oxide or aluminum oxide; nitrides such as silicon nitride; carbides such as silicon carbide; the like; or combinations thereof such as silicon oxynitride, silicon oxycarbide, silicon carbonitride, or the like. The material of the dummy dielectric structure 113m may be the same as the material of the first dielectric layers 104A or the material of the second dielectric layers 104B. Alternatively, the material of the dummy dielectric structure 113m may be different from the material of the first dielectric layers 104A and/or the material of the second dielectric layers 104B. The disclosure is not limited thereto.

A method for forming the dummy dielectric structures 113m may include, but not limited to, filling up the trenches 106 with the dielectric material by a deposition process, such as CVD or the like. Subsequently, a planarization process may be performed to remove portions of the dielectric material above illustrated top surfaces of the stacking structures 112. The planarization process may include a chemical mechanical polish (CMP) process, an etching process (e.g. etch-back) or a combination thereof. The remained portions of the dielectric material located within the trenches 106 form the dielectric structures 113m. As shown in FIG. 7B, illustrated top surfaces of the dummy dielectric structures 113m are substantially coplanar to and levelled with the illustrated top surfaces of the stacking structures 112, for example.

Referring to FIG. 7A through FIG. 7C and FIG. 8A through FIG. 8C together, in some embodiments, portions of the dummy dielectric structure 113m are removed to form a plurality of cell regions CR separated from one another, in accordance with step S110 of FIG. 2A. For example, the dummy dielectric structures 113m of the trenches 106 are partially removed to form the cell regions CR, where non-removed dummy dielectric structure 113m in the trenches 106 form remained dummy dielectric structures 113 separating the cell regions CR from one another. The cell regions CR may penetrate through the remained dummy dielectric structures 113 to partially expose the top surface of the underlying structure 102 and the sidewalls SW112 of the stacking structures 112. A method for forming the cell regions CR may include, but not limited to, patterning dummy dielectric structure 113m by using a photolithography process and an etching process to partially remove the dummy dielectric structure 113m. The etching may be any acceptable etch process, such as RIE, NBE, the like, or a combination thereof. The etching may be anisotropic.

After the formation of the cell regions CR, film stacks may be formed in the cell regions CR. The film stacks each may include one dielectric layer 114, one semiconductor layer 116 and one conductive material 118m, and may be formed in one of the cell regions CR.

Figure 8A:
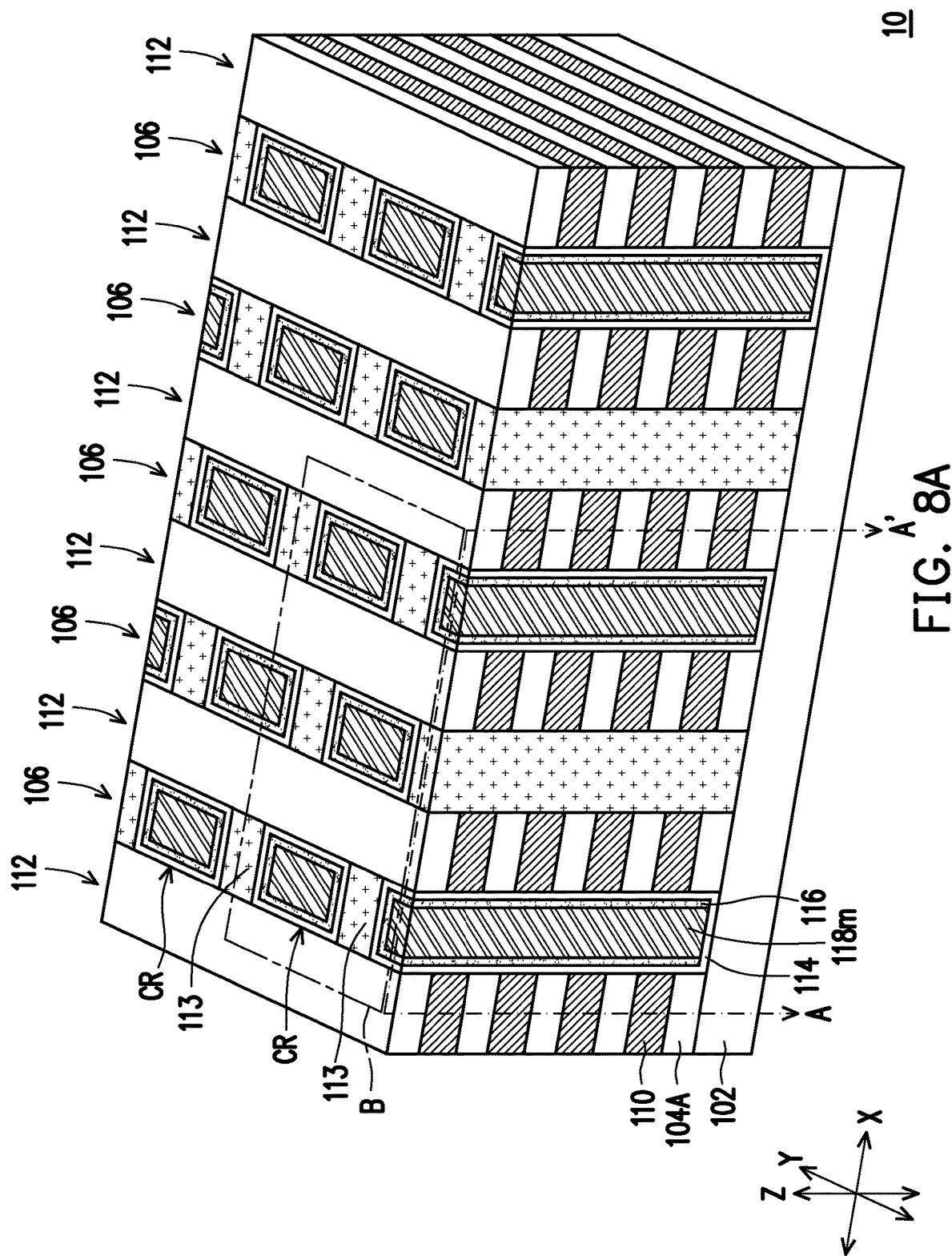
Figure 8B:
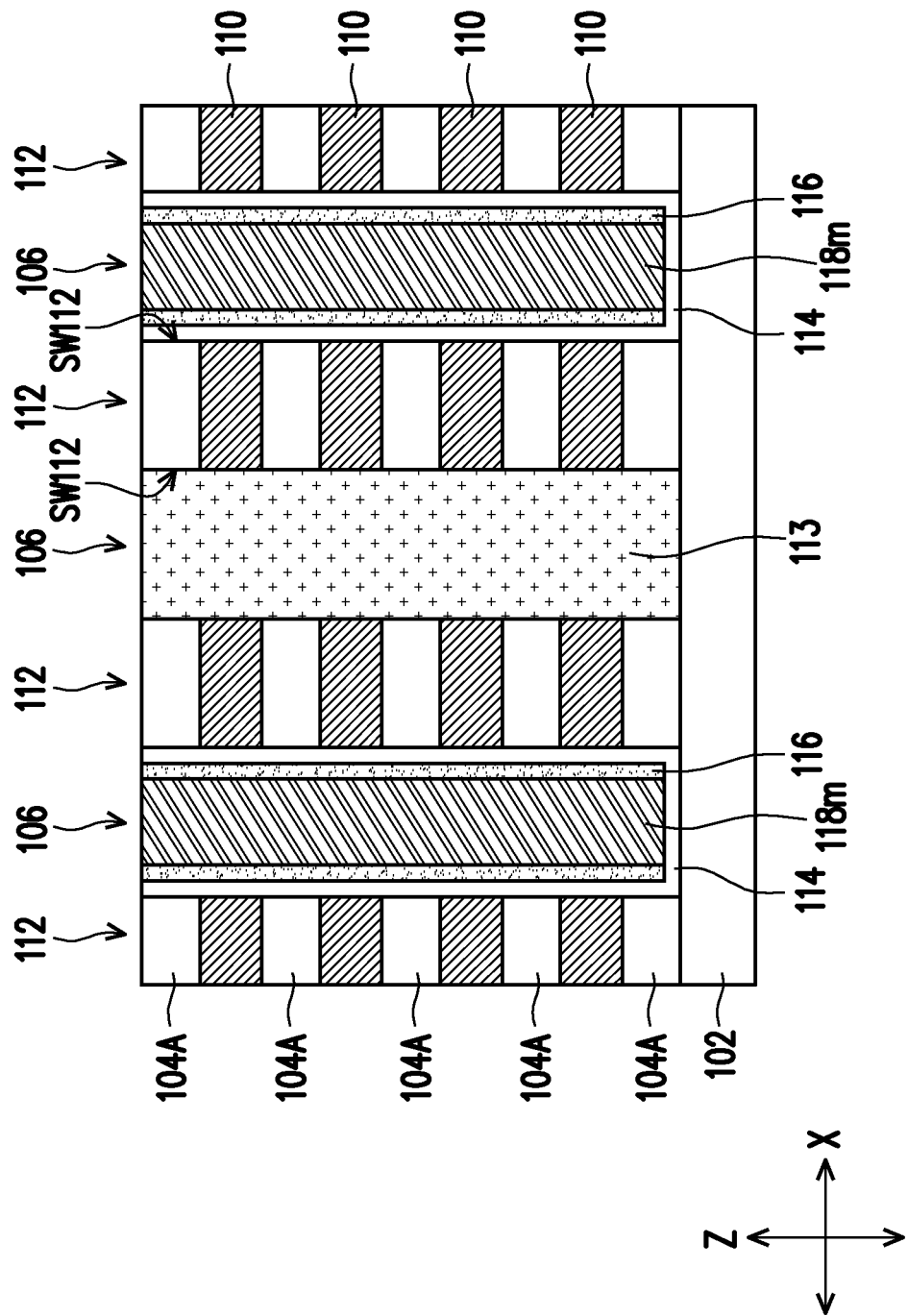
Figure 8C:
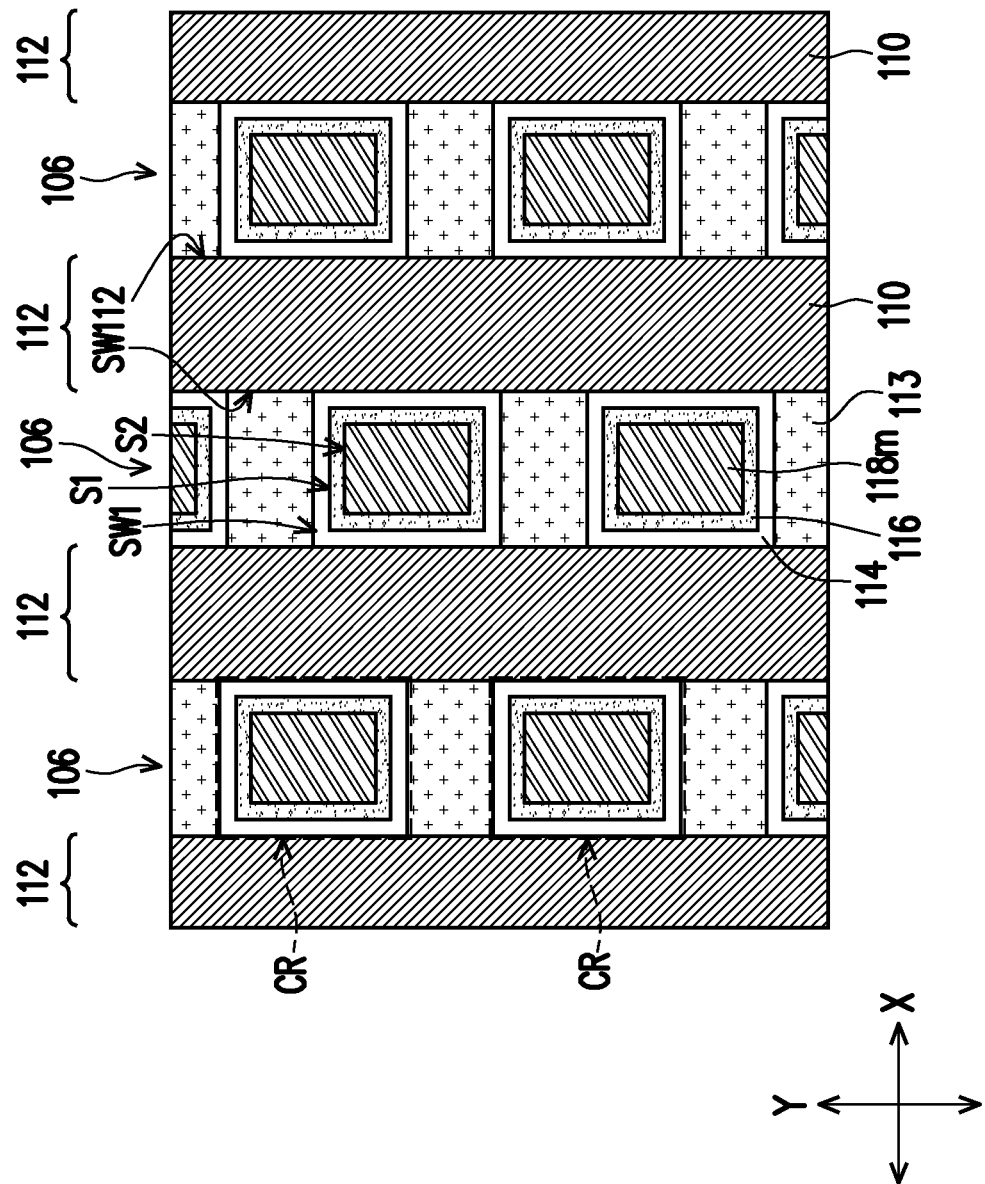

Dielectric layers 114 are respectively formed on the sidewalls SW1 of the cell regions CR, in accordance with step S112 of FIG. 2A. For example, the dielectric layers 114 are formed on the exposed top surface of the underlying structure 102 as well as the exposed sidewalls SW112 of the stacking structures 112, as shown in FIGS. 8A and 8B. In other words, the dielectric layers 114 may be respectively formed in one of the cell regions CR. As described above, the cell regions CR can be prevented from communicating with one another due to the dummy dielectric structures 113. Therefore, the dielectric layers 114 respectively formed in one of the cell regions CR can be separated from one another. Further, as shown in FIG. 8A and FIG. 8C, the dielectric layers 114 may respectively be formed as having an annular top view shape. For example, a top view (on a X-Y plane depicted in FIG. 8C) of each dielectric layer 114 may appear as a substantially rectangular annulus. In some embodiments, in a cross section as indicated in FIG. 8B along a direction Z, the dielectric layers 114 conformally cover the sidewalls SW112 of the stacking structures 112 and the top surface of the underlying structure 102 being exposed by the cell regions CR.

In some embodiments, the dielectric layers 114 are data storage layers (or films) formed of an acceptable ferroelectric material for storing digital values, such as hafnium zirconium oxide (HZO); zirconium oxide (ZrO); hafnium oxide (HfO) doped with lanthanum (La), silicon (Si), aluminum (Al), or the like; undoped hafnium oxide (HfO); or the like. Alternatively, the dielectric layers 114 may be charge trap layers (or films). The charge trap layers may include oxide-nitride-oxide (ONO) layers. In some embodiments, a method for forming the dielectric layers 114 includes globally forming a dielectric layer to conformally cover the structure as shown in FIG. 7A by a deposition process (e.g., CVD, ALD, physical vapor deposition (PVD), or the like) or an epitaxial process. Subsequently, portions of the dielectric layer above the illustrated top surfaces of the stacking structures 112 may be removed by, for example, a polishing process (e.g., a CMP process), an etching process or a combination thereof. The remained portions of the dielectric layer form the dielectric layers 114. In some embodiments, the dielectric layers 114 are individually referred to as memory layers (or films). On the other hands, the dielectric layers 114 may act as the gate dielectric layers of the transistors.

Semiconductor layers 116 are formed on the dielectric layers 114, in accordance with step S114 of FIG. 2A. The semiconductor layers 116 may be formed on inner surfaces S1 of the dielectric layers 114, respectively. As similar to the dielectric layers 114, the semiconductor layers 116 are respectively formed in one of the cell regions CR, and are ensured to be separated from one another. Also, the semiconductor layers 116 may respectively have an annular top view shape. For example, the top view of each semiconductor layer 116 may appear as a substantially rectangular annulus. In some embodiments, the semiconductor layers 116 conformally cover the sidewalls SW112 of the stacking structures 112, as shown in FIG. 8B. Furthermore, in some embodiments, the semiconductor layers 116 span on the sidewalls SW112 of the stacking structures 112, but may not laterally span on the top surfaces of the substrate 102 (as shown in FIG. 8A and FIG. 8B). In these embodiments, some portions of the dielectric layers 114 lying on the top surfaces of the underlying structure 102 may not be covered by the semiconductor layers 116. In addition, each semiconductor layer 116 can be regarded as being discontinuous at its bottommost region, and the subsequently formed conductive pillars (e.g., later-formed conductive pillars 118 to be described with reference to FIG. 9A-9C) in each cell region CR can be prevented from being electrically connected with each other through an underlying path, which may be barely controlled by a gate voltage applied to the conductive layers 110. In the disclosure, the semiconductor layers 116 may be referred to as channel layers/regions of the transistors.

In some embodiments, the semiconductor layers 116 are formed of an acceptable semiconductor material for functioning as the channel regions of the transistors. In some embodiments, the acceptable semiconductor material is a metal oxide material, such as an indium-based oxide material (e.g., indium gallium zinc oxide (IGZO), indium tin oxide (ITO), indium gallium zinc tin oxide (IGZTO), zinc oxide (ZnO)), polysilicon, amorphous silicon, or the like. In addition, in some embodiments, a method for forming the semiconductor layers 116 includes globally forming a semiconductor layer to conformally cover the dielectric layers 114, the underlying structure 102 and the stacking structures 112 by a deposition process (e.g., CVD, ALD or PVD). Subsequently, portions of the semiconductor layer above the top surfaces of the stacking structures 112 as well as portions of the semiconductor layer lying on the underlying structure 102 may be removed by, for example, etching. The remained portions of the semiconductor layer form the semiconductor layers 116. The etching may be any acceptable etch process, such as RIE, NBE, the like, or a combination thereof. The etching may be anisotropic.

Thereafter, conductive structures 118m are formed to fill up the cell regions CR, in accordance with step S116 of FIG. 2A. As shown in FIG. 8A through FIG. 8C, for example, the conductive structures 118m respectively stand in one of the cell regions CR, and are laterally surrounded by the semiconductor layers 116 and the dielectric layers 114. The conductive structures 118m may be continuously formed on inner surfaces S2 of the semiconductor layers 116, respectively. For example, the semiconductor layer 116 are respectively sandwiched between the dielectric layers and the conductive structures 118m. In those embodiments where the semiconductor layers 116 do not laterally span on the top surfaces of the underlying structure 102, the conductive structures 118m may stand on the bottommost portions of the dielectric layers 114. The conductive structures 118m are formed of a conductive material. Acceptable conductive materials include metals such as tungsten, cobalt, aluminum, nickel, copper, silver, gold, alloys thereof, or the like.

A method for forming the conductive structures 118m includes filling up the cell regions CR with the conductive material by a deposition process such as ALD or CVD, an acceptable plating technique such as electroplating or electroless plating, or the like. Subsequently, a planarization process may be performed to remove portions of the conductive material above the top surfaces of the stacking structures 112, and the planarization process may include a CMP process, an etching process (e.g. etch-back) or a combination thereof. The remained portions of the conductive material form the conductive structures 118m. In some embodiments, the conductive structures 118m are made of tungsten. Additional glue layers may be formed between the conductive structures 118m and the semiconductor layers 116; similar to the conductive layers 110, the use of glue layers depends on the conductive material of the conductive structures 118m.

Figure 9A:
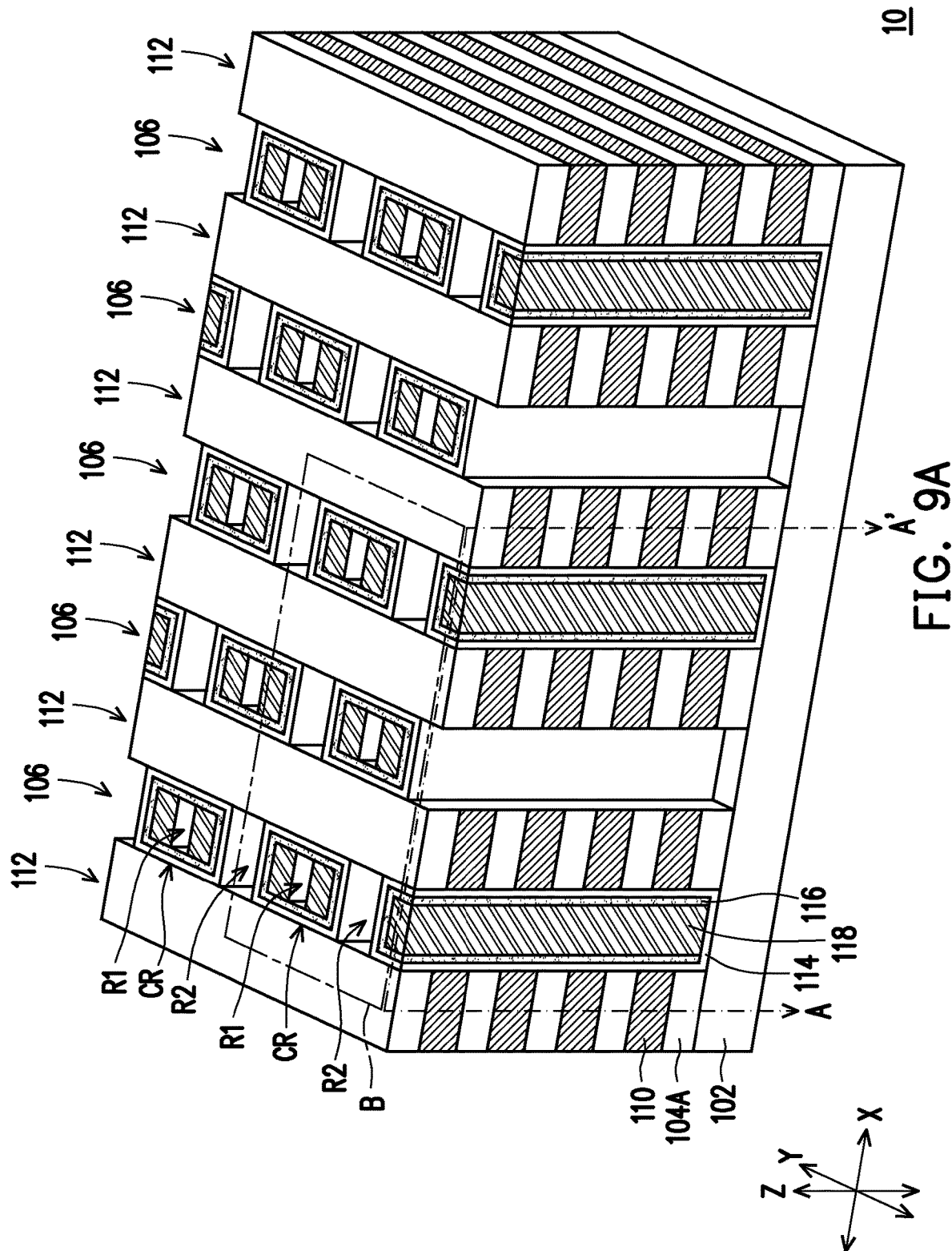
Figure 9B:
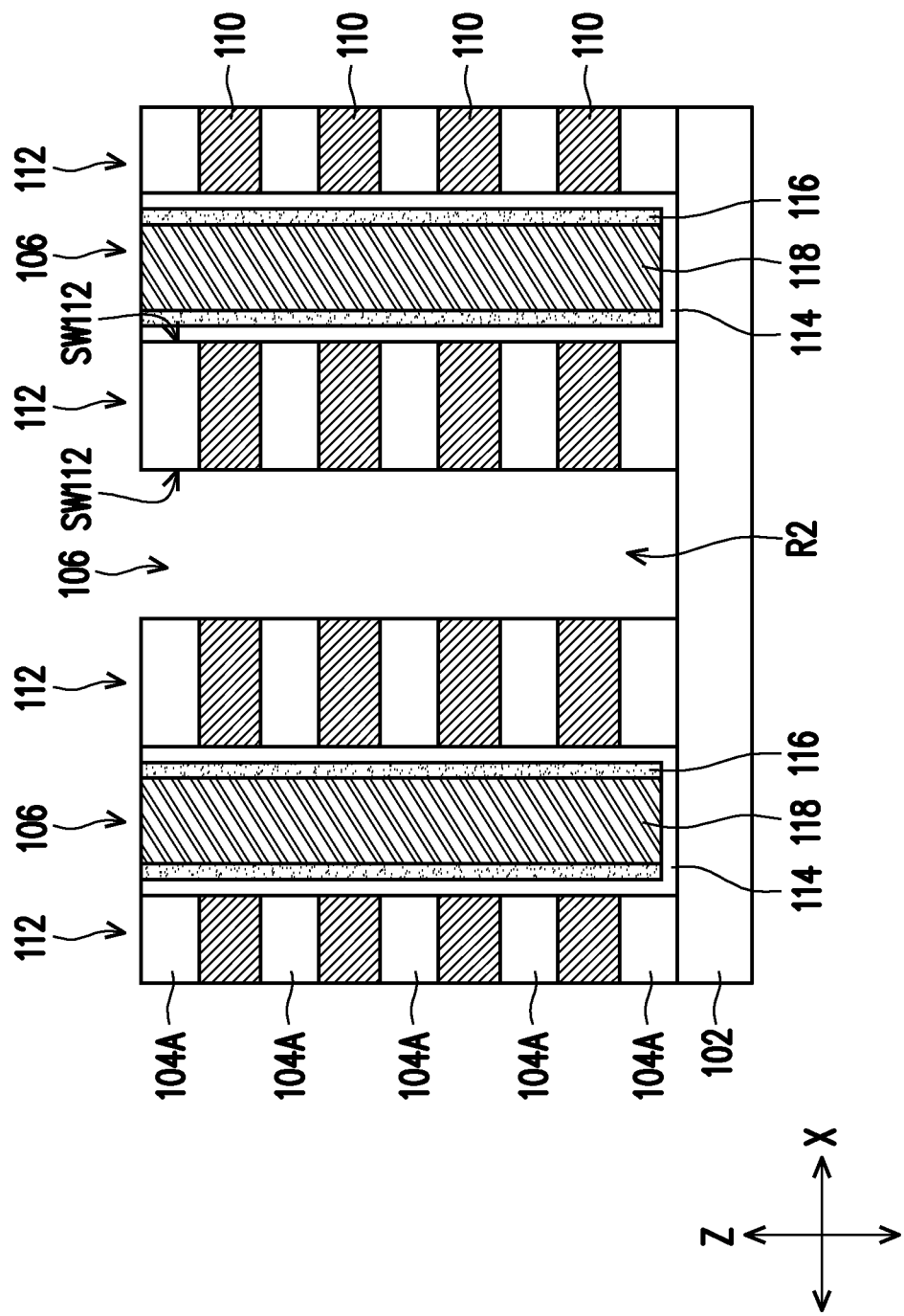
Figure 9C:
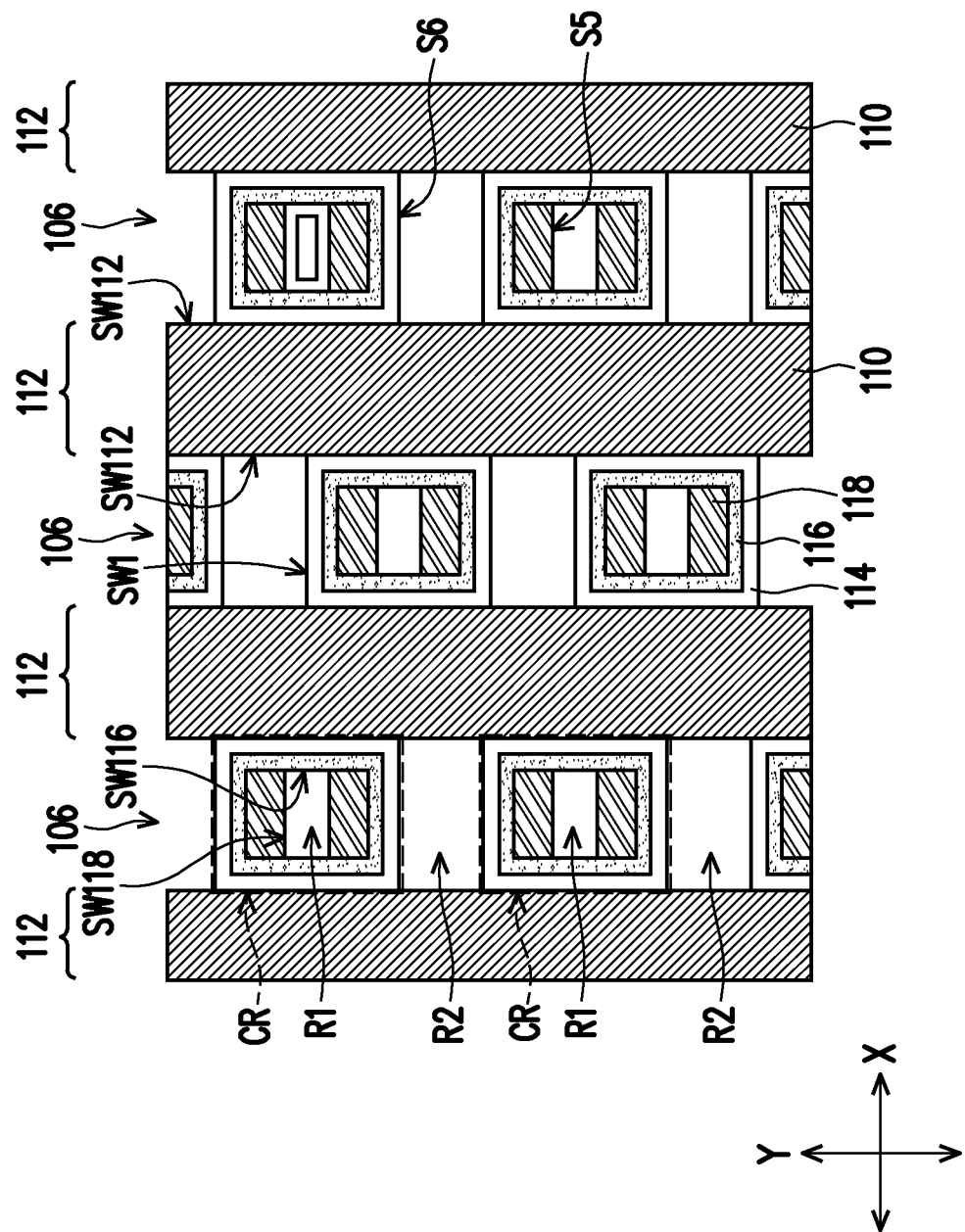

Referring to FIG. 9A through FIG. 9C, in some embodiments, portions of the conductive structures 118m are removed to form conductive pillars 118 within the cell regions CR, in accordance with step S118 of FIG. 2A. For example, the conductive structures 118m within the cell regions CR are partially removed to form a plurality of first recesses R1, where non-removed conductive structures 118m in each of the cell regions CR form a pair of the conductive pillars 118 separating from one another by one first recess R1. The first recesses R1 may penetrate through the conductive pillars 118 to partially expose top surfaces of the bottommost portions of the dielectric layers 114, sidewalls SW116 of the semiconductor layers 116 and sidewalls SW118 of the conductive pillars 118.

A method for forming the first recesses R1 may include, but not limited to, patterning the conductive structures 118m by using a photolithography process and an etching process to partially remove the conductive structure 118m to form multiple pairs of the conductive pillars 118. The etching may be any acceptable etch process, such as RIE, NBE, the like, or a combination thereof. The etching may be anisotropic. In the disclosure, the conductive pillars 118 may be referred to as source/drain regions of the transistors. The conductive pillars 118 may be conductive columns formed in pairs, with each semiconductor layer 116 contacting a corresponding pair of the conductive pillars 118 in each cell region CR. Up to here, the transistors formed in the trenches 106 of the three-dimensional memory device 10 are manufactured. Each transistor at least includes a pair of conductive pillars 118 (acting as the source/drain regions), a conductive layer 110 (acting as the gate), and the regions of the semiconductor layer 116 (acting as the channel region) and the dielectric layer 114 (acting as the gate dielectrics) intersecting the conductive layer 110 and between the pair of the conductive pillars 118.

In some embodiments, the remained dummy dielectric structures 113 are removed to form a plurality of second recesses separating the cell regions CR, in accordance with step S120 of FIG. 2A. For example, the remained dummy dielectric structures 113 each located between two adjacent cell regions CR are completely removed to form the second recesses R2, where the cell regions CR located in one trench 106 are physically separated from one another by a corresponding second recess R2. The second recesses R2 may extending through the trenches 106 in the direction Z to partially expose the top surface of the underlying structure 102 as well as sidewalls SW118 of the conductive pillars 118 and the sidewalls SW1 (e.g., outer surfaces of the dielectric layer 114 not in contact with the stacking structures 112) of the cell regions CR. A method for forming the second recesses R2 may include, but not limited to, removing the remained dummy dielectric structures 113 by using a photolithography process and an etching process to completely remove the remained dummy dielectric structures 113. The etching may be any acceptable etch process, such as RIE, NBE, the like, or a combination thereof. The etching may be anisotropic.

In one embodiment, the formation of the conductive pillars 118 is performed prior to the removal of the remained dummy dielectric structures 113, as described in the illustrated embodiments. However, the disclosure is not limited thereto; alternatively, the formation of the conductive pillars 118 is performed after the removal of the remained dummy dielectric structures 113.

Figure 10A:
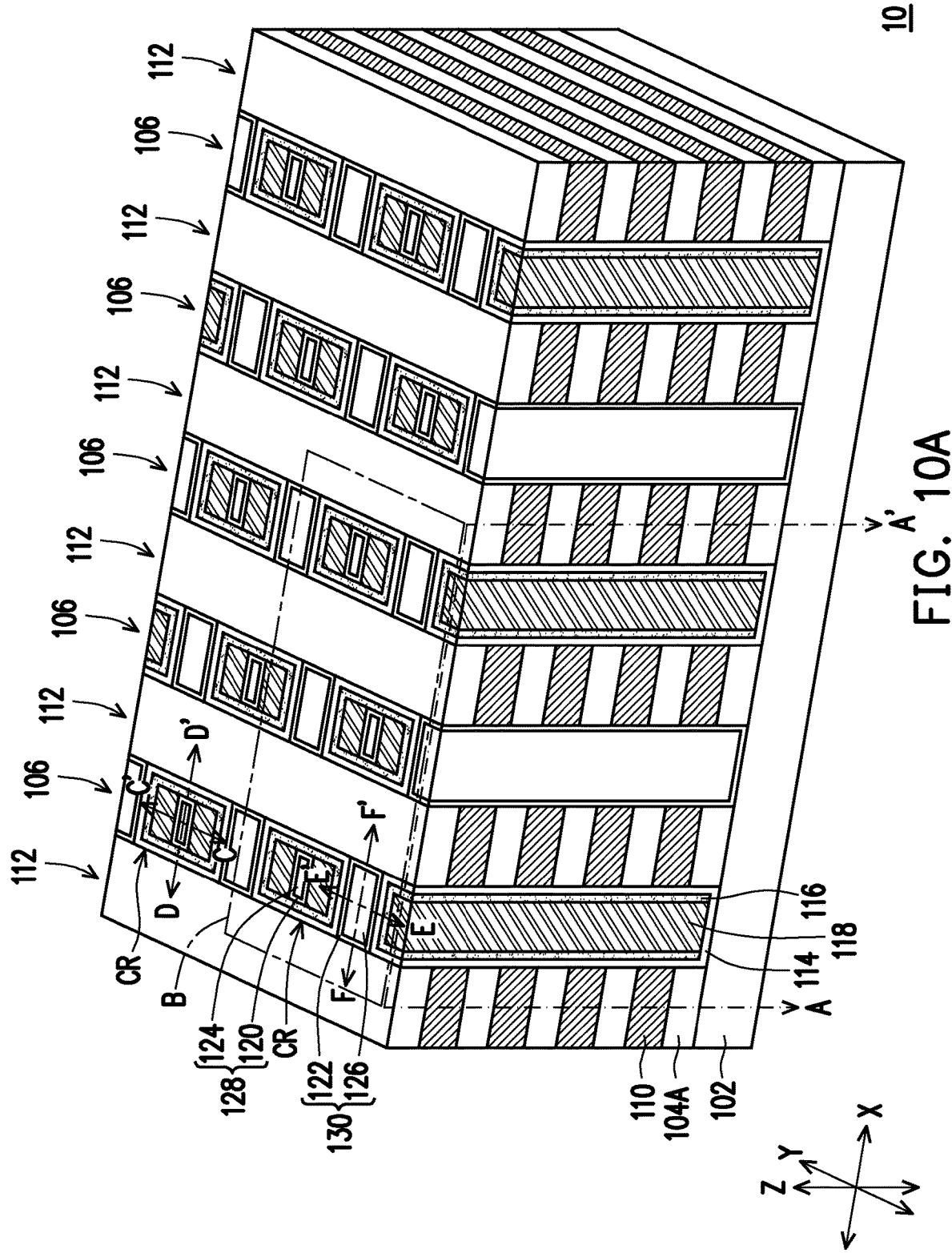
Figure 10B:
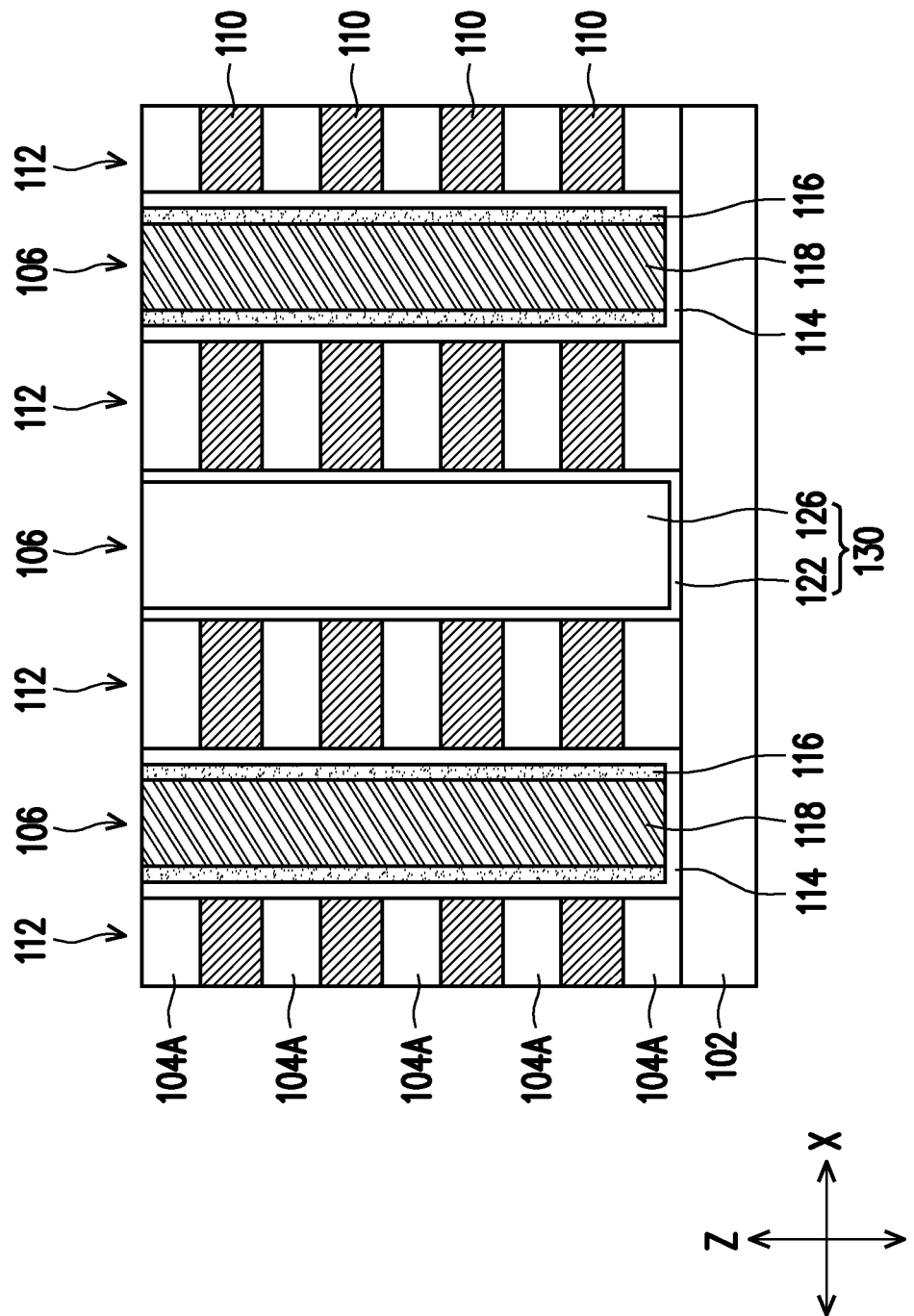
Figure 10C:
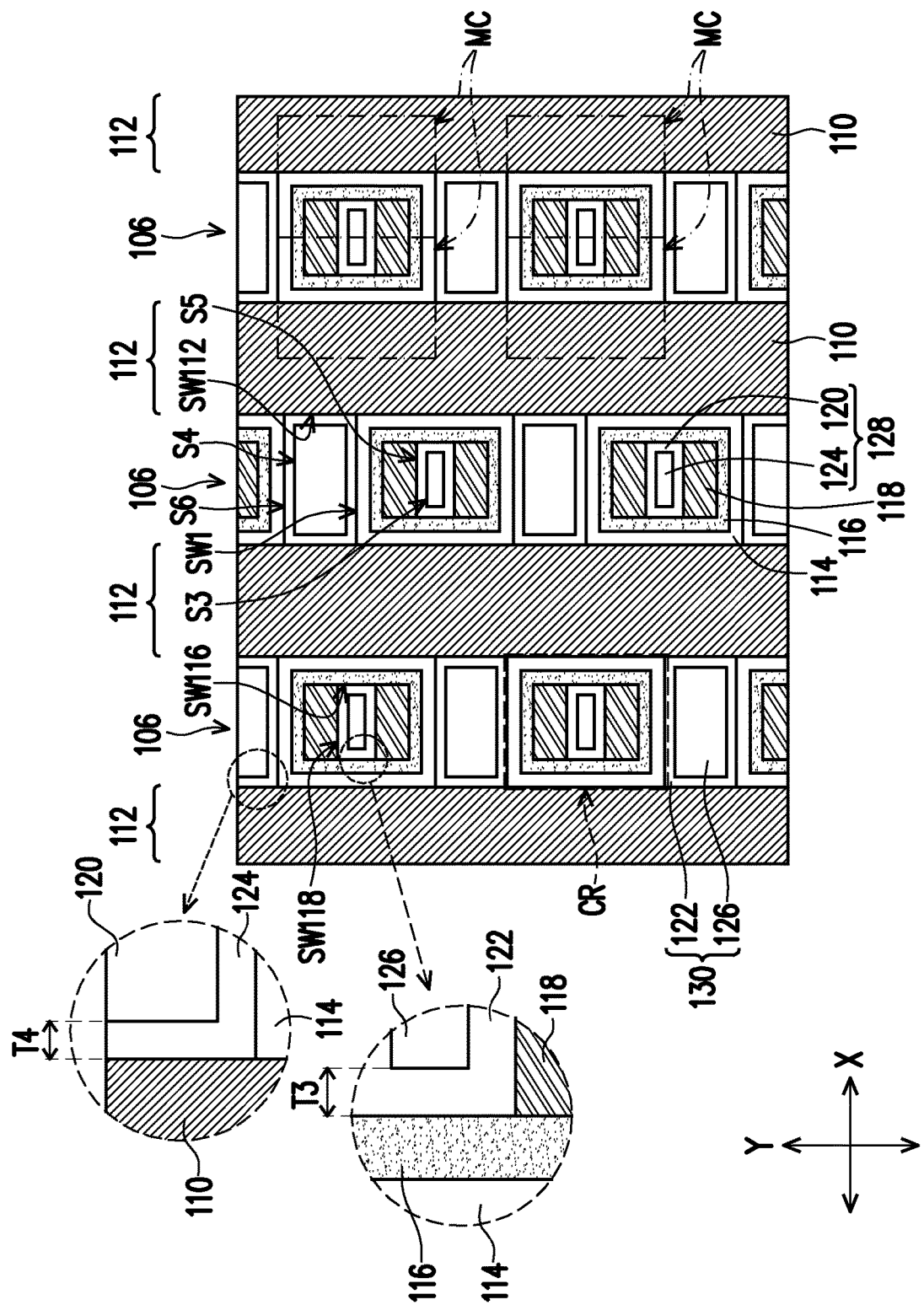

Referring to FIG. 10A through FIG. 10C, in some embodiments, isolation structures (e.g., 128, 130) are formed in the trenches 106, in accordance with step S122 of FIG. 2A. The isolation structures may include a plurality of first isolation structures 128 formed in the first recesses R1 within the cell regions CR and a plurality of second isolation structures 130 formed in the second recesses R2 between two adjacent cell regions CR, in each trench 106. The first isolation structures 128 each electrically isolate and physically separate the pair of the conductive pillars 118 from each other in each cell region CR. On the other hand, the second isolation structures 130 each electrically isolate and physically separate the laterally adjacent cell regions CR from each other. Owing to the first isolation structures 128 and the second isolation structures 130, the cross-talking among the neighboring transistors located vertically and horizontally are greatly suppressed, thereby the reliability of electrical performance of the transistors is ensured. In some embodiments, the first isolation structures 128 each include a first liner 120 and a first main layer 124. Similar to the first isolation structures 128, for example, the second isolation structures 130 each include a second liner 122 and a second main layer 126. The details of the first isolation structures 128 and the second isolation structures 130 will be discussed in greater detail in conjunction with FIG. 11A and FIG. 11D in addition to FIG. 2B, FIGS. 10A and FIB. 10C.

The first liners 120 may be respectively formed on sidewalls S5 of the first recesses R1, in accordance with step S122a of FIG. 2B. For example, as shown in FIG. 11A and FIG. 11B, the first liners 120 are conformally formed in the first recesses R1 to cover (e.g., in contact with) the sidewalls SW118 of the conductive pillars 118 and the sidewalls SW116 of the semiconductor layers 116 and further extend over the top surfaces of the bottommost portions of the dielectric layers 114. In other words, the first liners 120 completely cover (e.g., in contact with) the bottommost portions of the dielectric layers 114 exposed by the semiconductor layers 116 and the conductive pillars 118. Further, as shown in FIG. 10A and FIG. 10C, the first liners 120 may respectively be formed as having an annular top view shape. A top view (on the X-Y plane depicted in FIG. 10C) of each first liner 120 may appear as a substantially rectangular annulus. In some embodiments, a thickness T3 of the first liners 120 is approximately ranging from 2 nm to 5 nm. The thickness T3 of the first liners 120 may be about 10 nm or less.

On the other hand, first liners 120 may be respectively formed on sidewalls S6 of the second recesses R2, in accordance with step S122b of FIG. 2B. For example, as shown in FIG. 11C and FIG. 11D, the second liners 122 is conformally formed in the second recesses R2 to cover (e.g., in contact with) the sidewalls SW1 of the cell regions CR and the sidewalls SW112 of the stacking structures 112 and further extend over the top surfaces of the underlying structure 102. In other words, the second liners 122 completely cover (e.g., in contact with) the top surfaces of the underlying structure 102 exposed by the cell regions CR and the stacking structures 112. Further, as shown in FIG. 10A and FIG. 10C, the second liners 122 may respectively be formed as having an annular top view shape. A top view (on the X-Y plane depicted in FIG. 10C) of each second liner 122 may appear as a substantially rectangular annulus. In some embodiments, in a cross section as indicated in FIG. 10B along the direction Z, the second liners 122 conformally cover the sidewalls SW112 of the stacking structures 112 and the top surface of the underlying structure 102 being exposed by the cell regions CR. In some embodiments, a thickness T4 of the second liners 122 is approximately ranging from 2 nm to 5 nm. The thickness T4 of the second liners 122 may be about 10 nm or less.

In some embodiments, the first liners 120 and the second liners 122 each are formed of an acceptable dielectric material. The acceptable dielectric material may include oxides such as silicon oxide; nitrides such as silicon nitride; carbides such as silicon carbide; the like; or combinations thereof such as silicon oxynitride, silicon oxycarbide, silicon carbonitride, or the like. In some embodiments, a method for forming the first and second liners 120, 122 includes globally forming a dielectric layer to conformally cover the structure as shown in FIG. 9A by ALD. Subsequently, portions of the dielectric layer above the illustrated top surfaces of the stacking structures 112 may be removed by, for example, a polishing process (e.g., a CMP process), an etching process or a combination thereof. The remained portions of the dielectric layer form the first and second liners 120, 122. That is, in some embodiments, the first and second liners 120, 122 are simultaneously formed in the same step. However, the disclosure is not limited thereto; alternatively, the first liners 120 may be formed prior to forming the second liners 122. Or, the first liners 120 may be formed after forming the second liners 122. In other words, the material of the first liners 120 may be the same as the material of the second liners 120. Alternatively, the material of the first liners 120 may be different from the material of the second liners 120.

The first main layers 124 may be formed to fill up the first recesses R1, thereby forming the first isolation structures 128 in the first recesses R1, in accordance with step S122c of FIG. 2B. The sidewalls S5 of the first recesses R1 may also referred to as sidewalls of the first isolation structures 128. For example, the first main layers 124 are continuously formed on inner surfaces S3 of the first liners 120 in the first recesses R1 to cover (e.g., in contact with) the inner surfaces S3 of the first liners 120 and further extend over bottommost portions of the first liners 120 stacked on the bottommost portions of the dielectric layer 114. In other words, the first main layers 124 completely cover (e.g., in contact with) the bottommost portions of the first liners 120 inside the cell regions CR. Further, as shown in the top view of FIG. 10C, the first main layers 124 may be in contact with and enclosed by the first liners 120, respectively. In some embodiments, the first liners 120 are sandwiched between the first main layer 124 and the conductive pillars 118 (e.g. along the direction Y) and between the first main layer 124 and the semiconductor layers 116 (e.g. along the direction X), as shown in FIG. 11A and FIG. 11B. For example, in the cross-sections of FIG. 11A and FIG. 11B, the first liners 120 each conformally cover sidewalls and a bottom surface of the first main layers 124, respectively. The first liners 120 may have a bowl-shape or a U-shape in the cross section to surround the first main layers 124. In some embodiments, the first isolation structures 128 each are referred to as dielectric plugs disposed between the conductive pillars 118 in the cell regions CR. In other words, each first isolation structure 128 is disposed between the source/drain regions (e.g., a corresponding pair of conductive pillars 118) of one transistor. That is, for one cell region/transistor, the conductive pillars 118 being paired are disposed at opposing sides of a corresponding first isolation structure 128. Thus, each first isolation structure 128 physically and electrically separates adjacent conductive pillars 118 in one transistor.

In some embodiments, the first main layers 124 are formed of an acceptable first dielectric material. The acceptable first dielectric material may include oxides such as silicon oxide; nitrides such as silicon nitride; carbides such as silicon carbide; the like; or combinations thereof such as silicon oxynitride, silicon oxycarbide, silicon carbonitride, or the like. Alternatively, the acceptable first dielectric material may include a low-K (LK) dielectric material with a dielectric constant lower than 3.9 or an extreme low-k (ELK) dielectric material with a dielectric constant lower than 2.6. The first dielectric material may be formed to fill up the first recesses R1 so as to form the first main layer 124 by CVD (such as PECVD, FCVD), spin coating or the like, thereby forming the first isolation structures 128 in the cell regions CR. Due to the first liners 120 are formed by ALD, a structure of the first liners 120 is finer (e.g., less void and/or smaller void size) than a structure of the first main layer 124, and an interface may present at a location where the first liners 120 and the first main layer 124 being joined together. In some embodiments, an etching rate of the first liners 120 to the first main layers 124 is approximately 1:5. Owing to the first liners 120, a metal filling leakage path formation between the conductors (e.g. the conductive pillars 118) in each cell regions CR or in each transistor can be prevented or greatly suppressed, and thereby improving the performance of the three-dimensional memory device 10.

Similar to the first main layers 124, the second main layers 126 may be formed to fill up the second recesses R2, thereby forming the second isolation structures 130 in the first recesses R2, in accordance with step S122d of FIG. 2B. The sidewalls S6 of the second recesses R2 may also referred to as sidewalls of the second isolation structures 130. For example, the second main layers 126 are continuously formed on inner surfaces S4 of the second liners 122 in the second recesses R2 to cover (e.g., in contact with) the inner surfaces S4 of the second liners 122 and further extend over bottommost portions of the second liners 122 stacked on the top surface of the underlying structure 102. In other words, the second main layers 126 completely cover (e.g., in contact with) the bottommost portions of the second liners 122 inside the cell regions CR as shown in FIG. 10B. Further, as shown in the top view of FIG. 10C, the second main layers 126 may be in contact with and enclosed by the second liners 122, respectively. For example, the second liners 122 are sandwiched between the second main layer 126 and the cell regions CR (e.g. along the direction Y) and between the second main layer 126 and the conductive layers 110 (e.g. along the direction X), as shown in FIG. 11C and FIG. 11D. For example, in the cross-sections of FIG. 11C and FIG. 11D, the second liners 122 each conformally cover sidewalls and a bottom surface of the second main layers 126, respectively. The second liners 122 may have a bowl-shape or a U-shape in the cross section to surround the second main layers 126. In some embodiments, the second isolation structures 130 each are referred to as dielectric plugs disposed between a conductive pillar 118 of one cell region CR and a conductive pillar 118 of another cell region CR. In other words, each second isolation structure 130 is disposed between one of the source/drain regions of one transistor and one of the source/drain regions of another transistor. In other words, the conductive pillars 118 being paired in one cell region CR/transistor and the conductive pillars 118 being paired in another cell region CR/transistor are disposed at opposing sides of a corresponding second isolation structure 130. Thus, each second isolation structure 130 physically and electrically separates adjacent cell regions CR/transistor.

In some embodiments, the second main layers 126 are formed of an acceptable second dielectric material. The acceptable second dielectric material may include oxides such as silicon oxide; nitrides such as silicon nitride; carbides such as silicon carbide; the like; or combinations thereof such as silicon oxynitride, silicon oxycarbide, silicon carbonitride, or the like. Alternatively, the acceptable second dielectric material may include a low-K (LK) dielectric material with a dielectric constant lower than 3.9 or an extreme low-k (ELK) dielectric material with a dielectric constant lower than 2.6. The second dielectric material may be formed to fill up the second recesses R2 so as to form the second main layer 126 by CVD (such as PECVD, FCVD), spin coating or the like, thereby forming the second isolation structures 130 outside the cell regions CR. The second dielectric material may be the same as the first dielectric material. Alternatively, the second dielectric material may be the different from the first dielectric material. Due to the second liners 122 are formed by ALD, a structure of the second liners 122 is finer (e.g., less void and/or smaller void size) than a structure of the second main layer 126, and an interface may present at a location where the second liners 122 and the second main layer 126 being joined together. In some embodiments, an etching rate of the second liners 122 to the second main layers 126 is approximately 1:5. Owing to the second liners 122, a metal filling leakage path formation between the conductors (e.g. the conductive layer 110) among the neighboring cell regions CR or among the neighboring transistors can be prevented or greatly suppressed, and thereby improving the performance of the three-dimensional memory device 10.

The first and second main layers 124 and 126 may be simultaneously formed in the same step. In some embodiments, a method for forming the first and second main layers 124 and 126 includes forming a dielectric layer in a blanket manner to cover up the structure as shown in FIG. 9A by CVD such as PECVD or FCVD. Subsequently, portions of the dielectric layer above the illustrated top surfaces of the stacking structures 112 may be removed by, for example, a polishing process (e.g., a CMP process), an etching process or a combination thereof. The remained portions of the dielectric layer form the first and second main layers 126 and 128. In such embodiments, the materials of the first and second main layers 124 and 126 are the same. However, the disclosure is not limited thereto; alternatively, the first main layers 124 may be formed prior to forming the second main layers 126. Or, the first main layers 124 may be formed after forming the second main layers 126. In other words, the material of the first and second main layers 124 and 126 may be the same or different. Up to here, the three-dimensional memory device 10 is manufactured.

In some embodiments, a total volume of the first and second liners 120, 122 is A1, a total volume of one trench 106 (e.g. between two adjacent stacking structures 112) is B1, and a ratio of A1 to B1 is 10% or more. In some embodiments, a volume of the first liners 120 is A2, a total volume of one cell region CR is B2, and a ratio of A2 to B2 is approximately ranging from 10% to 25%. In the disclosure, the first and second liners 120, 122 of the first and second isolation structures 128, 130 act as the shielding layers for preventing metal filling leakage paths formation inside a single one cell region CR or among neighboring cell regions CR between the conductors (e.g. the adjacent conductive pillars 118 depicted in FIG. 11A and the adjacent conductive layers 110 depicted in FIG. 11D) to improve the device performance of the three-dimensional memory device 10.

As shown in the three-dimensional memory device 10 of FIG. 10C, for example, a portion of the conductive layer 110 in each stacking structure 112 and closest portions of the dielectric layer 114, the semiconductor layer 116 and the conductive pillars 118 in a cell region CR laterally adjacent to this portion of the conductive layer 110 constitute the transistor, e.g. a field effect transistor (FET), which is functioned as a memory cell MC included in the three-dimensional memory device 10. In those embodiments where the dielectric layers 114 are formed of a ferroelectric material, dipole moments in opposite directions can be stored in the dielectric layer 114. Accordingly, the FET has different threshold voltages in corresponding to the dipole moments, thus the FET can be identified as having different logic states. In these embodiments, the memory cell MC is a ferroelectric FET. On the other hand, in those embodiments where the dielectric layer 114 is a charge trap layer, charges may be stored in the dielectric layer 114, thus the FET may have different threshold voltages depending on the amount of charge stored in the dielectric layer 114. Accordingly, the FET can be identified as having different logic states as well. In these embodiments, the memory cell MC may be referred as a charge trap flash (CTF) transistor.

The three-dimensional memory device 10 may include multiple memory cells MC arranged in a form of array laterally and vertically. For example, the conductive layers 110 stacked along a vertical direction (e.g., the direction Z) in each stacking structure 112 as well as portions of the dielectric layer 114, the semiconductor layer 116 and the pair of conductive pillars 118 in a cell region CR aside these conductive layers 110 form a stack of memory cells MC. In addition, multiple stacks of the memory cells MC may be arranged along an extending direction (e.g., the direction Y, may be referred as to a trench direction) of the trenches 106, where the trenches 106 are arranged side-by-side (e.g., in parallel) along a lateral direction (e.g., the direction X). The lateral direction (e.g., X), the trench direction (e.g., Y) and the vertical direction (e.g., Z) may be different from one another. For example, the direction X and the direction Y are substantially perpendicular to the direction Z, and the direction X is substantially perpendicular to the direction Y. In some embodiments, the dielectric layer 114, the semiconductor layer 116 and a pair of conductive pillars 118 in the same cell region CR are shared by adjacent stacks of memory cells MC including the conductive layers 110 at opposite sides of this cell region CR, and conductive channels of these memory cells MC are formed in different sections of the semiconductor layer 116. In the embodiments of which the three-dimensional memory device 10 manufactured by the method of FIG. 2A and FIG. 2B, at least three sides of each of the conductive pillars 118 are covered by a respective one of the semiconductor layers 116 and a respective one of the dielectric layers 114, and at least three sides of each of the semiconductor layers 116 are covered by a respective one of the dielectric layers 114.

Figure 12:
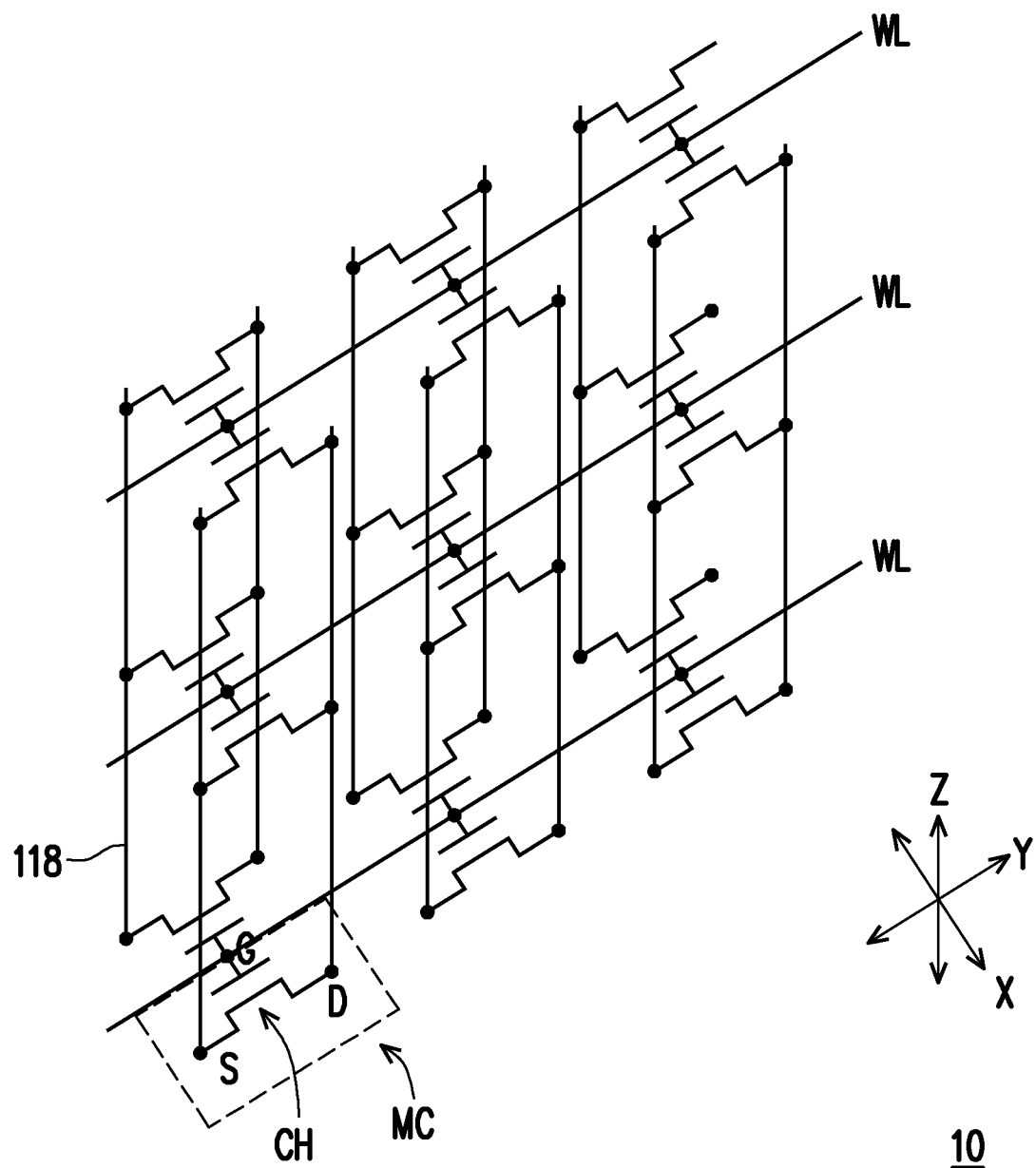
FIG. 12 is an equivalent circuit diagram of a portion of a three-dimensional memory device in accordance with some embodiments of the disclosure.

FIG. 12 is an equivalent circuit diagram of a portion of a three-dimensional memory device 10 shown in FIG. 10A.

Referring to FIG. 10A and FIG. 12, the conductive layers 110 in each stacking structure 112 shown in FIG. 10A may be functioned as word lines WL as shown in FIG. 12. The word lines WL are arranged along the vertical direction (e.g., the direction Z). Each word line WL connects gate terminals G of two laterally adjacent columns of the memory cells MC (e.g., on the X-Y plane). In addition, each pair of conductive pillars 118 in one of the cell regions CR shown in FIG. 10A separately connect to source and drain terminals S, D of the memory cells MC stacked along the vertical direction (e.g., the direction Z) as shown in FIG. 12. As shown in FIG. 12, the gate terminals G of each stack of the memory cells MC are respectively connected to one of the word lines WL. In addition, the source terminals S of each stack of the memory cells MC are connected together by one of the conductive pillars 118, and the drain terminals D of each stack of the memory cells MC are connected together by another one of the conductive pillars 118. In other words, channels CH between the source and drain terminals S, D of each stack of the memory cells MC are connected in parallel. Accordingly, each stack of the memory cells MC may be regarded as being connected by a NOR-flash configuration, and the three-dimensional memory device 10 may be referred as a three-dimensional NOR memory device.

Figure 13:
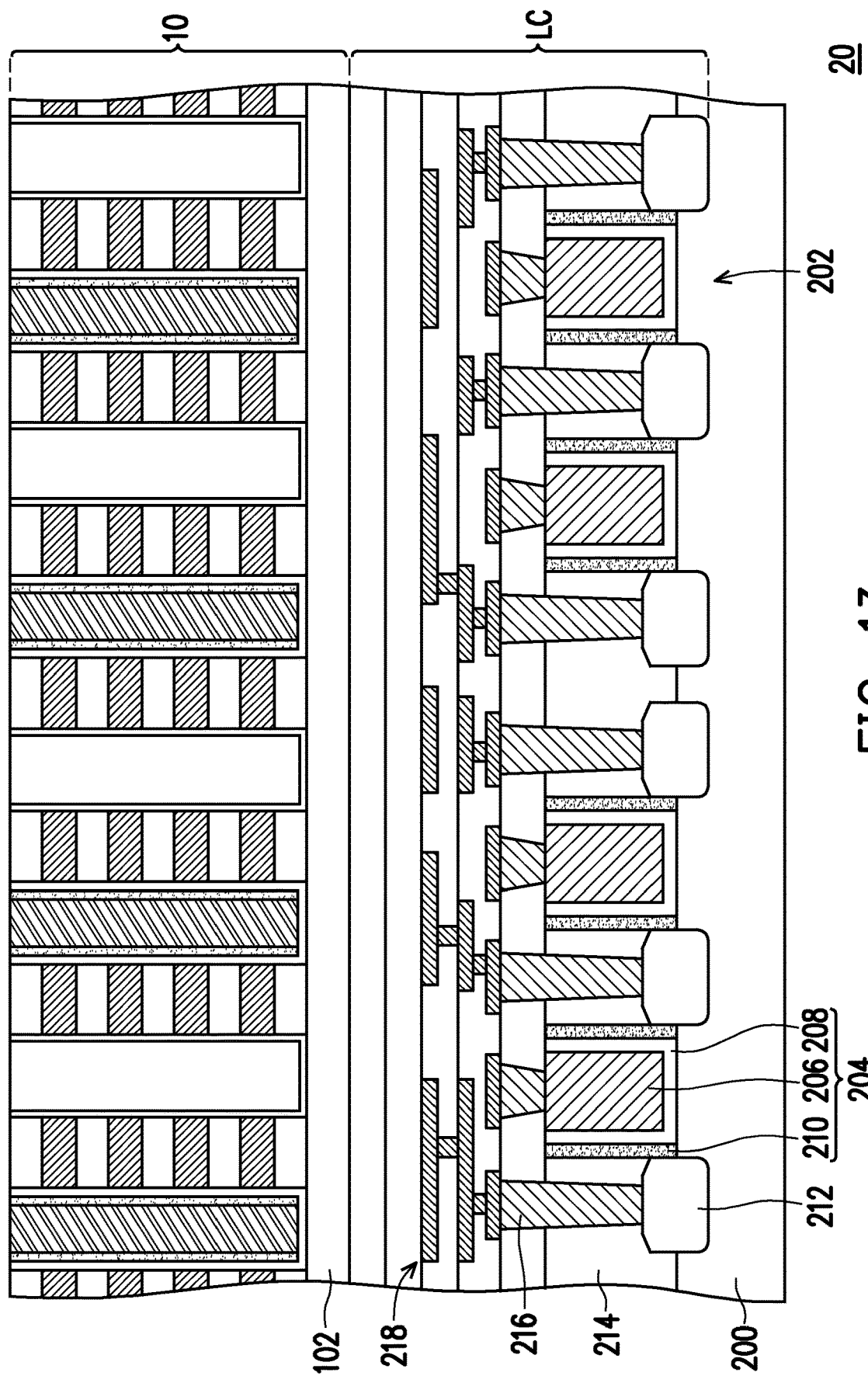
FIG. 13 is a schematic cross-sectional view illustrating a semiconductor structure in accordance with some embodiments of the disclosure.

FIG. 13 is a schematic cross-sectional view illustrating a semiconductor structure 20 in accordance with some embodiments of the disclosure.

Referring to FIGS. 10A-10C and FIG. 13, the semiconductor structure 20 shown in FIG. 13 includes the three-dimensional memory device 10 as described with reference to FIGS. 10A-10C. In those embodiments where the underlying structure 102 of the three-dimensional memory device 10 is an etching stop layer, a CMOS integrated circuit LC may lie under the underlying structure 102, and the CMOS integrated circuit LC may also be referred as a CMOS-under-array (CUA). Although not shown, the conductive layers 110 and the conductive pillars 118 may be routed to the CMOS integrated circuit LC, and the three-dimensional memory device 10 may be controlled by the CMOS integrated circuit LC. The details of electrical connections between the CMOS integrated circuit LC and the conductive layers 110 and between the CMOS integrated circuit LC and the conductive pillars 118 will be discussed later in greater detail in conjunction with FIG. 14A through FIG. 14B and FIG. 15A through FIG. 15B. In some embodiments, the three-dimensional memory device 10 as described with reference to FIGS. 10A-10C is embedded in a BEOL structure of the semiconductor structure 20 shown in FIG. 13, and the CMOS integrated circuit LC is formed on a front-end-of-line (FEOL) structure of the semiconductor structure 20 shown in FIG. 13.

In some embodiments, the CMOS integrated circuit LC is built on a semiconductor substrate 200. The semiconductor substrate 200 may be a semiconductor wafer or a semiconductor-on-insulator (SOI) wafer. The CMOS integrated circuit LC may include active devices formed on a surface region of the semiconductor substrate 200. In some embodiments, the active devices include metal-oxide-semiconductor (MOS) transistors 202. The MOS transistors 202 may respectively include a gate structure 204 formed over the semiconductor substrate 200. In some embodiments, the gate structure 204 includes a gate electrode 206, a gate dielectric layer 208 and a gate spacer 210. The gate dielectric layer 208 may spread between the gate electrode 206 and the semiconductor substrate 200, and may or may not further cover a sidewall of the gate electrode 206. The gate spacer 210 may laterally surround the gate electrode 206 and the gate dielectric layer 208. Further, the MOS transistor 202 may further include source/drain regions 212. The source/drain regions 212 may be formed in the semiconductor substrate 200, and are located at opposite sides of the gate structure 204. In some embodiments, the source/drain regions 212 may be epitaxial structures, and may protrude from a surface of the semiconductor substrate 200. It should be noted that, although the MOS transistors 202 are depicted as planar-type MOS transistors that forms conductive channels (not shown) along the surface of the semiconductor substrate 200, the MOS transistors 202 may alternatively be fin-type MOS transistors (or referred as finFET), gate-all-around (GAA) FETs or the like.

In some embodiments, the CMOS integrated circuit LC further includes dielectric layers 214 stacked on the semiconductor substrate 200, and includes contact plugs 216 and interconnections 218 formed in the stack of dielectric layers 214. A bottommost dielectric layer 214 may laterally surround the gate structures 204, and cover the source/drain regions 212. Some of the contact plugs 216 may penetrate through bottommost ones of the dielectric layers 214, in order to establish electrical connection with the source/drain regions 212, while others of the contact plugs 216 may stand on the gate structures 204 and electrically connect to the gate electrodes 206 of the gate structures 204. The interconnections 218 may spread on the contact plugs 216, and are electrically connected to the contact plugs 216. The interconnections 218 may include conductive traces and conductive vias. The conductive traces respectively lie on one of the dielectric layers 214, whereas the conductive vias respectively penetrate through one or more of the dielectric layers 214 and electrically connect to one or more of the conductive traces.

In some embodiments, the three-dimensional memory device 10 is disposed on the stack of dielectric layers 214. In these embodiments, the conductive layers 110 and the conductive pillars 118 of the three-dimensional memory device 10 may be routed to the interconnections 218 in the stack of dielectric layers 214 by conductive paths (not shown) extending through the underlying structure 102 and topmost ones of the dielectric layers 214. For example, the conductive layers 110 (e.g., word lines having end portions with a staircase configuration being exposed from the stacking structures 112) may be routed to word line drivers formed by some of the active devices interconnected by a portion of the interconnections 218, and the conductive pillars 118 (e.g., bit line and/or source line) may be routed to sense amplifiers formed by others of the active devices interconnected by another portion of the interconnections 218.

Figure 14A:
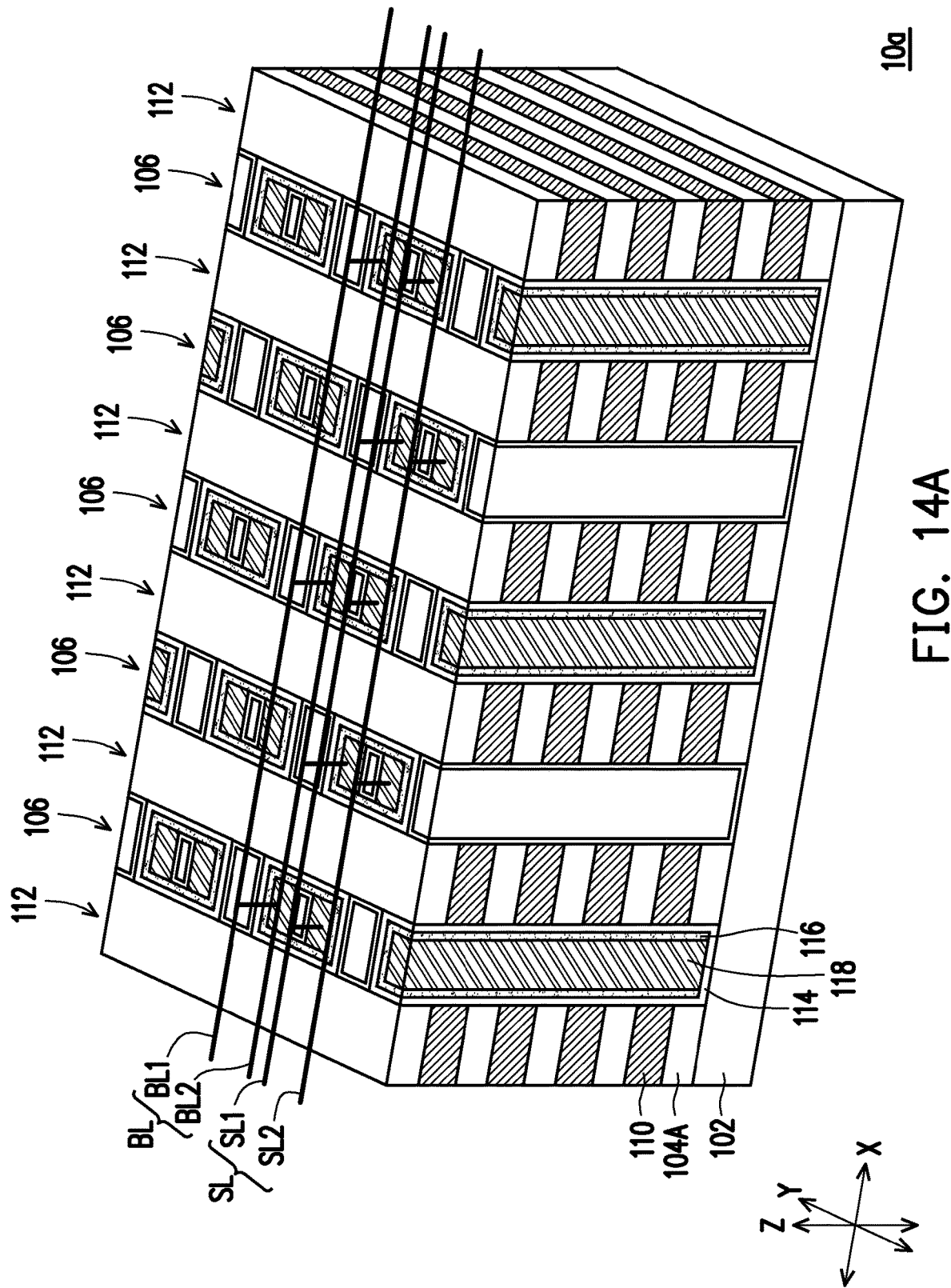
FIG. 14A and FIG. 14B are schematic various views of a three-dimensional memory device in accordance with some embodiments of the disclosure.
Figure 14B:
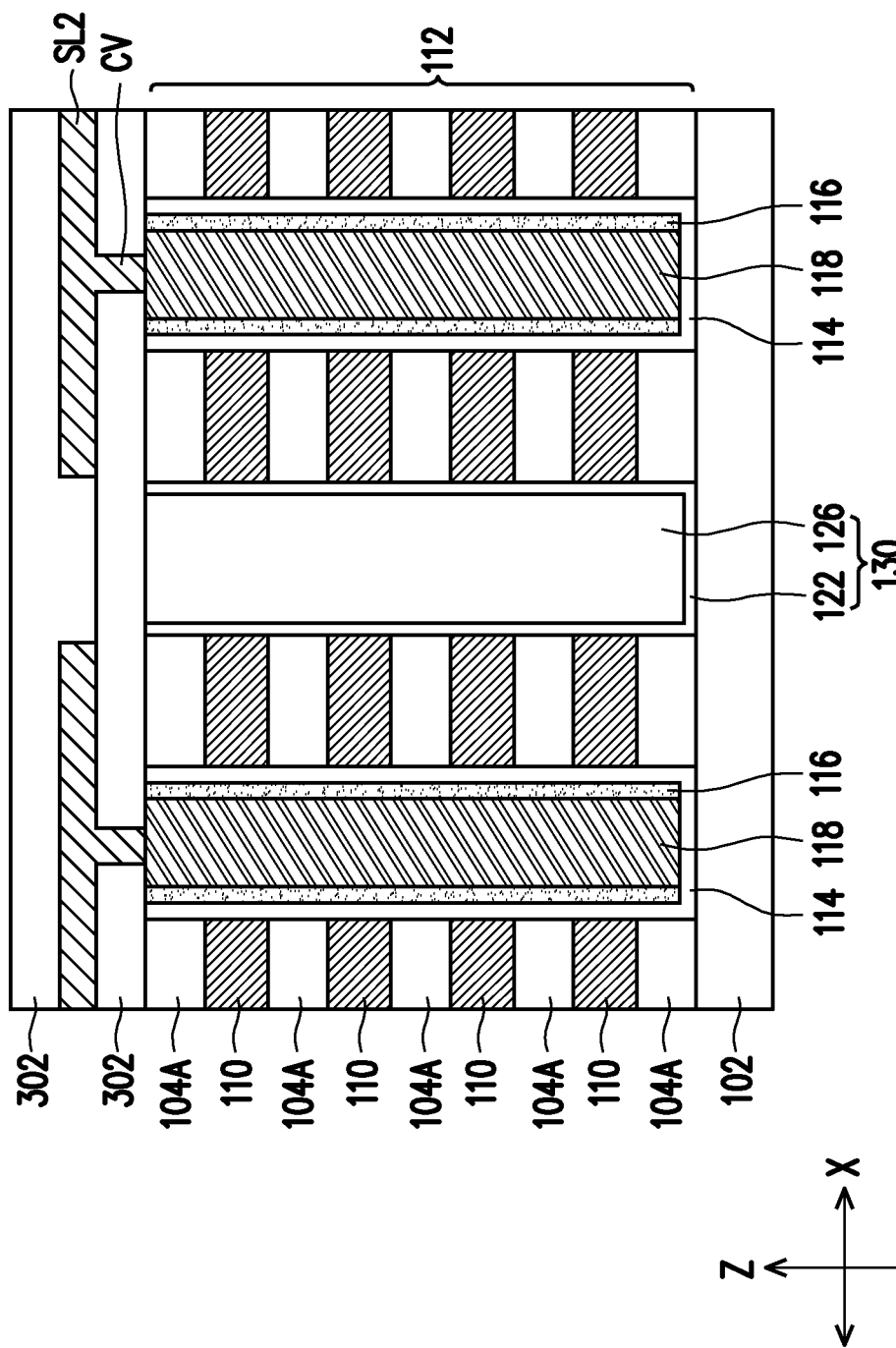

FIG. 14A is a schematic three-dimensional view illustrating a three-dimensional memory device 10a in accordance with some embodiments of the disclosure. FIG. 14B is a schematic cross-sectional view of a portion of the three-dimensional memory device 10a along an extending direction of the source line SL2 shown in FIG. 14A. The three-dimensional memory device 10a shown in FIG. 14A and FIG. 14B is similar to the three-dimensional memory device 10 as described with reference to FIGS. 10A-10C. Only differences therebetween will be described, the same or the like part would not be repeated again. In addition, a dielectric layer 302 to be described with reference to FIG. 14B are omitted in FIG. 14A.

Referring to FIG. 14A, in some embodiments, the three-dimensional memory device 10a further includes bit lines BL and source lines SL. The bit lines BL and the source lines SL are electrically connected to the conductive pillars 118 through, for example, conductive vias CV. The conductive pillars 118 in each one of the cell regions CR are connected to one of the bit lines BL and one of the source lines SL, respectively. In some embodiments, the bit lines BL and the source lines SL extend along a row direction (e.g., the direction X) intersected with the column direction (e.g., the direction Y) along which the cell regions CR between adjacent stacking structures 112 are arranged. In those embodiments where columns of the cell regions CR are alternately offset from others, the conductive pillars 118 in adjacent columns of the cell regions CR may be connected to different bit lines BL and different source lines SL. For example, the conductive pillars 118 in odd columns of the cell regions CR may be connected to bit lines BL1 and source lines SL1, whereas the conductive pillars 118 in even column of the cell regions CR may be connected to bit lines BL2 and source lines SL2. Consequently, the memory cells MC in adjacent columns of the cell regions CR can be controlled by different bit lines BL (e.g., the bit lines BL1 and the bit lines BL2) and different source lines SL (e.g., the source lines SL1 and the source lines SL2), thus interference between the memory cells MC in adjacent columns of the cell regions CR can be reduced.

Referring to FIG. 14A and FIG. 14B, in some embodiments, the bit lines BL and the source lines SL extend above the stacking structures 112. The bit lines BL, the source lines SL and the conductive vias CV may be formed in a stack of dielectric layers 302 formed on the stacking structures 112. The conductive vias CV may penetrate through bottommost one(s) of the dielectric layers 302, to establish electrical connection from the conductive pillars 118 to the bit lines BL and the source lines SL lying above the conductive vias CV. In those embodiments where the underlying structure 102 is an etching stop layer formed over a CMOS integrated circuit (e.g., the CMOS integrated circuit LC as described with reference to FIG. 13), the bit lines BL and the source lines SL may be further routed to the underlying CMOS integrated circuit through a conductive path (not shown) formed aside the stacking structures 112 and penetrating through the underlying structure 102.

Figure 15A:
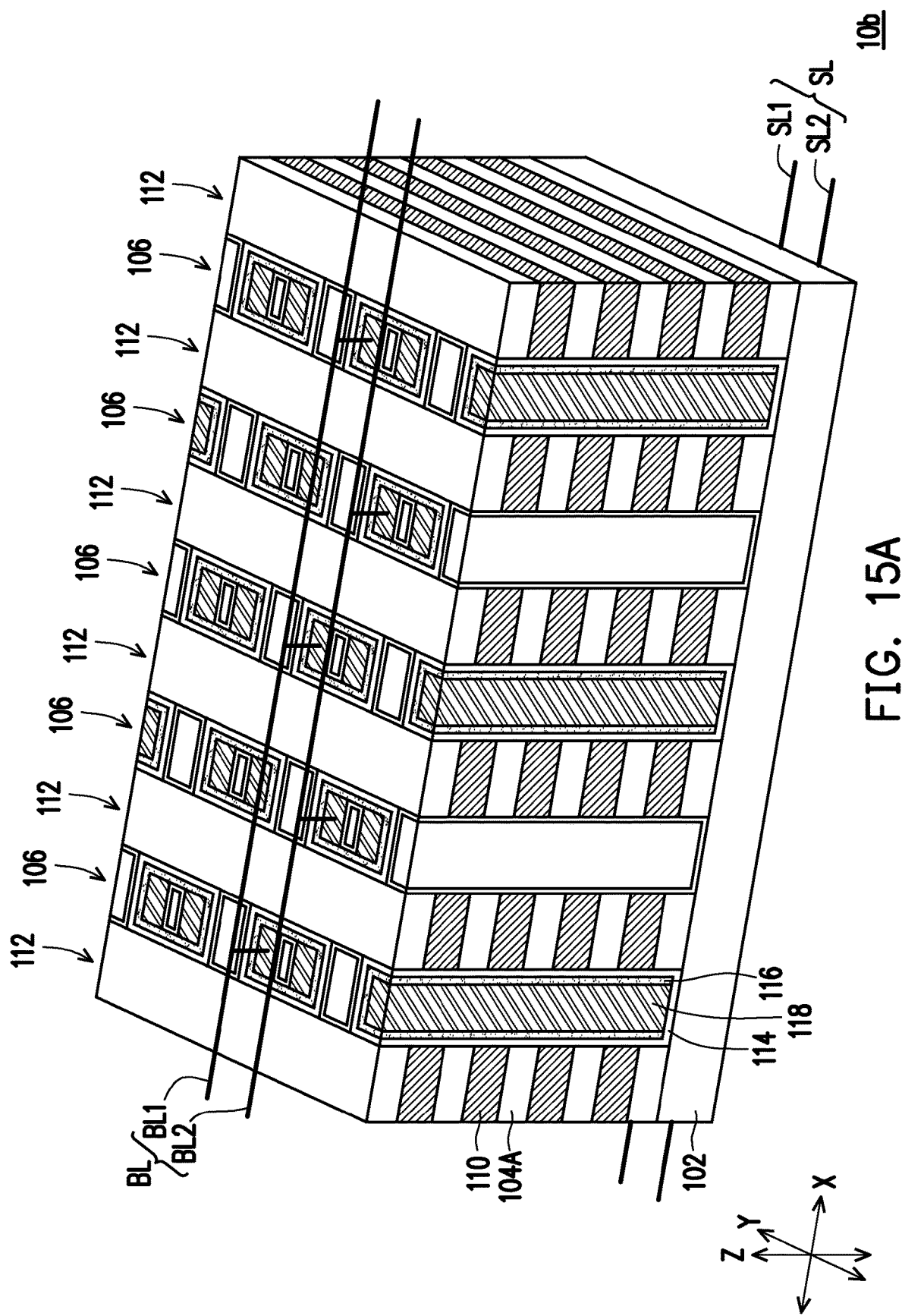
FIG. 15A and FIG. 15B are schematic various views of a three-dimensional memory device in accordance with some embodiments of the disclosure.
Figure 15B:
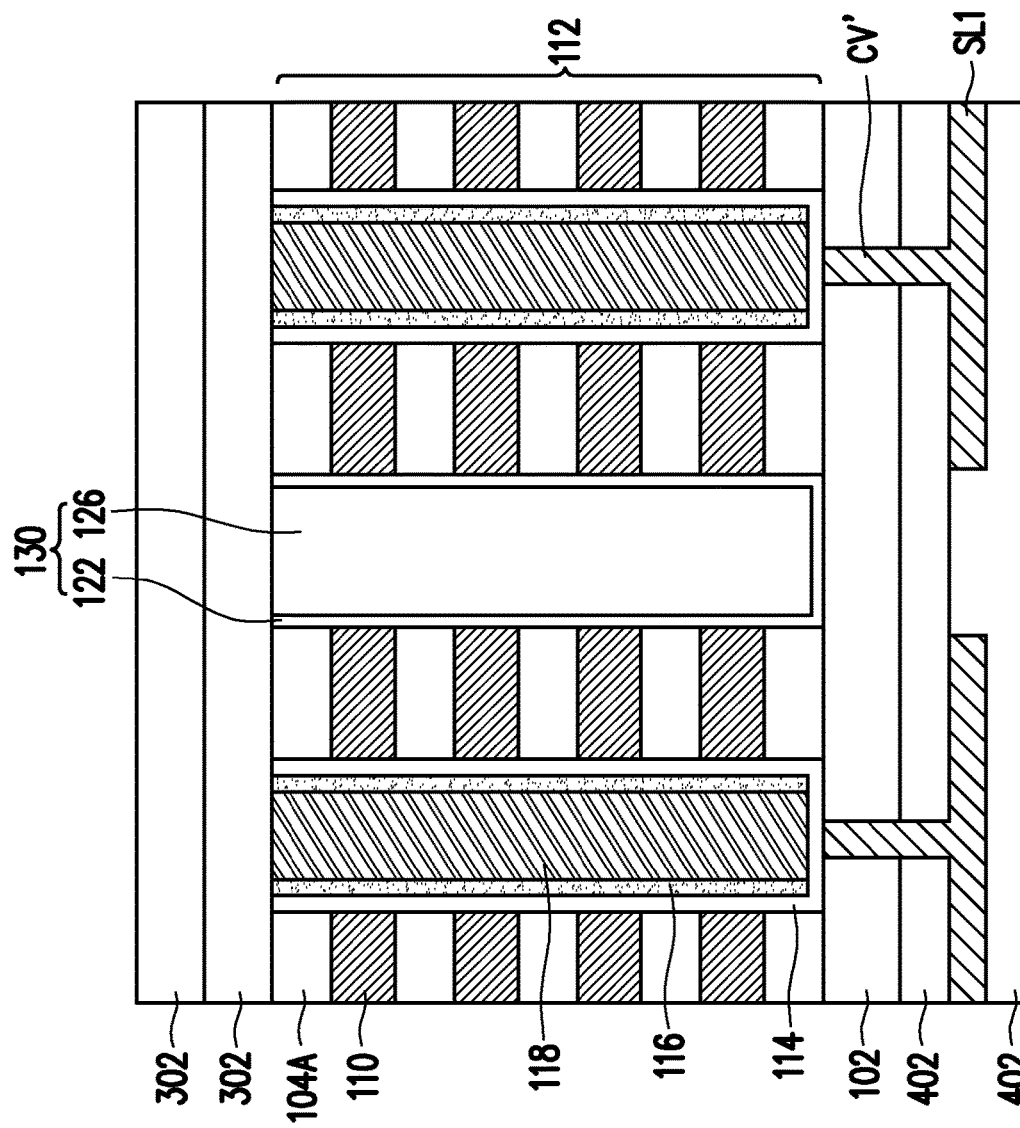

FIG. 15A is a schematic three-dimensional view illustrating a three-dimensional memory device 10b in accordance with some embodiments of the disclosure. FIG. 15B is a schematic cross-sectional view of a portion of the three-dimensional memory device 10b along an extending direction of one (e.g., SL1) of the source lines SL shown in FIG. 15A. The three-dimensional memory device 10b shown in FIG. 15A and FIG. 15B is similar to the three-dimensional memory device 10a as described with reference to FIG. 14A and FIG. 14B. Only differences therebetween will be described, the same or the like part would not be repeated again.

Referring to FIG. 15A and FIG. 15B, in some embodiments, the source lines SL extend below the underlying structure 102, while the bit lines BL extend above the stacking structures 112. In these embodiments, as shown in FIG. 15B, the source lines SL may be formed in the stack of dielectric layers 214 (as described with reference to FIG. 11) below the underlying structure 102. The source lines SL may lie on one of the dielectric layers 214. In addition, conductive vias CV' may be further formed to electrically connect some of the conductive pillars 118 to the underlying source lines SL. The conductive vias CV' may extend from bottom surfaces of some of the conductive pillars 118, and penetrate through the underlying dielectric layers 114, the underlying structure 102 and topmost one(s) of the dielectric layers 214, to reach the source lines SL.

In alternative embodiments, locations of the source lines SL and the bit lines BL are switched. In other words, the source lines SL may extend above the stacking structures 112, and may be electrically connected to some of the conductive pillars 118 as described with reference to FIG. 14A and FIG. 14B. On the other hand, the bit lines BL may extend in the dielectric layers 214 below the stacking structures 112, and may be electrically connected to others of the conductive pillars 118 through the conductive vias CV'.

In the disclosure, the three-dimensional memory device 10, 10a and 10b depicted in FIG. 10A, FIG. 14A and FIG. 15A are formed with the conductive pillars 118 arranged in a staggered layout in adjacent trenches 106, for example. For example, the conductive pillars 118 formed in the odd trenches 106 extending along the direction Y are substantially aligned with each other in the direction X, while the conductive pillars 118 formed in the even trenches 106 extending along the direction Y are substantially aligned with each other in the direction X. In other words, the conductive pillars 118 formed in the odd trenches 106 are offset from (not aligned with) the conductive pillars 118 formed in the even trenches 106 in the direction X.

However, the disclosure is not limited thereto; alternatively, the conductive pillars 118 of a three-dimensional memory device (e.g., 30 depicted in FIG. 16A and FIG. 16B) may be arranged in aligned layout (e.g., in a periodic fashion).

Figure 16A:
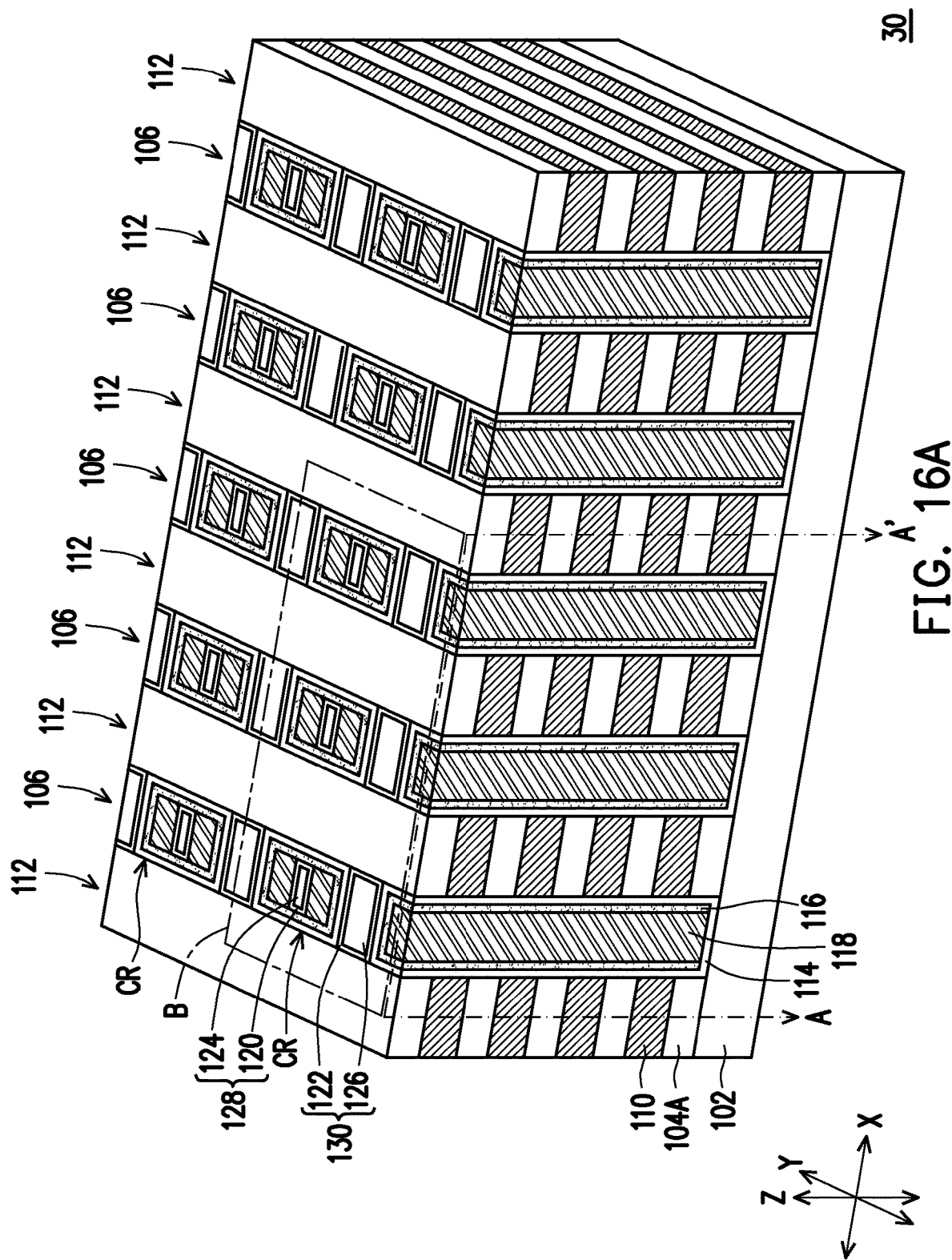
FIG. 16A and FIG. 16B are schematic various views of a three-dimensional memory device in accordance with some embodiments of the disclosure.
Figure 16B:
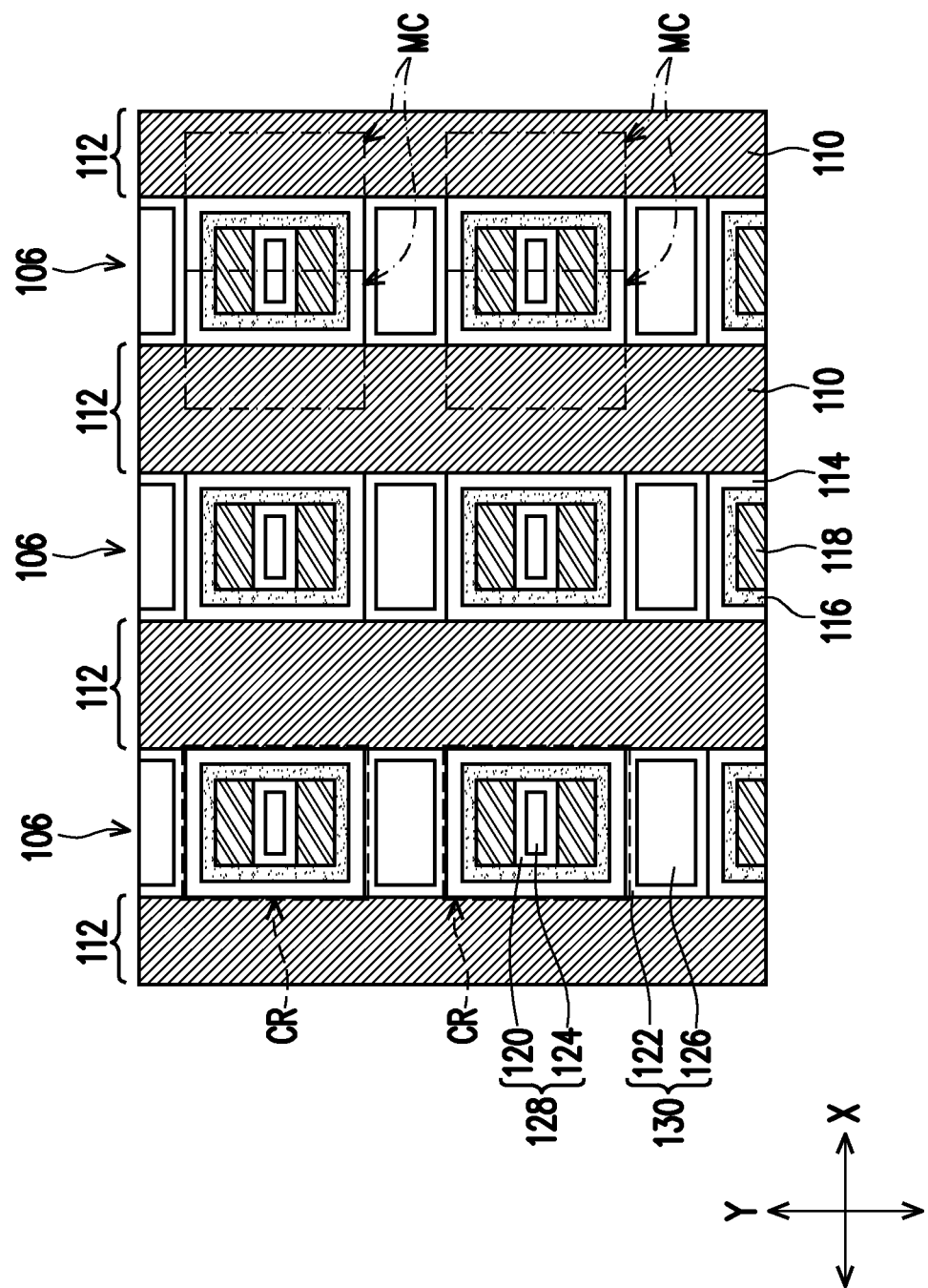

FIG. 16A is a schematic three-dimensional view illustrating a three-dimensional memory device 30 in accordance with some embodiments of the disclosure, and FIG. 16B is a schematic cross-sectional view of the three-dimensional memory device 30 along a line A-A' shown in FIG. 16A. The three-dimensional memory device 30 shown in FIG. 16A and FIG. 16B is similar to the three-dimensional memory device 10 as described with reference to FIGS. 10A-10C. Only differences therebetween will be described, the same or the like part would not be repeated again. For example, as shown in FIG. 16A and FIG. 16B, the conductive pillars 118 formed in the odd trenches 106 extending along the direction Y and the conductive pillars 118 formed in the even trenches 106 extending along the direction Y are all substantially aligned with one another in the direction X. In other words, the conductive pillars 118 formed in the odd trenches 106 are lined up with the conductive pillars 118 formed in the even trenches 106 in the direction X, respectively.

Figure 17:
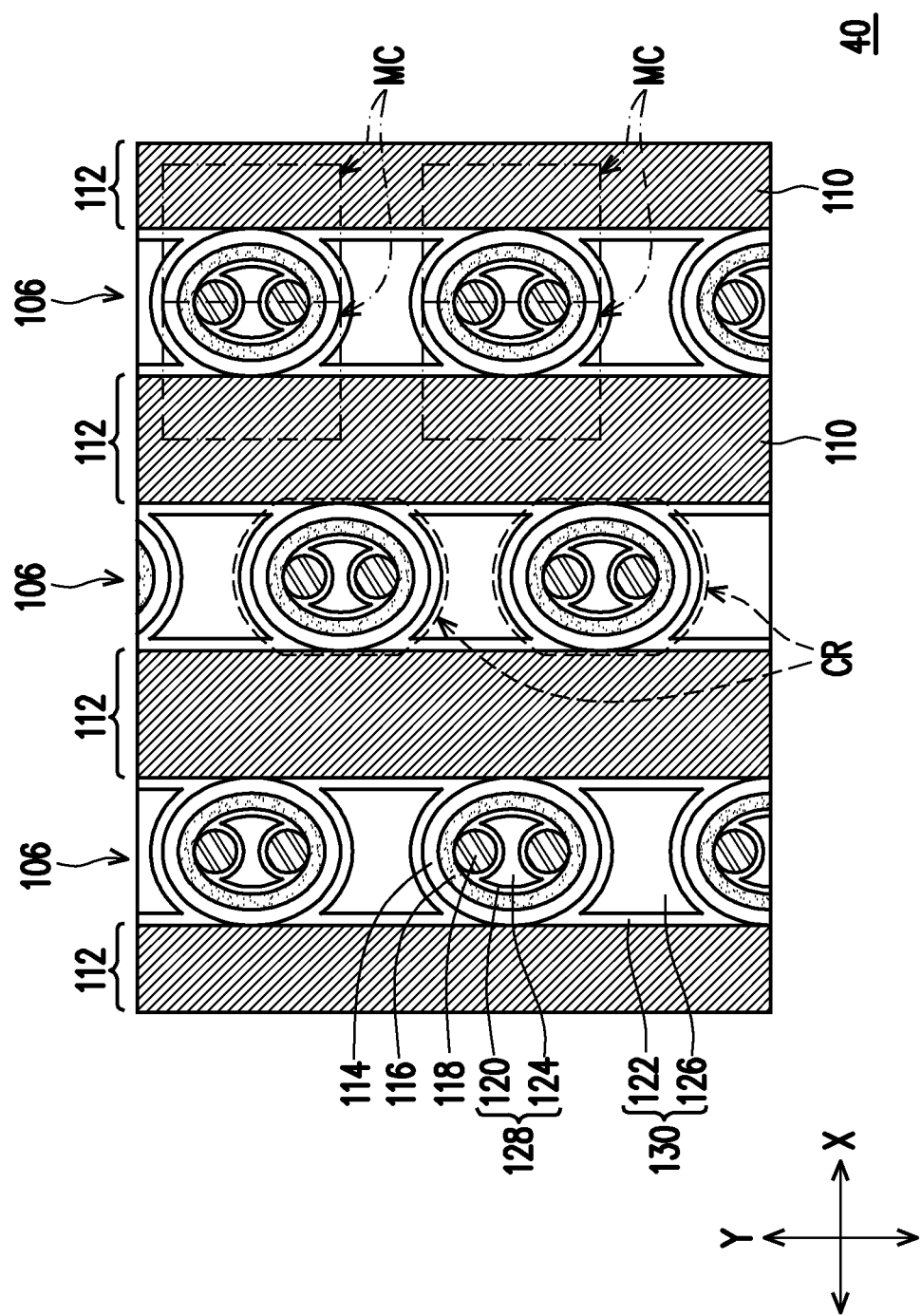
FIG. 17 is a schematic enlarged plan views illustrating a portion of the three-dimensional memory device in accordance with some embodiments of the disclosure.
Figure 18:
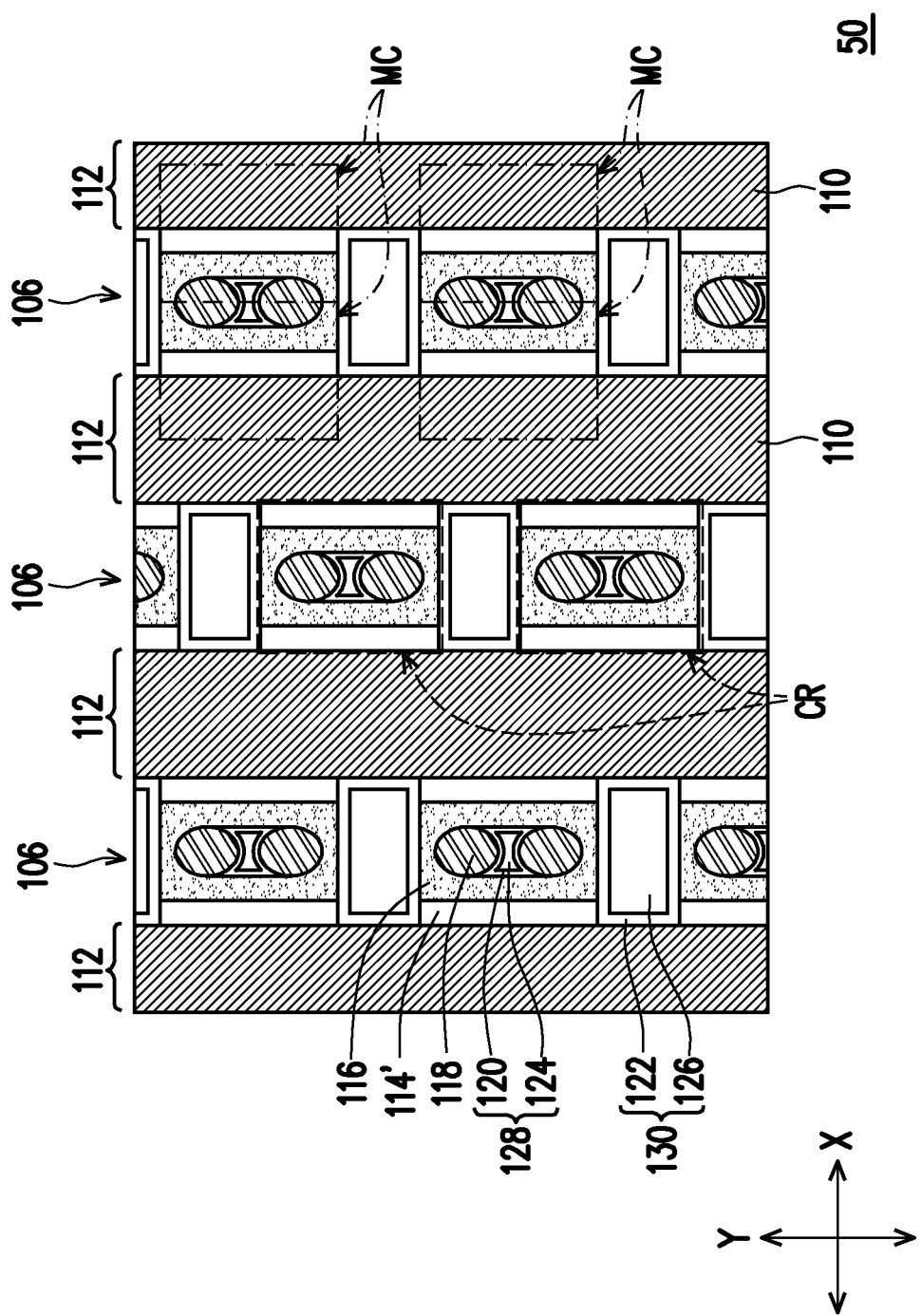
FIG. 18 is a schematic enlarged plan views illustrating a portion of the three-dimensional memory device in accordance with some embodiments of the disclosure.
Figure 19:
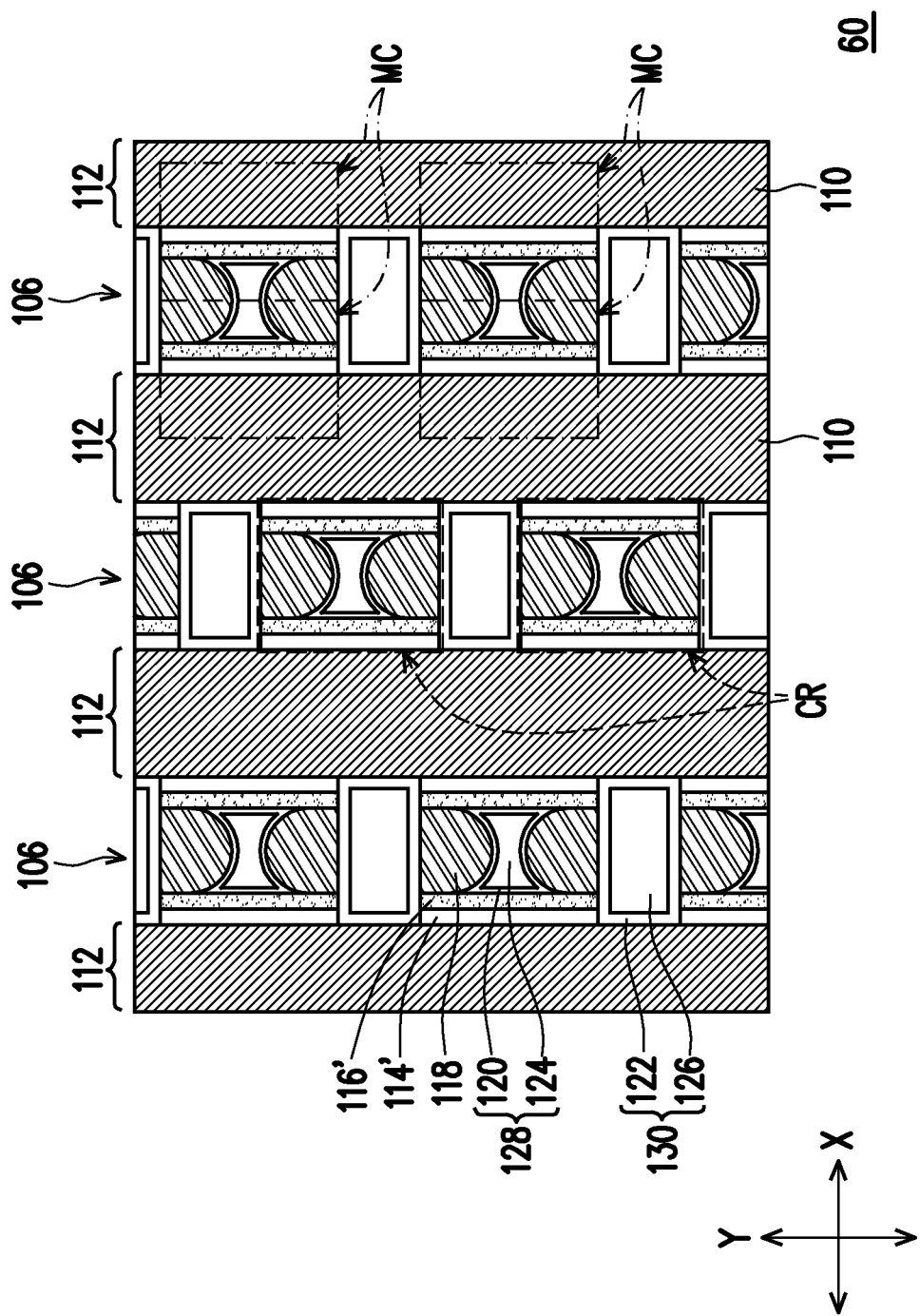
FIG. 19 is a schematic enlarged plan views illustrating a portion of the three-dimensional memory device in accordance with some embodiments of the disclosure.

FIG. 17, FIG. 18 and FIG. 19 each are a schematic enlarged plan views illustrating a portion of a three-dimensional memory device (e.g. 40, 50 and 60) in accordance with some embodiments of the disclosure, respectively. These three-dimensional memory devices 40, 50 and 60 are similar to the three-dimensional memory device 10 as described with reference to FIG. 10A-10C. Only differences therebetween will be described, the same or the like parts would not be repeated again for simplicity.

For example, the three-dimensional memory devices 10, 10a, 10b and 30 depicted in FIG. 10A, FIG. 14A, FIG. 15A and FIG. 16A are formed with the cell regions CR and the conductive pillars 118 each formed in a substantially rectangular top view shape. However, the disclosure is not limited thereto; alternatively, the cell regions CR and the conductive pillars 118 each may be formed in a substantially circular top view shape as shown in the three-dimensional memory device 40 depicted in FIG. 17. Alternatively, the conductive pillars 118 depicted in FIG. 17 may be formed in a substantially elliptical or oval top view shape. In other embodiments, the conductive pillars 118 each may be formed in a substantially elliptical top view shape while the cell regions CR each are formed in a substantially rectangular top view shape, as shown in the three-dimensional memory device 50 depicted in FIG. 18. Alternatively, the conductive pillars 118 depicted in FIG. 18 may be formed in a substantially circular or oval top view shape. In further embodiments, the conductive pillars 118 each may be formed in a substantially truncated-elliptical top view shape while the cell regions CR each are formed in a substantially rectangular top view shape, as shown in the three-dimensional memory device 50 depicted in FIG. 19. Alternatively, the conductive pillars 118 depicted in FIG. 19 may be formed in a substantially truncated-oval or truncated-circular top view shape.

In the three-dimensional memory devices 40, 50 and 60, the first liners 122 each are conformally cover a respective one of the first main layers 120 to form the first isolation structures 128, and the second liners 126 each are conformally cover a respective one of the second main layers 124 to form the second isolation structures 130. In the disclosure, the first and second liners 120, 122 of the first and second isolation structures 128, 130 act as the shielding layers for preventing metal filling leakage paths formation inside a single one cell region CR or among neighboring cell regions CR between the conductors (e.g. the adjacent conductive pillars 118 within one cell region CR and the conductive layers 110 located in the adjacent stacking structures 112) to improve the device performance of the three-dimensional memory devices 40, 50 and 60.

As shown in the plan views of FIG. 17 through FIG. 19 (e.g., the X-Y plane), for example, a distance between the paired conductive pillars 118 in one cell region CR is increased from a center of a trench 106 to an edge of the trench 106 along a direction perpendicular to an extending direction of the trench 106. With such configuration, the channel length of the FET in one cell region CR and the area of the cell region CR maintain the same while the overall area of the conductive pillars 118 is increased, thereby reducing the contact resistance in the conductive pillars 118 (e.g. source/drain regions) while the memory density will maintain the same. On the other hands, in the embodiments shown in FIG. 18 and FIG. 19, the dielectric layers 114' is formed in the cell regions CR to cover the sidewalls SW112 of the corresponding stacking structures 112 without extending over the sidewalls of the immediately adjacent second isolation structures 130; thereby not only increasing the overall area of the conductive pillars 118 but also reducing the impedance of the memory cells MC. Alternatively, as shown in FIG. 19, the semiconductor layers 116' may also be formed in the cell regions CR to cover the dielectric layers 114' located on the sidewalls SW112 of the corresponding stacking structures 112 and not extend over the sidewalls of the immediately adjacent second isolation structures 130 to further increases the overall area of the conductive pillars 118 and reduce the impedance of the memory cells MC. A material of the dielectric layers 114' may be the same as or the similar to the material of the dielectric layers 114 as described in FIG. 8A through FIG. 8C, a material of the semiconductor layers 116' may be the same as or the similar to the material of the semiconductor layers 116 as described in FIG. 8A through FIG. 8C, and thus are omitted for brevity.

A method for forming the dielectric layers 114' may include, but not limited to, selectively depositing a dielectric material only on the sidewalls SW112 of the corresponding stacking structures 112 and the top surface of the underlying structure 102 exposed by the cell regions CR to form the dielectric layers 114'. Alternatively, a dielectric material may be globally formed on sidewalls and bottom surfaces of the cell regions CR and removing the dielectric material from the sidewalls of the immediately adjacent second isolation structures 130 to form the dielectric layers 114' by patterning. A method for forming the semiconductor layers 116' may include, but not limited to, selectively depositing a semiconductor material only on the sidewalls of the corresponding dielectric layers 114' to form the semiconductor layers 116'. Alternatively, a semiconductor material may be globally formed over the cell regions CR disposed with the dielectric layer 114' and removing the semiconductor material from the sidewalls of the immediately adjacent second isolation structures 130 to form the semiconductor layers 116' by patterning. The patterning may include photolithography and etching processes.

In addition, the three-dimensional memory device 30 may also adopt the top view layouts of the cell regions CR in the three-dimensional memory devices 40-60. The disclosure is not limited thereto.

In some embodiments, the three-dimensional memory devices 10 through 60 respectively depicted in FIGS. 10A, 14A, 15A, 16A and 17-19 are formed with the stacking structures 112 each having continuously (e.g., evenly) vertical sidewalls SW112 (as described with reference to FIG. 6A through FIG. 6C). However, the disclosure is not limited thereto; alternatively, a three-dimensional memory device (e.g., 70 depicted in FIG. 20A and FIG. 20B) may include a plurality of the stacking structures 112' each having sidewalls SW112' being discontinuously (e.g., unevenly) vertical.

Figure 20A:
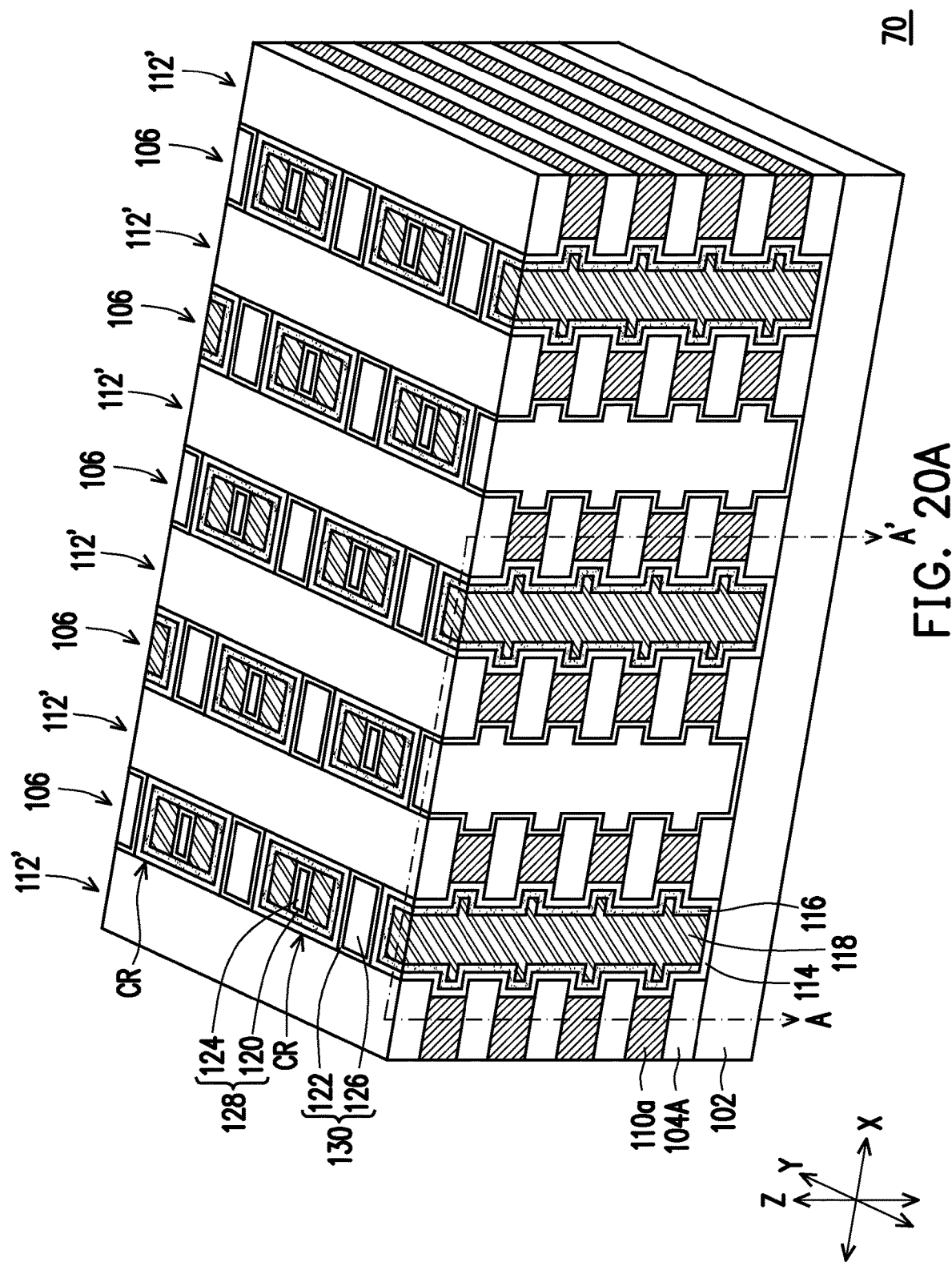
FIG. 20A and FIG. 20B are schematic various views of a three-dimensional memory device in accordance with some embodiments of the disclosure.
Figure 20B:
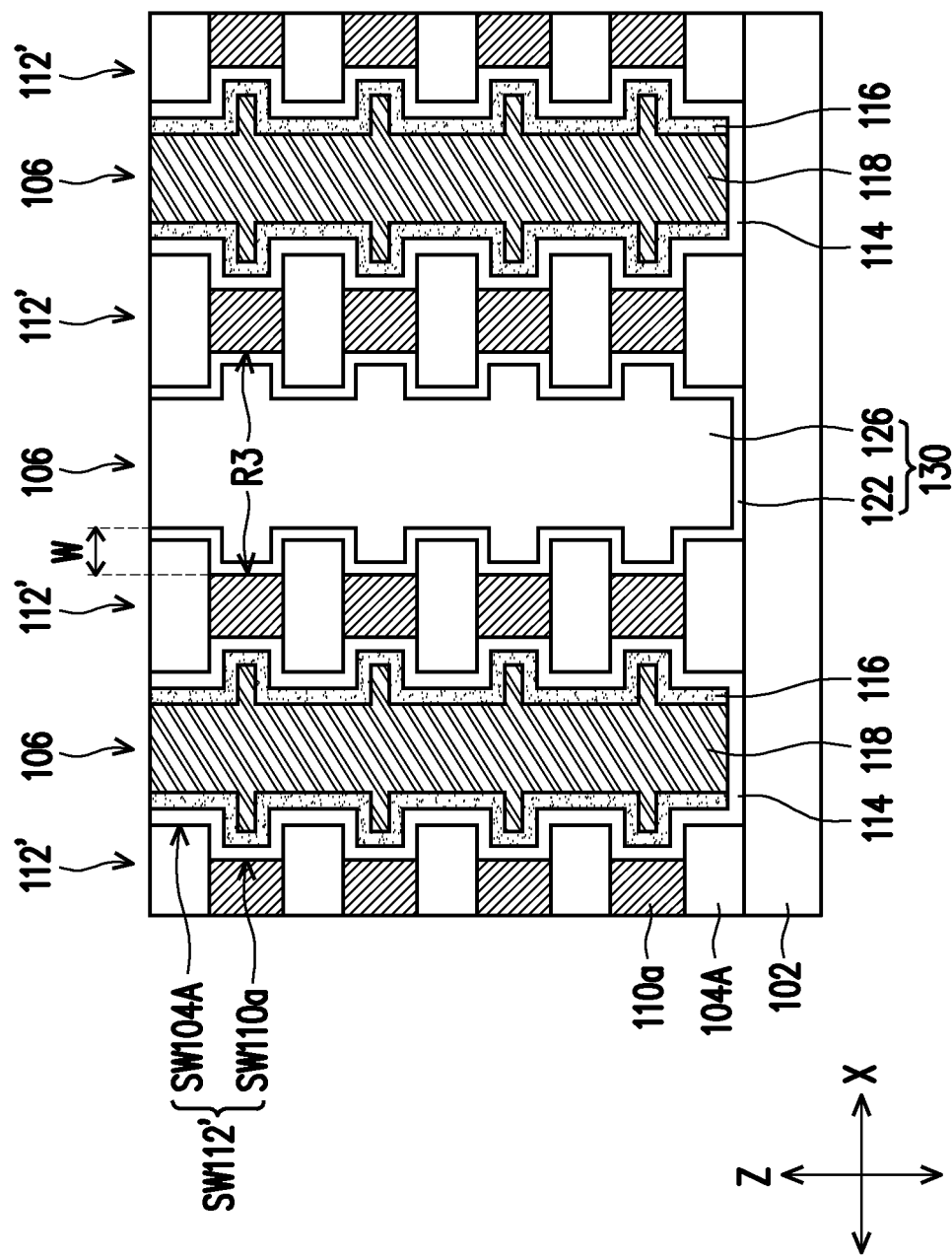

FIG. 20A and FIG. 20B are schematic various views of a three-dimensional memory device 70 in accordance with some embodiments of the disclosure, where FIG. 20A is a schematic three-dimensional view illustrating the three-dimensional memory device 70, and FIG. 16B is a schematic cross-sectional view along a line A-A' shown in FIG. 20A. The three-dimensional memory device 70 shown in FIG. 20A and FIG. 20B is similar to the three-dimensional memory device 10 as described with reference to FIGS. 10A-10C; the difference is that, for the three-dimensional memory device 70 depicted in FIG. 20A and FIG. 20B, stacking structures 112' are adopted, instead the stacking structures 112. Only differences therebetween will be described, the same or the like part would not be repeated for simplicity.

Referring to FIG. 20A and FIG. 20B, in some embodiments, the stacking structures 112' each include a plurality of first dielectric layers 104A and a plurality of conductive layers 110a. The first dielectric layers 104A and the conductive layers 110a are stacked on the underlying structure 102 in alternation. Sidewalls SW110a of the conductive layers 110a and sidewalls SW104A of the first dielectric layers 104A may together referred to as the sidewalls SW112' of the stacking structures 112'. In some embodiments, the sidewalls SW110a of the conductive layers 110a are offset from the sidewalls SW104A of the first dielectric layers 104A at outermost sides (e.g., the sidewalls SW112') of each stacking structures 112' exposed by the trenches 106 in a stacking direction (e.g., the direction Z) of the first dielectric layers 104A and the conductive layers 110a, as shown in FIG. 20B. In other words, the sidewalls SW110a of the conductive layers 110a are not coplanar to and levelled with the sidewalls SW104A of the first dielectric layers 104A, but are laterally recessed from the sidewalls SW104A of the first dielectric layers 104A. That is, the sidewalls SW112' of the stacking structures 112' each have a concave-convex surface. For example, in a cross-section of FIG. 20B, the sidewalls SW112' each include a substantially non-straight line. The sidewalls SW110a of the conductive layers 110a may be spaced apart from the sidewalls SW104A of the first dielectric layers 104A by recesses R3, respectively. In some embodiments, the width W of the recesses R3 is approximately ranging from 80 nm to 150 nm.

For example, as shown in FIG. 20A and FIG. 20B, the stacking structures 112' are laterally spaced apart from one another by the trenches 106, and directly stand on the underlying structure 102. The dielectric layers 114, the semiconductor layers 116 and the conductive pillars 118 are located in the cell regions CR within the trenches 106, where a portion of the conductive layer 110a in each stacking structure 112' and closest portions of the dielectric layer 114, the semiconductor layer 116 and the conductive pillars 118 in a cell region CR laterally adjacent to this portion of the conductive layer 110a constitute the transistor, e.g. a FET, which is functioned as a memory cell MC included in the three-dimensional memory device 70. In some embodiments, the first isolation structures 128 are located within the cell regions CR to separate apart and physically isolate the conductive pillars 118 in each cell region CR, while the second isolation structures 130 are located outside the cell regions CR to separate apart and physically isolate the cell regions CR in each trench 106. In the disclosure, the first and second liners 120, 122 of the first and second isolation structures 128, 130 act as the shielding layers for preventing metal filling leakage paths formation inside a single one cell region CR or among neighboring cell regions CR between the conductors (e.g. the adjacent conductive pillars 118 within one cell region CR and the conductive layers 110a located in the adjacent stacking structures 112') to improve the device performance of the three-dimensional memory device 70.

A method for forming the three-dimensional memory device 70 including the stacking structures 112' may include, but not limited to, after performing the process as described in FIG. 6A through FIG. 6C (e.g., step S106 of FIG. 2A) and prior to the process as described in FIG. 7A through FIG. 7C (e.g., step S108 of FIG. 2A), laterally recessing the conductive layers 110 with respect to the first dielectric layer 104A to form the recesses R3 in accordance with step S107 of FIG. 2A for forming the conductive layers 110a, such that the stacking structures 112' are manufactured. For example, a method for laterally recessing the conductive layers 110 includes an etching process, such as an isotropic etching process. In some embodiments, during the formation of the conductive layers 110a, the first dielectric layers 104A and the underlying structure 102 may be barely etched (e.g., substantially intact) during the etching process as having sufficient etching selectivity with respect to the conductive layers 110. After the formation of the recesses R3, the recesses R3 may be spatially communicated with the trenches 106 to expose portions of the main surfaces of the first dielectric layers 104 being in contact with the conductive layers 110.

After the formation of the stacking structures 112', the processes of the steps S108-S122 of FIG. 2A and the steps S122a-S122d of FIG. 2B are performed on the stacking structures 112' so as to manufacture the three-dimensional memory device 70. The formation and material of each of the underlying structure 102, the first dielectric layer 104A, the conductive layers 110, the dielectric layer 114, the semiconductor layers 116, the conductive pillars 118, the first isolation structures 128 (including the first liners 120 and the first main layers 124) and the second isolation structures 130 (including the second liners 122 and the second main layers 126) have been previously described in FIGS. 1A through FIG. 10C in conjunction with FIG. 2A and FIG. 2B, and thus are not repeated herein for simplicity.

In addition, the three-dimensional memory device 70 may also adopt the arrangement of the cell regions CR in the three-dimensional memory device 30 and/or the top view layouts of the cell regions CR in the three-dimensional memory devices 40-60. The disclosure is not limited thereto.

In accordance with some embodiments, a memory device includes a first stacking structure, a second stacking structure, a plurality of first isolation structures, gate dielectric layers, channel layers and channel layers. The first stacking structure includes a plurality of first gate layers, and a second stacking structure includes a plurality of second gate layers, where the first stacking structure and the second stacking structure are located on a substrate and separated from each other through a trench. The first isolation structures are located in the trench, where a plurality of cell regions are respectively confined between two adjacent first isolation structures of the first isolation structures in the trench, where the first isolation structures each includes a first main layer and a first liner surrounding the first main layer, where the first liner separates the first main layer from the first stacking structure and the second stacking structure. The gate dielectric layers are respectively located in one of the cell regions, and cover opposing sidewalls of the first stacking structure and the second stacking structure as well as opposing sidewalls of the first isolation structures. The channel layers respectively cover an inner surface of one of the gate dielectric layers. The conductive pillars stand on the substrate within the cell regions, and are laterally surrounded by the channel layers, where at least two of the conductive pillars are located in each of the cell regions, and the at least two conductive pillars in each of the cell regions are laterally separated from one another.

In accordance with some embodiments, a memory device includes a first stacking structure, a second stacking structure, a plurality of first isolation structures, gate dielectric layers, channel layers, conductive pillars, and a plurality of second isolation structures. The first stacking structure and the second stacking structure are formed on a substrate and laterally spaced apart from each other through a trench, where the first stacking structure includes first insulating layers and first gate layers alternately stacked on the substrate, the second stacking structure includes second insulating layers and second gate layers alternately stacked on the substrate, and the first stacking structure and the second stacking structure are separated from each other. The first isolation structures are located in the trench, where a plurality of cell regions are respectively confined between two adjacent first isolation structures of the first isolation structures in the trench. The gate dielectric layers are respectively located in one of the cell regions, and cover opposing sidewalls of the first stacking structure and the second stacking structure. The channel layers respectively cover an inner surface of one of the gate dielectric layers. The conductive pillars stand on the substrate within the cell regions, and are laterally surrounded by the channel layers, where at least two of the conductive pillars are located in each of the cell regions. The second isolation structures are respectively located in one of the cell regions and separate the at least two of the conductive pillars in each of the cell regions, where at least one of the first isolation structures and the second isolation structures each includes a main layer and a liner surrounding and in contact with the main layer.

In accordance with some embodiments, a method of manufacturing a memory device includes the following steps: forming a multilayer stack comprising insulating layers and sacrificial layers arranged in alternation; forming trenches in the multilayer stack; replacing the sacrificial layers with gate layers; forming dummy dielectric structures in the trenches to form cell regions separated from one another; forming memory films on sidewalls of the cell regions; forming channel layers on the memory films; forming conductive structures to fill up the cell regions; patterning the conductive structures to form at least two conductive pillars in each of the cell regions; removing the dummy dielectric structures; and forming first isolation structures between the at least two conductive pillars in each of the cell regions and forming second isolation structures between the cell regions, wherein forming the first isolation structures includes forming first liners on opposite sidewalls of the at least two of the conductive pillars and opposite sidewalls of a respective one of the channel layers exposed by the at least two of the conductive pillars in each of the cell regions by ALD and filling up the cell regions with a first dielectric material to form the first isolation structures respectively surrounded by the first liners.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. A method of manufacturing a memory device, comprising:
   forming a multilayer stack comprising insulating layers and sacrificial layers arranged in alternation;
   forming trenches in the multilayer stack;
   replacing the sacrificial layers with gate layers;
   forming dummy dielectric structures in the trenches to form cell regions separated from one another;
   forming memory films on sidewalls of the cell regions;
   forming channel layers on the memory films;
   forming conductive structures to fill up the cell regions;
   patterning the conductive structures to form at least two conductive pillars in each of the cell regions;
   removing the dummy dielectric structures; and
   forming first isolation structures between the at least two conductive pillars in each of the cell regions and forming second isolation structures between the cell regions, wherein forming the first isolation structures comprises:
      forming first liners on opposite sidewalls of the at least two of the conductive pillars and opposite sidewalls of a respective one of the channel layers exposed by the at least two of the conductive pillars in each of the cell regions by ALD; and
      filling up the cell regions with a first dielectric material to form the first isolation structures respectively surrounded by the first liners.

2. The method of claim 1, wherein forming the second isolation structures comprises:
   forming, on opposite sidewalls of two adjacent cell regions in each of the trenches and the opposite sidewalls of each of the trenches exposed by the two adjacent cell regions, second liners by ALD; and
   filling up gaps respectively sandwiched between the two adjacent cell regions in each of the trenches with a second dielectric material to form the second isolation structures surrounded by the second liners.

3. The method of claim 1, prior to forming the dummy dielectric structures in the trenches and after replacing the sacrificial layers with the gate layers, further comprising:
   laterally recessing the gate layers in respect to the insulating layers.

4. The method of claim 1, wherein forming the dummy dielectric structures in the trenches to form the cell regions separated from one another comprises:
   forming a dummy dielectric material in the trenches; and
   removing portions of the dummy dielectric material to form the dummy dielectric structures separating the cell regions separated from one another.

5. The method of claim 1, wherein forming the memory films on sidewalls of the cell regions comprises:
   conformally forming the memory films on the cell regions to respectively cover all sidewalls and bottom surface of each of the cell regions.

6. The method of claim 1, wherein forming the memory films on sidewalls of the cell regions comprises:
   selectively forming the memory films on the cell regions to respectively cover sidewalls of each of the cell regions located at the multilayer stack.

7. A method of manufacturing a memory device, comprising:
   forming a multilayer stack comprising insulating layers and sacrificial layers arranged in alternation along a vertical direction over a substrate;
   patterning the multilayer stack into a plurality of stacking structures being separated from each other and standing over the substrate;
   replacing, in the plurality of stacking structures, the sacrificial layers with gate layers;
   disposing dummy dielectric structures next to the plurality of stacking structures over the substrate, the dummy dielectric structures propping again sidewalls of the plurality of stacking structures, the plurality of stacking structures being arranged along a first horizontal direction, the dummy dielectric structure arranged along a second horizontal direction, wherein a cell regions is confined by two adjacent of the plurality of stacking structures and two adjacent of the dummy dielectric structures;
   sequentially forming memory films, channel layers and conductive structures in the cell regions to fill the cell regions;
   patterning the conductive structures to form at least two conductive pillars in each of the cell regions separating from each other by a first recess;
   removing the dummy dielectric structures to form second recesses;
   forming first isolation structures in the first recesses included in the cell regions, comprising:
      forming first liners to line sidewalls of the first recesses by ALD; and
      filling the first recesses with a first dielectric material to form the first isolation structures respectively surrounded by the first liners; and
   forming second isolation structures in the second recesses, comprising:
      forming second liners to line sidewalls of the second recesses by ALD; and
      filling the second recesses with a second dielectric material to form the second isolation structures respectively surrounded by the second liners.

8. The method of claim 7, wherein in a horizontal cross-section of the memory device, shapes of the cell regions is formed to be circular, oval or elliptical, wherein for each of the cell regions:
   a shape of the memory film is formed to include a circular annulus frame, an oval annulus frame, or an elliptical annulus frame;
   a shape of the channel layer is formed to include a circular annulus frame, an oval annulus frame, or an elliptical annulus frame; and
   shapes of the at least two conductive pillars are formed to include circular shapes, oval shapes or elliptical shapes.

9. The method of claim 7, wherein in a horizontal cross-section of the memory device, shapes of the cell regions is formed to be quadrilateral, wherein for each of the cell regions:
   a shape of the memory film is formed to include a strip shape;
   a shape of the channel layer is formed to include an annulus frame having an outer sidewall of a quadrilateral shape and an inner sidewall of a circular, oval or elliptical shape; and
   shapes of the at least two conductive pillars are formed to include circular shapes, oval shapes or elliptical shapes.

10. The method of claim 7, wherein in a horizontal cross-section of the memory device, shapes of the cell regions is formed to be quadrilateral, wherein for each of the cell regions:
- a shape of the memory film is formed to include a strip shape;
- a shape of the channel layer is formed to include a strip shape; and
- shapes of the at least two conductive pillars are formed to include truncated-circular shapes, truncate-oval shapes or truncated-elliptical shapes.

11. The method of claim 7, wherein in a horizontal cross-section of the memory device, for each of the cell regions:
- a first width of the first isolation structure at a center of a respective cell region is less than a second width of the first isolation structure at edges of the respective cell region, where the first width and the second width are measured along the second horizontal direction.

12. The method of claim 7, wherein in a horizontal cross-section of the memory device, for each of the second recesses:
- a third width of the second isolation structure at a center of a respective second recess is less than a fourth width of the first isolation structure at edges of the second recess, where the third width and the fourth width are measured along the second horizontal direction.

13. The method of claim 7, wherein disposing the dummy dielectric structures next to the plurality of stacking structures over the substrate comprises:
- forming a dummy dielectric material between every two adjacent of the plurality of stacking structure over the substrate; and
- removing portions of the dummy dielectric material to form the dummy dielectric structures being disposed next to the plurality of stacking structures over the substrate.

14. A method of manufacturing a memory device, comprising:
- forming a plurality of stacking structures being separated from each other and standing over a substrate, the plurality of stacking structures each comprising dielectric layers and gate layers arranged in alternation;
- laterally recessing portions of the gate layers in respect to the dielectric layers to form a plurality of lateral recesses;
- disposing dummy dielectric structures next to the plurality of stacking structures over the substrate to form cell regions each being confined by two adjacent of the plurality of stacking structures and two adjacent of the dummy dielectric structures;
- sequentially forming memory films, channel layers and conductive structures in the cell regions and a part of the lateral recess;
- patterning the conductive structures to form at least two conductive pillars in each of the cell regions separating from each other by a first recess; and
- forming first isolation structures in the first recesses included in the cell regions and the lateral recess, comprising:
  - forming first liners to line sidewalls of the first recesses and the lateral recesses by ALD; and
  - filling the first recesses with a first dielectric material to form the first isolation structures respectively surrounded by the first liners.

15. The method of claim 14, further comprising:
- removing the dummy dielectric structures to form second recesses prior to forming the first isolation structures; and
- forming second isolation structures in the second recesses and the lateral recess, comprising:
  - forming second liners to line sidewalls of the second recesses and the lateral recesses by ALD; and
  - filling the second recesses with a second dielectric material to form the second isolation structures respectively surrounded by the second liners.

16. The method of claim 15, wherein forming the first isolation structures and the forming the second isolation structure are simultaneously performed in a same step.

17. The method of claim 14, wherein in a horizontal cross-section of the memory device, shapes of the cell regions is formed to be circular, oval or elliptical, wherein for each of the cell regions:
- a shape of the memory film is formed to include a circular annulus frame, an oval annulus frame, or an elliptical annulus frame;
- a shape of the channel layer is formed to include a circular annulus frame, an oval annulus frame, or an elliptical annulus frame; and
- shapes of the at least two conductive pillars are formed to include circular shapes, oval shapes or elliptical shapes.

18. The method of claim 14, wherein in a horizontal cross-section of the memory device, shapes of the cell regions is formed to be quadrilateral, wherein for each of the cell regions:
- a shape of the memory film is formed to include a strip shape;
- a shape of the channel layer is formed to include an annulus frame having an outer sidewall of a quadrilateral shape and an inner sidewall of a circular, oval or elliptical shape; and
- shapes of the at least two conductive pillars are formed to include circular shapes, oval shapes or elliptical shapes.

19. The method of claim 14, wherein in a horizontal cross-section of the memory device, shapes of the cell regions is formed to be quadrilateral, wherein for each of the cell regions:
- a shape of the memory film is formed to include a strip shape;
- a shape of the channel layer is formed to include a strip shape; and
- shapes of the at least two conductive pillars are formed to include truncated-circular shapes, truncate-oval shapes or truncated-elliptical shapes.

20. The method of claim 14, wherein disposing dummy dielectric structures next to the plurality of stacking structures over the substrate comprises:
- forming a dummy dielectric material between every two adjacent of the plurality of stacking structure over the substrate; and
- removing portions of the dummy dielectric material to form the dummy dielectric structures being disposed next to the plurality of stacking structures over the substrate.

* * * * *